US008495695B2

(12) United States Patent
Kim et al.

(10) Patent No.: US 8,495,695 B2
(45) Date of Patent: Jul. 23, 2013

(54) DIGITAL BROADCASTING SYSTEM AND DATA PROCESSING METHOD

(75) Inventors: Jin Pil Kim, Seoul (KR); In Hwan Choi, Gyeonggi-do (KR); Kook Yeon Kwak, Gyeonggi-do (KR); Byoung Gill Kim, Seoul (KR); Jin Woo Kim, Seoul (KR); Hyoung Gon Lee, Seoul (KR); Jong Moon Kim, Gyeonggi-do (KR); Won Gyu Song, Seoul (KR)

(73) Assignee: LG Electronics Inc., Seoul (KR)

( * ) Notice: Subject to any disclaimer, the term of this patent is extended or adjusted under 35 U.S.C. 154(b) by 212 days.

(21) Appl. No.: 13/053,125

(22) Filed: Mar. 21, 2011

(65) Prior Publication Data

US 2011/0188501 A1    Aug. 4, 2011

Related U.S. Application Data

(63) Continuation of application No. 12/100,630, filed on Apr. 10, 2008, now Pat. No. 7,934,244.

(60) Provisional application No. 60/947,984, filed on Jul. 4, 2007, provisional application No. 60/911,818, filed on Apr. 13, 2007.

(30) Foreign Application Priority Data

Apr. 13, 2007   (KR) .......................... 10-2007-0036562

(51) Int. Cl.
*H04N 7/173*    (2011.01)
(52) U.S. Cl.
USPC ............... 725/116; 725/68; 725/93; 714/755; 375/265

(58) Field of Classification Search
USPC .................. 725/106–124, 138–142; 714/755, 714/784, 790; 375/265; 348/406.1
See application file for complete search history.

(56) References Cited

U.S. PATENT DOCUMENTS

| 5,754,651 | A  | 5/1998 | Blatter et al. |
| 6,212,659 | B1 | 4/2001 | Zehavi |
| 6,378,101 | B1 | 4/2002 | Sinha et al. |

(Continued)

FOREIGN PATENT DOCUMENTS

| EP | 0996291 | 4/2000 |
| EP | 1628420 | 2/2006 |

(Continued)

OTHER PUBLICATIONS

European Telecommunications Standards Institute (ETSI), "Digital Video Broadcasting (DVB); IP Datacast over DVB-H: Program Specific Information (PSI)/Service Information (SI)," ETSI TS 102 470, Version 1.1.1, Apr. 2006.

(Continued)

*Primary Examiner* — Annan Shang
(74) *Attorney, Agent, or Firm* — Lee, Hong, Degerman, Kang & Waimey

(57) ABSTRACT

A digital broadcasting system for transmitting/receiving a digital broadcasting signal and a data processing method are disclosed. A program table information has an identifier identifying mobile service data and main service data in a broadcasting signal. The program table information is multiplexed with the mobile service data and main service data. Then, broadcast receiving system can receive and output the mobile service data by parsing the program table information and using the identifier.

8 Claims, 36 Drawing Sheets

U.S. PATENT DOCUMENTS

| | | | |
|---|---|---|---|
| 6,553,538 B2 | 4/2003 | Zehavi | |
| 6,622,005 B1 | 9/2003 | Grohn | |
| 6,658,010 B1 | 12/2003 | Enns et al. | |
| 6,728,230 B2 | 4/2004 | Odenwalder et al. | |
| 6,735,185 B1 | 5/2004 | Noneman | |
| 6,785,288 B1 | 8/2004 | Enns et al. | |
| 7,593,474 B2 * | 9/2009 | Jeong et al. | 375/265 |
| 7,649,829 B2 | 1/2010 | Chen et al. | |
| 7,715,461 B2 | 5/2010 | Odenwalder | |
| 7,733,817 B2 | 6/2010 | Choi et al. | |
| 7,738,391 B2 | 6/2010 | Melpignano et al. | |
| 7,751,466 B2 | 7/2010 | Zeng | |
| 7,792,103 B2 | 9/2010 | Kim et al. | |
| 7,801,243 B2 | 9/2010 | Kim et al. | |
| 7,818,519 B2 | 10/2010 | Plunkett | |
| 7,934,244 B2 * | 4/2011 | Kim et al. | 725/116 |
| 2005/0018697 A1 | 1/2005 | Enns et al. | |
| 2005/0166244 A1 | 7/2005 | Moon | |
| 2006/0072623 A1 | 4/2006 | Park | |
| 2006/0126668 A1 | 6/2006 | Kwon et al. | |
| 2006/0140301 A1 | 6/2006 | Choi | |
| 2006/0184965 A1 | 8/2006 | Lee et al. | |
| 2007/0071110 A1 | 3/2007 | Choi et al. | |
| 2007/0071149 A1 | 3/2007 | Li et al. | |
| 2007/0101352 A1 | 5/2007 | Rabina et al. | |
| 2007/0121681 A1 | 5/2007 | Kang et al. | |
| 2009/0049472 A1 | 2/2009 | Kim et al. | |

FOREIGN PATENT DOCUMENTS

| | | |
|---|---|---|
| EP | 1768396 | 3/2007 |
| JP | 11-069253 | 3/1999 |
| JP | 2001-54031 | 2/2001 |
| JP | 2002-141877 | 5/2002 |
| JP | 2003-134117 | 5/2003 |
| JP | 2004-129126 | 4/2004 |
| JP | 2007-096403 | 4/2007 |
| KR | 10-2001-0022306 | 3/2001 |
| KR | 10-2003-0030175 | 4/2003 |
| KR | 10-2003-0037138 | 5/2003 |
| KR | 1020040032282 | 4/2004 |
| KR | 1020040032283 | 4/2004 |
| KR | 10-2005-0062867 | 6/2005 |
| KR | 1020050066954 | 6/2005 |
| KR | 1020050072988 | 7/2005 |
| KR | 10-2005-0117314 | 12/2005 |
| KR | 1020050118206 | 12/2005 |
| KR | 10-2006-0012510 | 2/2006 |
| KR | 10-2006-0013999 | 2/2006 |
| KR | 10-2006-0063867 | 6/2006 |
| KR | 10-2006-0070665 | 6/2006 |
| KR | 1020060133011 | 12/2006 |
| KR | 1020070015810 | 2/2007 |
| KR | 1020070030739 | 3/2007 |
| KR | 1020070055671 | 5/2007 |
| KR | 1020070068960 | 7/2007 |
| KR | 1020070075549 | 7/2007 |
| WO | 01/28246 | 4/2001 |
| WO | 03/017254 | 2/2003 |
| WO | 03/049449 | 6/2003 |
| WO | 2004/057873 | 7/2004 |
| WO | 2004/066652 | 8/2004 |
| WO | 2005/032034 | 4/2005 |

OTHER PUBLICATIONS

Digital Video Broadcasting (DVB), "DVB-H Implementation Guidelines," DVB Document A092, Revision 2, May 2007.

European Telecommunications Standards Institute (ETSI), "Radio Broadcasting Systems; Digital Audio Broadcasting (DAB) to Mobile, Portable and Fixed Receivers," ETSI EN 300 401, Version 1.4.1, Jun. 2006.

European Telecommunications Standards Institute (ETSI), "Digital Audio Broadcasting (DAB); Internet Protocol (IP) Datagram Tunnelling," ETSI EN 201 735, Version 1.1.1, Sep. 2000.

* cited by examiner

FIG. 27

| Syntax | No. of bits | Format |
|---|---|---|
| Program_map_section() { | | |
|     table_id | 8 | uimsbf |
|     section_syntax_indicator | 1 | bslbf |
|     '0' | 1 | bslbf |
|     reserved | 2 | bslbf |
|     section_length | 12 | uimsbf |
|     program_number | 16 | uimsbf |
|     reserved | 2 | bslbf |
|     version_number | 5 | uimsbf |
|     current_next_indicator | 1 | bslbf |
|     section_number | 8 | uimsbf |
|     last_section_number | 8 | uimsbf |
|     reserved | 3 | bslbf |
|     PCR_PID | 13 | uimsbf |
|     reserved    (a) | 4 | bslbf |
|     program_info_length | 12 | uimsbf |
|     for (i=0; i<N; i++) {descriptor() } | | |
|     for (i=0; i<N1; i++) { | | |
|         stream_type | 8 | uimsbf |
|         reserved | 3 | bslbf |
|         elementary_PID | 13 | uimsbf |
|         reserved | 4 | bslbf |
|         ES_info_length | 12 | uimsbf |
|         for(i=0;i<N2; i++) {descriptor() } | | |
|     } | | |
|     CRC_32 | 32 | rpchof |
| } | | |

FIG. 28

| Syntax | No. of bits | Format |
|---|---|---|
| Mobile_service_descriptor () { | | |
|     desciptor_tag | 8 | |
|     desciptor_length | 8 | Uimsbf |
|     modulated_mode | 8 | Uimsbf |
|     service_type | 6 | Uimsbf |
|     burst_id | 4 | Uimsbf |
| } | | |

FIG. 30

| Syntax | No. of bits | Format |
|---|---|---|
| terrestrial_virtual_channel_table_section() { | | |
|     table_id | 8 | 0xC8 |
|     section_syntax_indicator | 1 | '1' |
|     private_indicator | 1 | '1' |
|     reserved | 2 | '11' |
|     section_length | 12 | uimsbf |
|     transport_stream_id | 16 | uimsbf | ~(a)
|     reserved | 2 | '11' |
|     version_number | 5 | uimsbf |
|     current_next_indicator | 1 | bslbf |
|     section_number | 8 | uimsbf |
|     last_section_number | 8 | uimsbf |
|     protocol_version | 8 | uimsbf |
|     num_channels_in_section | 8 | uimsbf | ~(b)
|     for(i=0; i<num_channels_in_section; i++) { | | |
|         short_name | 7*16 | uimsbf |
|         reserved | 4 | '1111' |
|         major_channel_number | 10 | uimsbf |
|         minor_channel_number | 10 | uimsbf |
|         modulation_mode | 8 | uimsbf | ~(c)
|         carrier_frequency | 32 | uimsbf |
|         channel_TSID | 16 | uimsbf |
|         program_number | 16 | uimsbf |
|         ETM_location | 2 | uimsbf |
|         access_controlled | 1 | bslbf |
|         hidden | 1 | bslbf |
|         reserved | 2 | '11' |
|         hide_guide | 1 | bslbf |
|         reserved | 3 | '111' |
|         service_type | 6 | uimsbf | ~(d)
|         source_id | 16 | uimsbf |
|         reserved | 6 | '111111' |
|         descriptors_length | 10 | uimsbf |
|         for(i=0; i<N; i++) { | | |
|             descriptor() | | | ~(e)
|         } | | |
|     } | | |
|     reserved | 6 | '111111' |
|     additional_descriptors_length | 10 | uimsbf |
|     for(j=0; j<N; j++) { | | |
|         additional_descriptor() | | |
|     } | | |
|     CRC_32 | 32 | rpchof |
| } | | |

FIG. 31

| Value | Meaning |
|---|---|
| 0x00 | [ Reserved ] |
| 0x01 | Analog |
| 0x02 | SCTE_mode_1 |
| 0x03 | SCTE_mode_2 |
| 0x04 | ATSC (8 VSB) |
| 0x05 | ATSC (16 VSB) |
| 0x06 | ATSC (Mobile-VSB) |
| 0x07-0x7F | [ Reserved for future ] |
| 0x80-0xFF | [ User Private ] |

FIG. 32

| Value | Meaning |
|---|---|
| 0x00 | [ Reserved ] |
| 0x01 | Analog_television - The virtual channel carries analog television programming |
| 0x02 | ATSC_digital_television - The virtual channel carries television programming (audio, optional data) conforming to ATSC standards. |
| 0x03 | ATSC_audio ? The virtual channel carries audio programming (audio service and optional data) conforming to ATSC standards |
| 0x04 | ATSC_data_only_service - The virtual channel carries a data service conforming to ATSC standards, but no video of stream_type 0x02 or audio of stream_type 0x81 |
| 0x05 | Software Download Data Service- see A/97 |
| 0x06 | Unassociated/small screen service - see A/65C Amendment 1 |
| 0x07 | Parameterized Service - New A/V CODEC |
| 0x08-0x0F | [ Reserved for future ] |
| 0x10 | Mobile -digital television - |
| 0x11 | Mobile -audio |
| 0x12 | Mobile-data only service |
| 0x13 | Mobile - Software download data service |
| 0x14-0x7F | [ Reserved for future ] |
| 0x80-0xFF | [ User Private ] |

FIG. 38

| Field Name | Number of Bits | Description and Field Value |
|---|---|---|
| time_slice_information_descriptor{<br>  descriptor_tag<br>descriptor_length<br>  Burst_TS_id<br>  offset<br>} | <br>8<br>8<br>8<br>8 | Start of the time_slice_information_descriptor<br>0xAB<br>indicates the length, in bytes<br>index of burst area<br>time difference |

FIG. 39

```
NIT PID= 0x010
Table_id=0x40

............................................
network_descriptor()
{ cell frequency link descriptor
   {
       tag=0x6D
       cell_id=0x0001
       frequency=0x03aefe40 (Fc=618MHz)
       cell_id=0x0002
       frequency=0x4a32240 (Fc=778MHz)
   }
}
   ............................................

-TS loop #1
{
    transport_stream_id=0x0901
    original_network_id=0x2114
       service_list_descriptor()
       {
          ............................................
       } terrestrial_delivery_system_descriptor()
       {
           tag=0x5a
           centre_frequency=0x03aefe40 (Fc=618MHz)
           bandwidth=010(6MHz)
           time_Slicing_indicator=0(least one used)
           modulation=01(MVSB)
           sccc_rate-HP_stream=01(1/4)
           sccc_code_rate-LP_stream=01(1/4)
           rs_code_rate-HP_stream =001
           rs_code_rate-LP_stream =001
           other_frequency_flag=1(other frequency is use)
       }
}
-TS loop #2
{
   transport_stream_id=0x0901
   original_network_id=0x2114
       service_list_descriptor()
       {
          ............................................
       } terrestrial_delivery_system_descriptor()
       {
           tag=0x5a
           centre_frequency=0x4a32240 (Fc=778MHz)
           bandwidth=010(6MHz)
           time_Slicing_indicator=0 (least one used)
           modulation=01(MVSB)
           sccc_rate-HP_stream=00 (1/2)
           sccc_code_rate-LP_stream=00(1/2)
           rs_code_rate-HP_stream =001
           rs_code_rate-LP_stream =001
           other_frequency_flag=0(no other frequency is use)
       }
}
```

DIGITAL BROADCASTING SYSTEM AND DATA PROCESSING METHOD

CROSS-REFERENCE TO RELATED APPLICATIONS

This application is a continuation of U.S. patent application Ser. No. 12/100,630, filed on Apr. 10, 2008, now U.S. Pat. No. 7,934,244, which claims the benefit of earlier filing date and right of priority to Korean Application No. 10-2007-0036562, filed on Apr. 13, 2007, and also claims the benefit of U.S. Provisional Patent Application Nos. 60/947,984, filed on Jul. 4, 2007, and 60/911,818, filed on Apr. 13, 2007, which are all hereby incorporated by reference herein in their entirety.

BACKGROUND OF THE INVENTION

1. Field of the Invention

The present invention relates to a digital broadcasting system for transmitting/receiving a digital broadcasting signal and a data processing method.

2. Discussion of the Related Art

Among digital broadcasting schemes, since a vestigial sideband (VSB) transmission scheme which is employed as the digital broadcasting standard in North America and Korea is a single carrier scheme, reception capability of a reception system may deteriorate in poor environments. In particular, since robustness for a channel variation and noise is further required in a portable or mobile broadcasting receiver, reception capability may further deteriorate when mobile data service is transmitted by the VSB transmission scheme.

SUMMARY OF THE INVENTION

Accordingly, the present invention is directed to a digital broadcasting system and a data processing method that substantially obviate one or more problems due to limitations and disadvantages of the related art.

An object of the present invention is to provide a digital broadcasting system and a data processing method, which are capable of improving reception capability of a reception system by performing additional encoding processes with respect to mobile service data and transmitting the encoded mobile service data to the reception system.

Another object of the present invention is to provide a digital broadcasting system and a data processing method, which are capable of improving reception capability of a reception system by inserting known data into a predetermined region of a data region and transmitting the data by an appointment of a transmitter and a receiver.

A further object of the present invention is to provide a digital broadcasting system and a data processing method, which are capable of transmitting an identifier for identifying mobile service data and main service data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a data processing method includes multiplexing program table information, which describes main service data and mobile service data and includes an identifier for identifying the main service data and the mobile service data, with the mobile service data and the main service data. An error correction encoding process is performed with respect to the multiplexed mobile service data and the mobile service data, which is subjected to the error correction encoding process, and the main service data are multiplexed and then data packets are output. The data packets are modulated and the modulated signal is transmitted.

The transmitting of the multiplexed signal may include multiplexing The modulating and transmitting of the data packets includes arranging the data packets in an unit of a data group and interleaving the data packets by the unit of the data group, outputting a broadcasting signal obtained by modulating the interleaved broadcasting data and transmitting the output broadcasting signal According to another aspect of the present invention, a data processing method includes receiving a broadcasting signal in which main service data and mobile service data are multiplexed in an unit of a data group, obtaining program table information, which describes the main service data and the mobile service data and includes an identifier for identifying the main service data and the mobile service, from the received broadcasting signal.

The obtained program table information is parsed and program information of the mobile service data is obtained.

According to another aspect of the present invention, a digital broadcasting system includes a tuner receiving a broadcasting signal in which main service data and mobile service data are multiplexed in a unit of a data group, a demodulator demodulating the main service data and the mobile service data from the broadcasting signal received by the tuner and outputting the demodulated data, a demultiplexer demultiplexing program table information including an identifier for identifying the main service data and the mobile service data, a video stream and an audio stream, in the demodulated data output from the demodulator, a decoder decoding broadcasting contents according to the demultiplexed video and audio streams, a program table information decoder decoding the demultiplexed program table information of the mobile service data and a controller controlling the broadcasting contents to be output according to the decoded program table information.

When the program table information is at least one of a virtual channel table (VCT) and a program map table (PMT), the identifier may be a modulation_mode field value in the program table information.

When the program table information is at least one of a virtual channel table (VCT) and a program map table (PMT), the identifier may be a service_type field value in the program table information.

When the program table information is a virtual channel table (VCT), the identifier may be included in service_location_descriptor in the VCT. And when the program table information is a program mapping table (PMT), the identifier is included in a descriptor of the PMT.

And the controller may control power of the demodulator such that the demodulator demodulates only a burst section including the broadcasting contents.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 27 is a view showing an example of a program mapping table (PMT) for delivering an identifier of mobile service data;

FIG. 28 is a view showing a descriptor which can parse information for identifying mobile/main service data;

FIG. 30 is a view showing a virtual channel table (VCT) in the program table information;

FIG. 31 is a view showing a modulation mode (modulation_mode) of the broadcasting signal;

FIG. 32 is a view showing a service type (service_type) of the broadcasting signal;

FIG. 38 is a view showing a descriptor including an identifier of a burst section; and FIG. 39 is a view showing an example of delivering cell information for mobile reception.

DETAILED DESCRIPTION OF THE INVENTION

Figure 1:
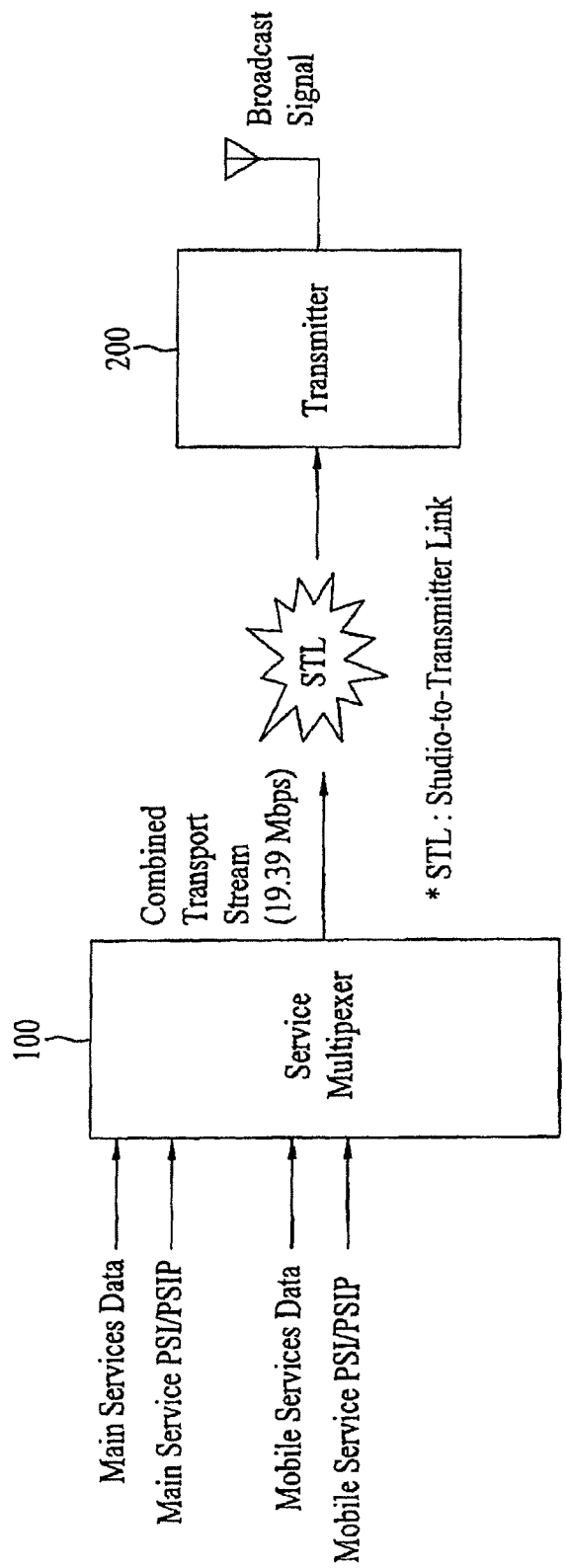
FIG. 1 is a block diagram showing a digital broadcast transmitting system according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system. Additionally, in the present invention, mobile service data may include at least one of mobile service data, pedestrian service data, and handheld service data, and are collectively referred to as mobile service data for simplicity. Herein, the mobile service data not only correspond to mobile/pedestrian/handheld service data (M/P/H service data) but may also include any type of service data with mobile or portable characteristics. Therefore, the mobile service data according to the present invention are not limited only to the M/P/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be serviced as the main service data.

Also, a data service using the mobile service data may include weather forecast services, traffic information services, stock information services, viewer participation quiz programs, real-time polls & surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above. In the present invention, the transmitting system provides backward compatibility in the main service data so as to be received by the conventional receiving system. Herein, the main service data and the mobile service data are multiplexed to the same physical channel and then transmitted.

The transmitting system according to the present invention performs additional encoding on the mobile service data and inserts the data already known by the receiving system and transmitting system (i.e., known data), thereby transmitting the processed data. Therefore, when using the transmitting system according to the present invention, the receiving system may receive the mobile service data during a mobile state and may also receive the mobile service data with stability despite various distortion and noise occurring within the channel.

General Description of a Transmitting System

FIG. 1 illustrates a block diagram showing a general structure of a digital broadcast transmitting system according to an embodiment of the present invention. Herein, the digital broadcast transmitting includes a service multiplexer 100 and a transmitter 200. Herein, the service multiplexer 100 is located in the studio of each broadcast station, and the transmitter 200 is located in a site placed at a predetermined distance from the studio. The transmitter 200 may be located in a plurality of different locations. Also, for example, the plurality of transmitters may share the same frequency. And, in this case, the plurality of transmitters receives the same signal. Accordingly, in the receiving system, a channel equalizer may compensate signal distortion, which is caused by a reflected wave, so as to recover the original signal. In another example, the plurality of transmitters may have different frequencies with respect to the same channel.

A variety of methods may be used for data communication each of the transmitters, which are located in remote positions, and the service multiplexer. For example, an interface standard such as a synchronous serial interface for transport of MPEG-2 data (SMPTE-310M). In the SMPTE-310M interface standard, a constant data rate is decided as an output data rate of the service multiplexer. For example, in case of the 8VSB mode, the output data rate is 19.39 Mbps, and, in case of the 16VSB mode, the output data rate is 38.78 Mbps. Furthermore, in the conventional 8VSB mode transmitting system, a transport stream (TS) packet having a data rate of approximately 19.39 Mbps may be transmitted through a single physical channel. Also, in the transmitting system according to the present invention provided with backward compatibility with the conventional transmitting system, additional encoding is performed on the mobile service data. Thereafter, the additionally encoded mobile service data are multiplexed with the main service data to a TS packet form, which is then transmitted. At this point, the data rate of the multiplexed TS packet is approximately 19.39 Mbps.

At this point, the service multiplexer 100 receives at least one type of mobile service data and program specific information (PSI)/program and system information protocol (PSIP) table data for each mobile service and encapsulates the received data to each transport stream (TS) packet. Also, the service multiplexer 100 receives at least one type of main service data and PSI/PSIP table data for each main service so as to encapsulate the received data to a TS packet. Subsequently, the TS packets are multiplexed according to a predetermined multiplexing rule and outputs the multiplexed packets to the transmitter 200.

Service Multiplexer

Figure 2:
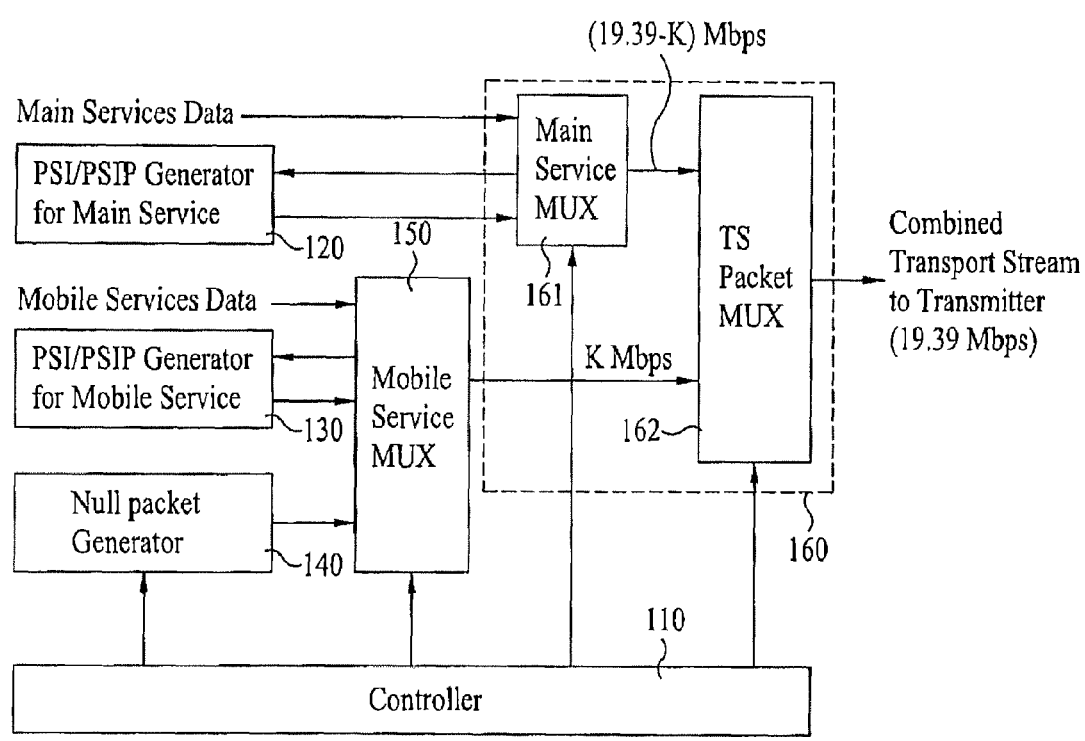
FIG. 2 is a detailed block diagram showing an example of the service multiplexer.

FIG. 2 illustrates a block diagram showing an example of the service multiplexer. The service multiplexer includes a controller 110 for controlling the overall operations of the service multiplexer, a PSI/PSIP generator 120 for the main service, a PSI/PSIP generator 130 for the mobile service, a null packet generator 140, a mobile service multiplexer 150, and a transport multiplexer 160. The transport multiplexer 160 may include a main service multiplexer 161 and a transport stream (TS) packet multiplexer 162. Referring to FIG. 2, at least one type of compression encoded main service data and the PSI/PSIP table data generated from the PSI/PSIP generator 120 for the main service are inputted to the main service multiplexer 161 of the transport multiplexer 160. The main service multiplexer 161 encapsulates each of the inputted main service data and PSI/PSIP table data to MPEG-2 TS packet forms. Then, the MPEG-2 TS packets are multiplexed and outputted to the TS packet multiplexer 162. Herein, the data packet being outputted from the main service multiplexer 161 will be referred to as a main service data packet for simplicity.

Thereafter, at least one type of the compression encoded mobile service data and the PSI/PSIP table data generated from the PSI/PSIP generator 130 for the mobile service are inputted to the mobile service multiplexer 150. The mobile service multiplexer 150 encapsulates each of the inputted mobile service data and PSI/PSIP table data to MPEG-2 TS packet forms. Then, the MPEG-2 TS packets are multiplexed and outputted to the TS packet multiplexer 162. Herein, the data packet being outputted from the mobile service multiplexer 150 will be referred to as a mobile service data packet for simplicity. At this point, the transmitter 200 requires identification information in order to identify and process the main service data packet and the mobile service data packet. Herein, the identification information may use values pre-decided in accordance with an agreement between the transmitting system and the receiving system, or may be configured of a separate set of data, or may modify predetermined location value with in the corresponding data packet. As an example of the present invention, a different packet identifier (PID) may be assigned to identify each of the main service data packet and the mobile service data packet.

In another example, by modifying a synchronization data byte within a header of the mobile service data, the service data packet may be identified by using the synchronization data byte value of the corresponding service data packet. For example, the synchronization byte of the main service data packet directly outputs the value decided by the ISO/IEC13818-1 standard (i.e., 0x47) without any modification. The synchronization byte of the mobile service data packet modifies and outputs the value, thereby identifying the main service data packet and the mobile service data packet. Conversely, the synchronization byte of the main service data packet is modified and outputted, whereas the synchronization byte of the mobile service data packet is directly outputted without being modified, thereby enabling the main service data packet and the mobile service data packet to be identified.

A plurality of methods may be applied in the method of modifying the synchronization byte. For example, each bit of the synchronization byte may be inversed, or only a portion of the synchronization byte may be inversed. As described above, any type of identification information may be used to identify the main service data packet and the mobile service data packet. Therefore, the scope of the present invention is not limited only to the example set forth in the description of the present invention.

Meanwhile, a transport multiplexer used in the conventional digital broadcasting system may be used as the transport multiplexer 160 according to the present invention. More specifically, in order to multiplex the mobile service data and the main service data and to transmit the multiplexed data, the data rate of the main service is limited to a data rate of (19.39-K) Mbps. Then, K Mbps, which corresponds to the remaining data rate, is assigned as the data rate of the mobile service. Thus, the transport multiplexer which is already being used may be used as it is without any modification. Herein, the transport multiplexer 160 multiplexes the main service data packet being outputted from the main service multiplexer 161 and the mobile service data packet being outputted from the mobile service multiplexer 150. Thereafter, the transport multiplexer 160 transmits the multiplexed data packets to the transmitter 200.

However, in some cases, the output data rate of the mobile service multiplexer 150 may not be equal to K Mbps. In this case, the mobile service multiplexer 150 multiplexes and outputs null data packets generated from the null packet generator 140 so that the output data rate can reach K Mbps. More specifically, in order to match the output data rate of the mobile service multiplexer 150 to a constant data rate, the null packet generator 140 generates null data packets, which are then outputted to the mobile service multiplexer 150. For example, when the service multiplexer 100 assigns K Mbps of the 19.39 Mbps to the mobile service data, and when the remaining (19.39-K) Mbps is, therefore, assigned to the main service data, the data rate of the mobile service data that are multiplexed by the service multiplexer 100 actually becomes lower than K Mbps. This is because, in case of the mobile service data, the pre-processor of the transmitting system performs additional encoding, thereby increasing the amount of data. Eventually, the data rate of the mobile service data, which may be transmitted from the service multiplexer 100, becomes smaller than K Mbps.

For example, since the pre-processor of the transmitter performs an encoding process on the mobile service data at a coding rate of at least ½, the amount of the data outputted from the pre-processor is increased to more than twice the amount of the data initially inputted to the pre-processor. Therefore, the sum of the data rate of the main service data and the data rate of the mobile service data, both being multiplexed by the service multiplexer 100, becomes either equal to or smaller than 19.39 Mbps. Therefore, in order to match the data rate of the data that are finally outputted from the service multiplexer 100 to a constant data rate (e.g., 19.39 Mbps), an amount of null data packets corresponding to the amount of lacking data rate is generated from the null packet generator 140 and outputted to the mobile service multiplexer 150.

Accordingly, the mobile service multiplexer 150 encapsulates each of the mobile service data and the PSI/PSIP table data that are being inputted to a MPEG-2 TS packet form. Then, the above-described TS packets are multiplexed with the null data packets and, then, outputted to the TS packet multiplexer 162. Thereafter, the TS packet multiplexer 162 multiplexes the main service data packet being outputted from the main service multiplexer 161 and the mobile service data packet being outputted from the mobile service multiplexer 150 and transmits the multiplexed data packets to the transmitter 200 at a data rate of 19.39 Mbps.

According to an embodiment of the present invention, the mobile service multiplexer 150 receives the null data packets. However, this is merely exemplary and does not limit the scope of the present invention. In other words, according to another embodiment of the present invention, the TS packet multiplexer 162 may receive the null data packets, so as to match the data rate of the finally outputted data to a constant data rate. Herein, the output path and multiplexing rule of the null data packet is controlled by the controller 110. The controller 110 controls the multiplexing processed performed by the mobile service multiplexer 150, the main service multiplexer 161 of the transport multiplexer 160, and the TS packet multiplexer 162, and also controls the null data packet generation of the null packet generator 140. At this point, the transmitter 200 discards the null data packets transmitted from the service multiplexer 100 instead of transmitting the null data packets.

Further, in order to allow the transmitter 200 to discard the null data packets transmitted from the service multiplexer 100 instead of transmitting them, identification information for identifying the null data packet is required. Herein, the identification information may use values pre-decided in accordance with an agreement between the transmitting system and the receiving system. For example, the value of the synchronization byte within the header of the null data packet may be modified so as to be used as the identification information. Alternatively, a transport_error_indicator flag may also be used as the identification information.

In the description of the present invention, an example of using the transport_error_indicator flag as the identification information will be given to describe an embodiment of the present invention. In this case, the transport_error_indicator flag of the null data packet is set to '1', and the transport_error_indicator flag of the remaining data packets are reset to '0', so as to identify the null data packet. More specifically, when the null packet generator 140 generates the null data packets, if the transport_error_indicator flag from the header field of the null data packet is set to '1' and then transmitted, the null data packet may be identified and, therefore, be discarded. In the present invention, any type of identification information for identifying the null data packets may be used. Therefore, the scope of the present invention is not limited only to the examples set forth in the description of the present invention.

According to another embodiment of the present invention, a transmission parameter may be included in at least a portion of the null data packet, or at least one table or an operations and maintenance (OM) packet (or OMP) of the PSI/PSIP table for the mobile service. In this case, the transmitter 200 extracts the transmission parameter and outputs the extracted transmission parameter to the corresponding block and also transmits the extracted parameter to the receiving system if required. More specifically, a packet referred to as an OMP is defined for the purpose of operating and managing the transmitting system. For example, the OMP is configured in accordance with the MPEG-2 TS packet format, and the corresponding PID is given the value of 0x1FFA. The OMP is configured of a 4-byte header and a 184-byte payload. Herein, among the 184 bytes, the first byte corresponds to an OM_type field, which indicates the type of the OM packet.

In the present invention, the transmission parameter may be transmitted in the form of an OMP. And, in this case, among the values of the reserved fields within the OM_type field, a pre-arranged value is used, thereby indicating that the transmission parameter is being transmitted to the transmitter 200 in the form of an OMP. More specifically, the transmitter 200 may find (or identify) the OMP by referring to the PID. Also, by parsing the OM_type field within the OMP, the transmitter 200 can verify whether a transmission parameter is included after the OM_type field of the corresponding packet. The transmission parameter corresponds to supplemental data required for processing mobile service data from the transmitting system and the receiving system.

Herein, the transmission parameter may include data group information, region information within the data group, RS frame information, super frame information, burst information, turbo code information, and RS code information. The burst information may include burst size information, burst period information, and time information to next burst. The burst period signifies the period at which the burst transmitting the same mobile service is repeated. The data group includes a plurality of mobile service data packets, and a plurality of such data groups is gathered (or grouped) to form a burst. A burst section signifies the beginning of a current burst to the beginning of a next burst. Herein, the burst section is classified as a section that includes the data group (also referred to as a burst section), and a section that does not include the data group (also referred to as a non burst section). A burst section is configured of a plurality of fields, wherein one field includes one data group.

The transmission parameter may also include information on how signals of a symbol domain are encoded in order to transmit the mobile service data, and multiplexing information on how the main service data and the mobile service data or various types of mobile service data are multiplexed. The information included in the transmission parameter is merely exemplary to facilitate the understanding of the present invention. And, the adding and deleting of the information included in the transmission parameter may be easily modified and changed by anyone skilled in the art. Therefore, the present invention is not limited to the examples proposed in the description set forth herein. Furthermore, the transmission parameters may be provided from the service multiplexer 100 to the transmitter 200. Alternatively, the transmission parameters may also be set up by an internal controller (not shown) within the transmitter 200 or received from an external source.

Transmitter

Figure 3:
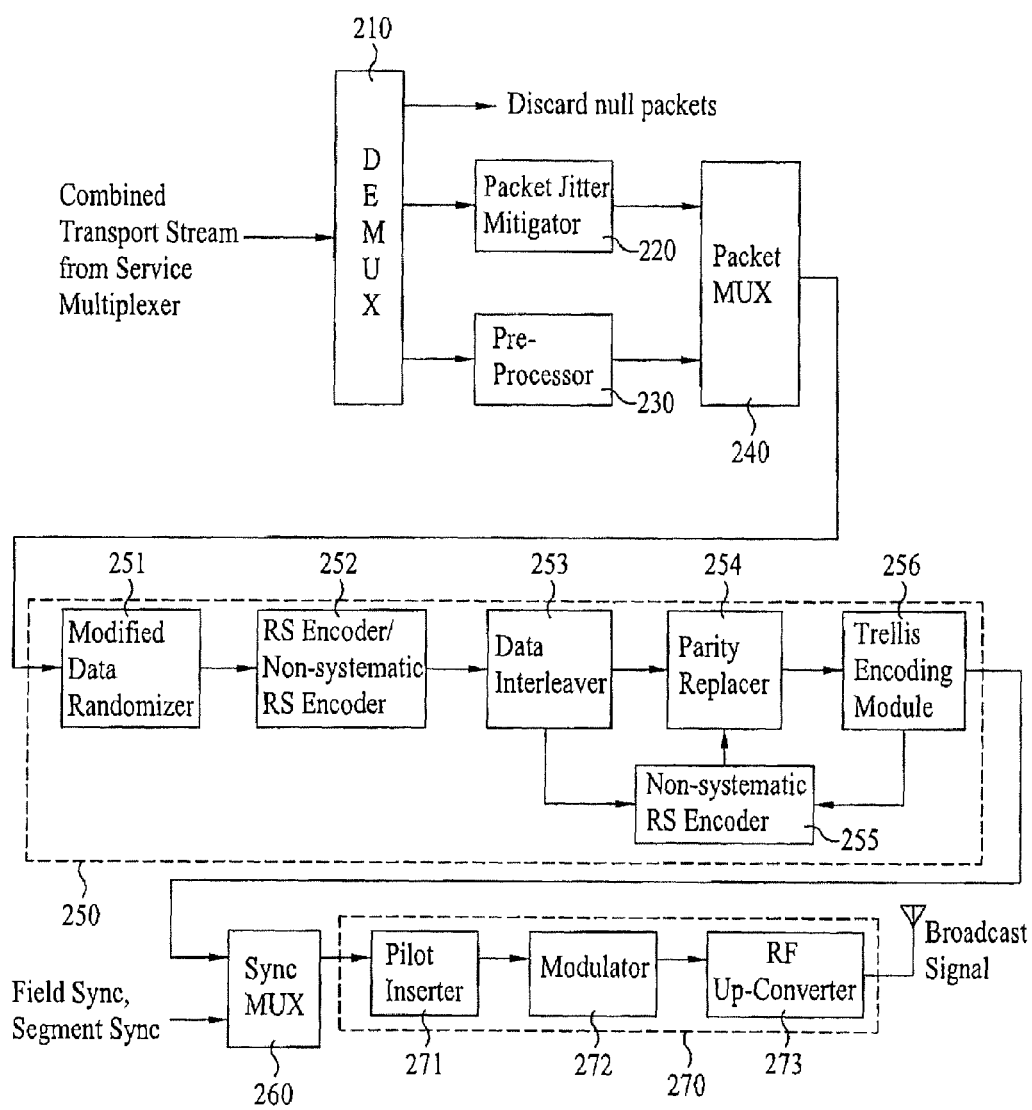
FIG. 3 is a block diagram showing an example of the transmitter.

FIG. 3 illustrates a block diagram showing an example of the transmitter 200 according to an embodiment of the present invention. Herein, the transmitter 200 includes a demultiplexer 210, a packet jitter mitigator 220, a pre-processor 230, a packet multiplexer 240, a post-processor 250, a synchronization (sync) multiplexer 260, and a transmission unit 270. Herein, when a data packet is received from the service multiplexer 100, the demultiplexer 210 should identify whether the received data packet corresponds to a main service data packet, a mobile service data packet, or a null data packet. For example, the demultiplexer 210 uses the PID within the received data packet so as to identify the main service data packet and the mobile service data packet. Then, the demultiplexer 210 uses a transport_error_indicator field to identify the null data packet. The main service data packet identified by the demultiplexer 210 is outputted to the packet jitter mitigator 220, the mobile service data packet is outputted to the pre-processor 230, and the null data packet is discarded. If a transmission parameter is included in the null data packet, then the transmission parameter is first extracted and outputted to the corresponding block. Thereafter, the null data packet is discarded.

The pre-processor 230 performs an additional encoding process of the mobile service data included in the service data packet, which is demultiplexed and outputted from the demultiplexer 210. The pre-processor 230 also performs a process of configuring a data group so that the data group may be positioned at a specific place in accordance with the purpose of the data, which are to be transmitted on a transmission frame. This is to enable the mobile service data to respond swiftly and strongly against noise and channel changes. The pre-processor 230 may also refer to the transmission parameter when performing the additional encoding process. Also, the pre-processor 230 groups a plurality of mobile service data packets to configure a data group. Thereafter, known data, mobile service data, RS parity data, and MPEG header are allocated to pre-determined areas within the data group.

Pre-Processor within Transmitter

Figure 4:
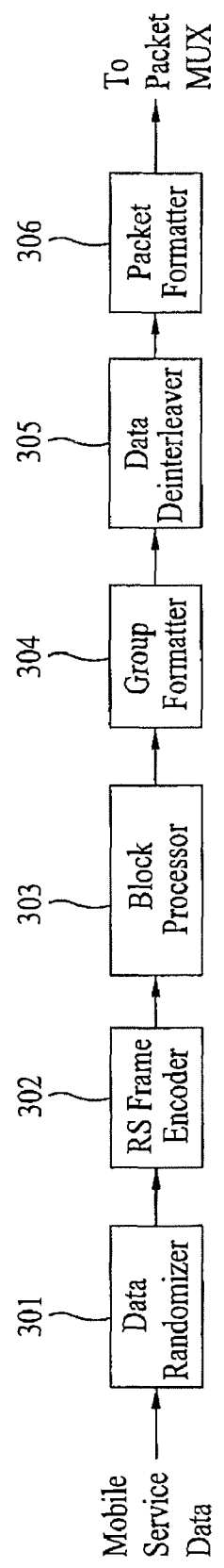
FIG. 4 is a block diagram showing an example of the pre-processor of FIG. 3.

FIG. 4 illustrates a block diagram showing an example of the pre-processor 230 according to the present invention. The pre-processor 230 includes a data randomizer 301, a RS frame encoder 302, a block processor 303, a group formatter 304, a data deinterleaver 305, a packet formatter 306. The data randomizer 301 within the above-described pre-processor 230 randomizes the mobile service data packet including the mobile service data that is inputted through the demultiplexer 210. Then, the data randomizer 301 outputs the randomized mobile service data packet to the RS frame encoder 302. At this point, since the data randomizer 301 performs the randomizing process on the mobile service data, the randomizing process that is to be performed by the data randomizer 251 of the post-processor 250 on the mobile service data may be omitted. The data randomizer 301 may also discard the synchronization byte within the mobile service data packet and perform the randomizing process. This is an option that may be chosen by the system designer. In the example given in the present invention, the randomizing process is performed without discarding the synchronization byte within the mobile service data packet.

The RS frame encoder 302 groups a plurality of mobile the synchronization byte within the mobile service data packets that is randomized and inputted, so as to create a RS frame. Then, the RS frame encoder 302 performs at least one of an error correction encoding process and an error detection encoding process in RS frame units. Accordingly, robustness may be provided to the mobile service data, thereby scattering group error that may occur during changes in a frequency environment, thereby enabling the enhanced data to respond to the frequency environment, which is extremely vulnerable and liable to frequent changes. Also, the RS frame encoder 302 groups a plurality of RS frame so as to create a super frame, thereby performing a row permutation process in super frame units. The row permutation process may also be referred to as a row interleaving process. Hereinafter, the process will be referred to as row permutation for simplicity.

More specifically, when the RS frame encoder 302 performs the process of permuting each row of the super frame in accordance with a pre-determined rule, the position of the rows within the super frame before and after the row permutation process is changed. If the row permutation process is performed by super frame units, and even though the section having a plurality of errors occurring therein becomes very long, and even though the number of errors included in the RS frame, which is to be decoded, exceeds the extent of being able to be corrected, the errors become dispersed within the entire super frame. Thus, the decoding ability is even more enhanced as compared to a single RS frame.

At this point, as an example of the present invention, RS-encoding is applied for the error correction encoding process, and a cyclic redundancy check (CRC) encoding is applied for the error detection process. When performing the RS-encoding, parity data that are used for the error correction are generated. And, when performing the CRC encoding, CRC data that are used for the error detection are generated. The RS encoding is one of forward error correction (FEC) methods. The FEC corresponds to a technique for compensating errors that occur during the transmission process. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system. Herein, the RS frame encoder 302 refers to a pre-determined transmission parameter and/or the transmission parameter provided from the service multiplexer 100 so as to perform operations including RS frame configuration, RS encoding, CRC encoding, super frame configuration, and row permutation in super frame units.

Pre-Processor within RS Frame Encoder

Figure 5:
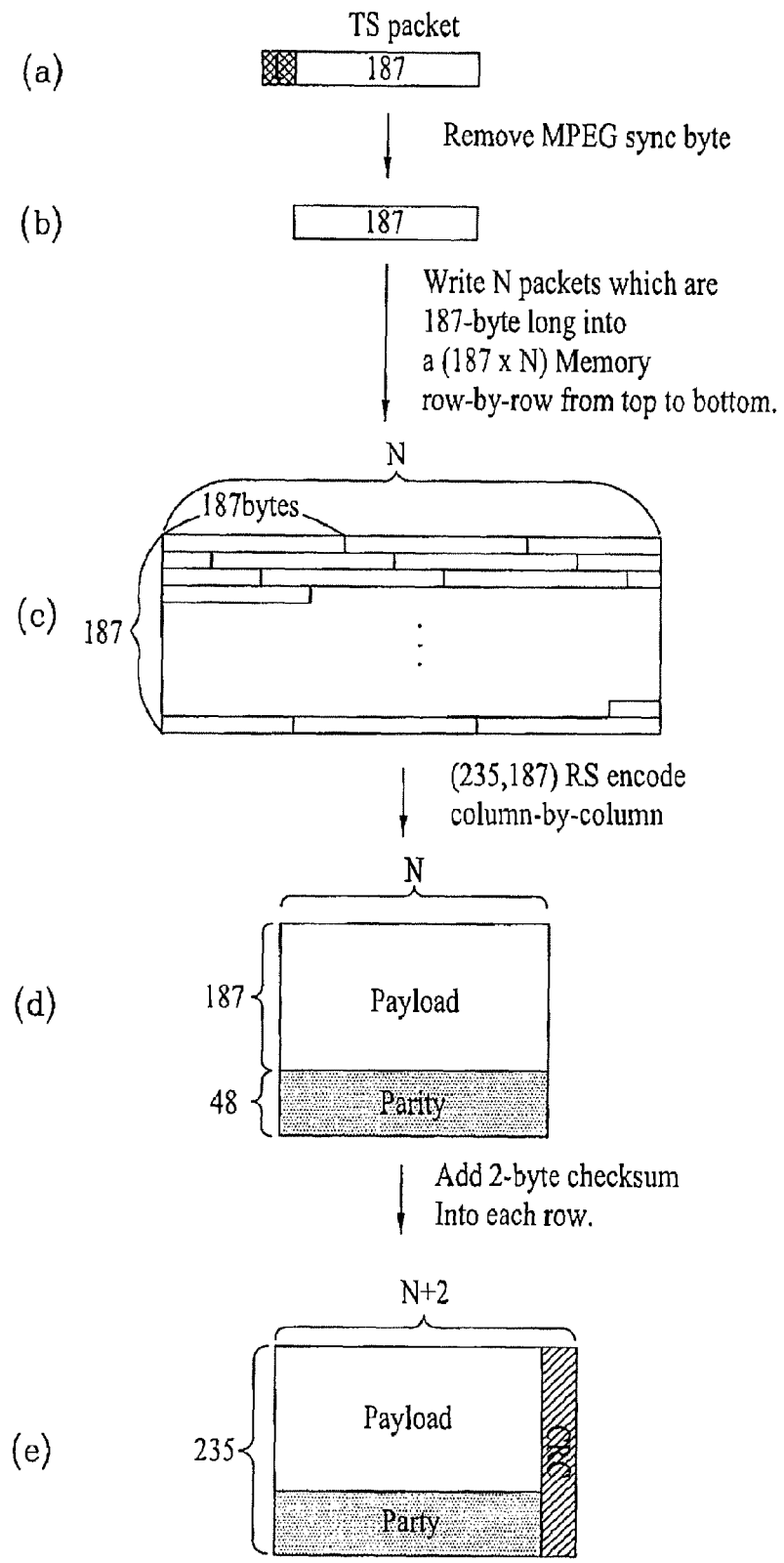
FIG. 5 is a view showing an example of an RS frame encoding process.

FIG. 5(a) to FIG. 5(e) illustrate error correction encoding and error detection encoding processed according to an embodiment of the present invention. More specifically, the RS frame encoder 302 first divides the inputted mobile service data bytes to units of a predetermined length. The pre-determined length is decided by the system designer. And, in the example of the present invention, the predetermined length is equal to 187 bytes, and, therefore, the 187-byte unit will be referred to as a packet for simplicity. For example, when the mobile service data that are being inputted, as shown in FIG. 5(a), correspond to a MPEG transport packet stream configured of 188-byte units, the first synchronization byte is removed, as shown in FIG. 5(b), so as to configure a 187-byte unit. Herein, the synchronization byte is removed because each mobile service data packet has the same value.

Herein, the process of removing the synchronization byte may be performed during a randomizing process of the data randomizer 301 in an earlier process. In this case, the process of the removing the synchronization byte by the RS frame encoder 302 may be omitted. Moreover, when adding synchronization bytes from the receiving system, the process may be performed by the data derandomizer instead of the RS frame decoder. Therefore, if a removable fixed byte (e.g., synchronization byte) does not exist within the mobile service data packet that is being inputted to the RS frame encoder 302, or if the mobile service data that are being inputted are not configured in a packet format, the mobile service data that are being inputted are divided into 187-byte units, thereby configuring a packet for each 187-byte unit.

Subsequently, as shown in FIG. 5(c), N number of packets configured of 187 bytes is grouped to configure a RS frame. At this point, the RS frame is configured as a RS frame having the size of N(row)*187(column) bytes, in which 187-byte packets are sequentially inputted in a row direction. In order to simplify the description of the present invention, the RS frame configured as described above will also be referred to as a first RS frame. More specifically, only pure mobile service data are included in the first RS frame, which is the same as the structure configured of 187 N-byte rows. Thereafter, the mobile service data within the RS frame are divided into an equal size. Then, when the divided mobile service data are transmitted in the same order as the input order for configuring the RS frame, and when one or more errors have occurred at a particular point during the transmitting/receiving process, the errors are clustered (or gathered) within the RS frame as well. In this case, the receiving system uses a RS erasure decoding method when performing error correction decoding, thereby enhancing the error correction ability. At this point, the N number of columns within the N number of RS frame includes 187 bytes, as shown in FIG. 5(c).

In this case, a (Nc,Kc)–RS encoding process is performed on each column, so as to generate Nc−Kc(=P) number of parity bytes. Then, the newly generated P number of parity bytes is added after the very last byte of the corresponding column, thereby creating a column of (187+P) bytes. Herein, as shown in FIG. 5(c), Kc is equal to 187 (i.e., Kc=187), and Nc is equal to 187+P (i.e., Nc=187+P). For example, when P is equal to 48, (235,187)–RS encoding process is performed so as to create a column of 235 bytes. When such RS encoding process is performed on all N number of columns, as shown in FIG. 5(c), a RS frame having the size of N(row)*(187+P) (column) bytes may be created, as shown in FIG. 5(d). In order to simplify the description of the present invention, the RS frame having the RS parity inserted therein will be referred to as s second RS frame. More specifically, the second RS frame having the structure of (187+P) rows configured of N bytes may be configured.

As shown in FIG. 5(c) or FIG. 5(d), each row of the RS frame is configured of N bytes. However, depending upon channel conditions between the transmitting system and the receiving system, error may be included in the RS frame. When errors occur as described above, CRC data (or CRC code or CRC checksum) may be used on each row unit in order to verify whether error exists in each row unit. The RS frame encoder 302 may perform CRC encoding on the mobile service data being RS encoded so as to create (or generate) the CRC data. The CRC data being generated by CRC encoding may be used to indicate whether the mobile service data have been damaged while being transmitted through the channel.

The present invention may also use different error detection encoding methods other than the CRC encoding method. Alternatively, the present invention may use the error correction encoding method to enhance the overall error correction ability of the receiving system. FIG. 5(e) illustrates an example of using a 2-byte (i.e., 16-bit) CRC checksum as the CRC data. Herein, a 2-byte CRC checksum is generated for N number of bytes of each row, thereby adding the 2-byte CRC checksum at the end of the N number of bytes. Thus, each row is expanded to (N+2) number of bytes. Equation 1 below corresponds to an exemplary equation for generating a 2-byte CRC checksum for each row being configured of N number of bytes.

$$g(x) = x^{16} + x^{12} + x^5 + 1 \qquad \text{Equation 1}$$

The process of adding a 2-byte checksum in each row is only exemplary. Therefore, the present invention is not limited only to the example proposed in the description set forth herein. In order to simplify the understanding of the present invention, the RS frame having the RS parity and CRC checksum added therein will hereinafter be referred to as a third RS frame. More specifically, the third RS frame corresponds to (187+P) number of rows each configured of (N+2) number of bytes. As described above, when the process of RS encoding and CRC encoding are completed, the (N*187)-byte RS frame is expanded to a (N+2)*(187+P)-byte RS frame. Furthermore, the RS frame that is expanded, as shown in FIG. 5(e), is inputted to the block processor 303.

As described above, the mobile service data encoded by the RS frame encoder 302 are inputted to the block processor 303. The block processor 303 then encodes the inputted mobile service data at a coding rate of G/H (wherein, G is smaller than H (i.e., G<H)) and then outputted to the group formatter 304. More specifically, the block processor 303 divides the mobile service data being inputted in byte units into bit units. Then, the G number of bits is encoded to H number of bits. Thereafter, the encoded bits are converted back to byte units and then outputted. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). Hereinafter, the former coding rate will be referred to as a coding rate of ½ (½-rate coding), and the latter coding rate will be referred to as a coding rate of ¼ (¼-rate coding), for simplicity.

Herein, when using the ¼ coding rate, the coding efficiency is greater than when using the ½ coding rate, and may, therefore, provide greater and enhanced error correction ability. For such reason, when it is assumed that the data encoded at a ¼ coding rate in the group formatter 304, which is located near the end portion of the system, are allocated to an area in which the receiving performance may be deteriorated, and that the data encoded at a ½ coding rate are allocated to an area having excellent receiving performance, the difference in performance may be reduced. At this point, the block processor 303 may also receive signaling information including transmission parameters. Herein, the signaling information may also be processed with either ½-rate coding or ¼-rate coding as in the step of processing mobile service data. Thereafter, the signaling information is also considered the same as the mobile service data and processed accordingly.

Meanwhile, the group formatter inserts mobile service data that are outputted from the block processor 303 in corresponding areas within a data group, which is configured in accordance with a pre-defined rule. Also, with respect to the data deinterleaving process, each place holder or known data (or known data place holders) are also inserted in corresponding areas within the data group. At this point, the data group may be divided into at least one hierarchical area. Herein, the type of mobile service data being inserted in each area may vary depending upon the characteristics of each hierarchical area. Additionally, each area may, for example, be divided based upon the receiving performance within the data group. Furthermore, one data group may be configured to include a set of field synchronization data.

Figure 6A:
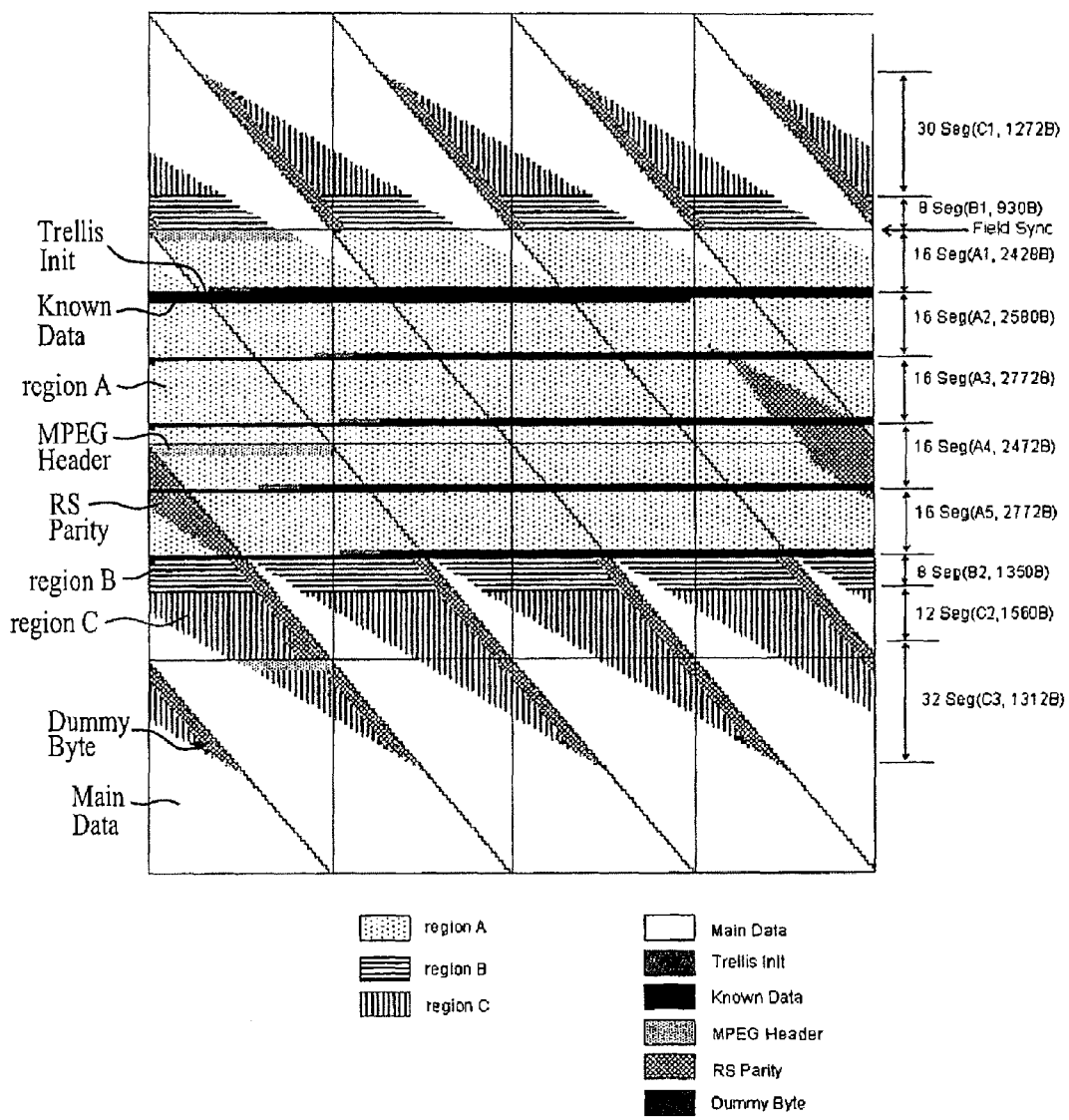
FIGS. 6A and 6B are views showing the data structure of previous and next stages of a data deinterleaver in a digital broadcast transmitting system according to the present invention.
Figure 6B:
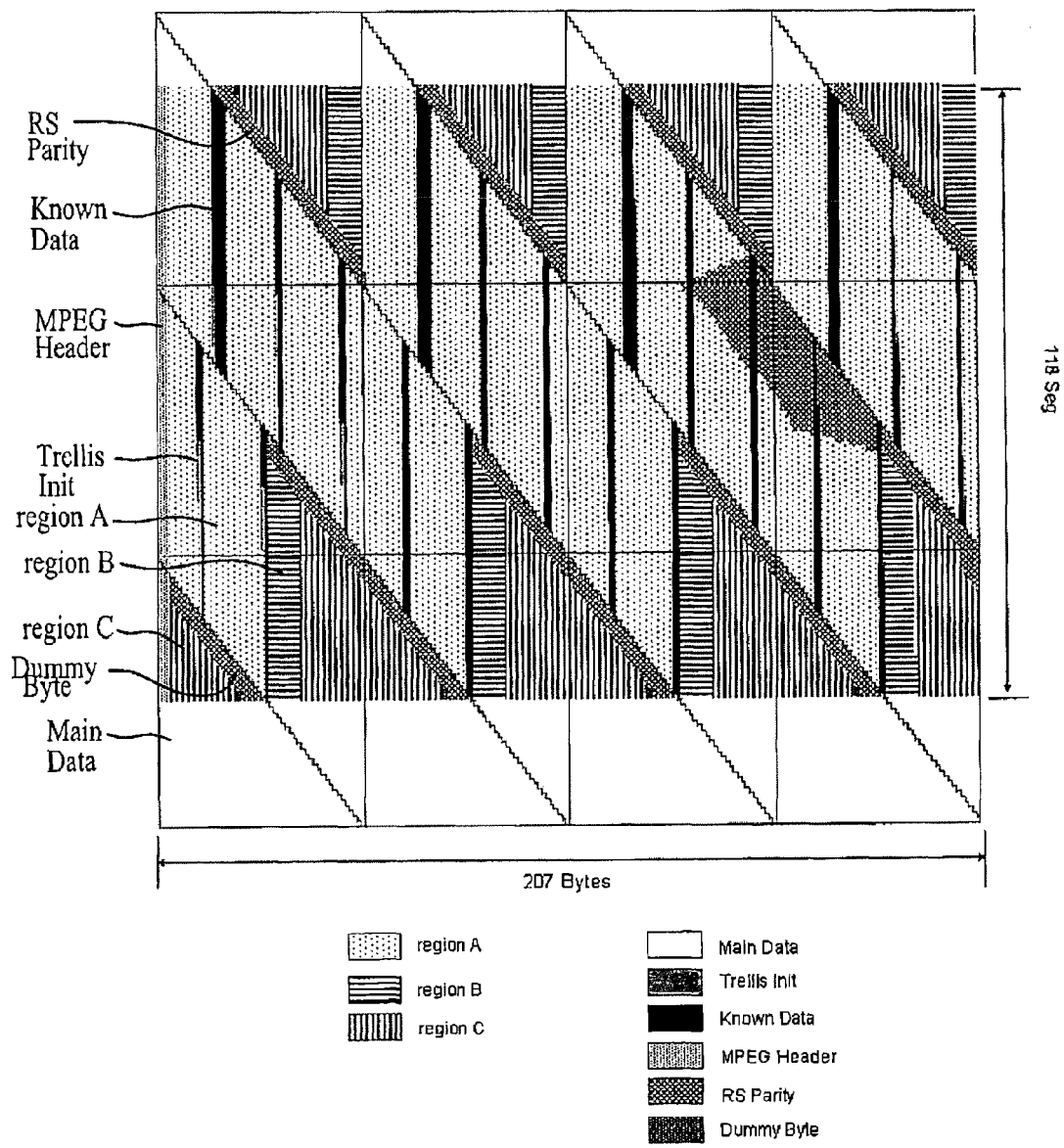

In an example given in the present invention, a data group is divided into A, B, and C regions in a data configuration prior to data deinterleaving. At this point, the group formatter 304 allocates the mobile service data, which are inputted after being RS encoded and block encoded, to each of the corresponding regions by referring to the transmission parameter. FIG. 6A illustrates an alignment of data after being data interleaved and identified, and FIG. 6B illustrates an alignment of data before being data interleaved and identified. More specifically, a data structure identical to that shown in FIG. 6A is transmitted to a receiving system. Also, the data group configured to have the same structure as the data structure shown in FIG. 6A is inputted to the data deinterleaver 305.

As described above, FIG. 6A illustrates a data structure prior to data deinterleaving that is divided into 3 regions, such as region A, region B, and region C. Also, in the present invention, each of the regions A to C is further divided into a plurality of regions. Referring to FIG. 6A, region A is divided into 5 regions (A1 to A5), region B is divided into 2 regions (B1 and B2), and region C is divided into 3 regions (C1 to C3). Herein, regions A to C are identified as regions having similar receiving performances within the data group. Herein, the type of mobile service data, which are inputted, may also vary depending upon the characteristic of each region.

In the example of the present invention, the data structure is divided into regions A to C based upon the level of interference of the main service data. Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, and when consecutively long known data are to be periodically inserted in the mobile service data, the known data having a predetermined length may be periodically inserted in the region having no interference from the main service data (e.g., region A). However, due to interference from the main service data, it is difficult to periodically insert known data and also to insert consecutively long known data to a region having interference from the main service data (e.g., region B and region C).

Hereinafter, examples of allocating data to region A (A1 to A5), region B (B1 and B2), and region C (C1 to C3) will now be described in detail with reference to FIG. 6A. The data group size, the number of hierarchically divided regions within the data group and the size of each region, and the number of mobile service data bytes that can be inserted in each hierarchically divided region of FIG. 6A are merely examples given to facilitate the understanding of the present invention. Herein, the group formatter 304 creates a data group including places in which field synchronization data bytes are to be inserted, so as to create the data group that will hereinafter be described in detail.

More specifically, region A is a region within the data group in which a long known data sequence may be periodically inserted, and in which includes regions wherein the main service data are not mixed (e.g., A1 to A5). Also, region A includes a region (e.g., A1) located between a field synchronization region and the region in which the first known data sequence is to be inserted. The field synchronization region has the length of one segment (i.e., 832 symbols) existing in an ATSC system.

For example, referring to FIG. 6A, 2428 bytes of the mobile service data may be inserted in region A1, 2580 bytes may be inserted in region A2, 2772 bytes may be inserted in region A3, 2472 bytes may be inserted in region A4, and 2772 bytes may be inserted in region A5. Herein, trellis initialization data or known data, MPEG header, and RS parity are not included in the mobile service data. As described above, when region A includes a known data sequence at both ends, the receiving system uses channel information that can obtain known data or field synchronization data, so as to perform equalization, thereby providing enforced equalization performance.

Also, region B includes a region located within 8 segments at the beginning of a field synchronization region within the data group (chronologically placed before region A1) (e.g., region B1), and a region located within 8 segments behind the very last known data sequence which is inserted in the data group (e.g., region B2). For example, 930 bytes of the mobile service data may be inserted in the region B1, and 1350 bytes may be inserted in region B2. Similarly, trellis initialization data or known data, MPEG header, and RS parity are not included in the mobile service data. In case of region B, the receiving system may perform equalization by using channel information obtained from the field synchronization region. Alternatively, the receiving system may also perform equalization by using channel information that may be obtained from the last known data sequence, thereby enabling the system to respond to the channel changes.

Region C includes a region located within 30 segments including and preceding the 9th segment of the field synchronization region (chronologically located before region A) (e.g., region C1), a region located within 12 segments including and following the 9th segment of the very last known data sequence within the data group (chronologically located after region A) (e.g., region C2), and a region located in 32 segments after the region C2 (e.g., region C3). For example, 1272 bytes of the mobile service data may be inserted in the region C1, 1560 bytes may be inserted in region C2, and 1312 bytes may be inserted in region C3. Similarly, trellis initialization data or known data, MPEG header, and RS parity are not included in the mobile service data. Herein, region C (e.g., region C1) is located chronologically earlier than (or before) region A.

Since region C (e.g., region C1) is located further apart from the field synchronization region which corresponds to the closest known data region, the receiving system may use the channel information obtained from the field synchronization data when performing channel equalization. Alternatively, the receiving system may also use the most recent channel information of a previous data group. Furthermore, in region C (e.g., region C2 and region C3) located before region A, the receiving system may use the channel information obtained from the last known data sequence to perform equalization. However, when the channels are subject to fast and frequent changes, the equalization may not be performed perfectly. Therefore, the equalization performance of region C may be deteriorated as compared to that of region B.

When it is assumed that the data group is allocated with a plurality of hierarchically divided regions, as described above, the block processor 303 may encode the mobile service data, which are to be inserted to each region based upon the characteristic of each hierarchical region, at a different coding rate. For example, the block processor 303 may encode the mobile service data, which are to be inserted in regions A1 to A5 of region A, at a coding rate of ½. Then, the group formatter 304 may insert the ½-rate encoded mobile service data to regions A1 to A5.

The block processor 303 may encode the mobile service data, which are to be inserted in regions B1 and B2 of region B, at a coding rate of ¼ having higher error correction ability as compared to the ½-coding rate. Then, the group formatter 304 inserts the ¼-rate coded mobile service data in region B1 and region B2. Furthermore, the block processor 303 may encode the mobile service data, which are to be inserted in regions C1 to C3 of region C, at a coding rate of ¼ or a coding rate having higher error correction ability than the ¼-coding rate. Then, the group formatter 304 may either insert the encoded mobile service data to regions C1 to C3, as described above, or leave the data in a reserved region for future usage.

In addition, the group formatter 304 also inserts supplemental data, such as signaling information that notifies the overall transmission information, other than the mobile service data in the data group. Also, apart from the encoded mobile service data outputted from the block processor 303, the group formatter 304 also inserts MPEG header place holders, non-systematic RS parity place holders, main service data place holders, which are related to data deinterleaving in a later process, as shown in FIG. 6A. Herein, the main service data place holders are inserted because the mobile service data bytes and the main service data bytes are alternately mixed with one another in regions B and C based upon the input of the data deinterleaver, as shown in FIG. 6A. For example, based upon the data outputted after data deinterleaving, the place holder for the MPEG header may be allocated at the very beginning of each packet.

Furthermore, the group formatter 304 either inserts known data generated in accordance with a pre-determined method or inserts known data place holders for inserting the known data in a later process. Additionally, place holders for initializing the trellis encoding module 256 are also inserted in the corresponding regions. For example, the initialization data place holders may be inserted in the beginning of the known data sequence. Herein, the size of the mobile service data that can be inserted in a data group may vary in accordance with the sizes of the trellis initialization place holders or known data (or known data place holders), MPEG header place holders, and RS parity place holders.

The output of the group formatter 304 is inputted to the data deinterleaver 305. And, the data deinterleaver 305 deinterleaves data by performing an inverse process of the data interleaver on the data and place holders within the data group, which are then outputted to the packet formatter 306. More specifically, when the data and place holders within the data group configured, as shown in FIG. 6A, are deinterleaved by the data deinterleaver 305, the data group being outputted to the packet formatter 306 is configured to have the structure shown in FIG. 6B.

The packet formatter 306 removes the main service data place holders and the RS parity place holders that were allocated for the deinterleaving process from the deinterleaved data being inputted. Then, the packet formatter 306 groups the remaining portion and replaces the 4-byte MPEG header place holder with an MPEG header having a null packet PID (or an unused PID from the main service data packet). Also, when the group formatter 304 inserts known data place holders, the packet formatter 306 may insert actual known data in the known data place holders, or may directly output the known data place holders without any modification in order to make replacement insertion in a later process. Thereafter, the packet formatter 306 identifies the data within the packet-formatted data group, as described above, as a 188-byte unit mobile service data packet (i.e., MPEG TS packet), which is then provided to the packet multiplexer 240.

The packet multiplexer 240 multiplexes the mobile service data packet outputted from the pre-processor 230 and the main service data packet outputted from the packet jitter mitigator 220 in accordance with a pre-defined multiplexing method. Then, the packet multiplexer 240 outputs the multiplexed data packets to the data randomizer 251 of the post-processor 250. Herein, the multiplexing method may vary in accordance with various variables of the system design. One of the multiplexing methods of the packet formatter 240 consists of providing a burst section along a time axis, and, then, transmitting a plurality of data groups during a burst section within the burst section, and transmitting only the main service data during the non burst section within the burst section. Herein, the burst section indicates the section starting from the beginning of the current burst until the beginning of the next burst.

At this point, the main service data may be transmitted during the burst section. The packet multiplexer 240 refers to the transmission parameter, such as information on the burst size or the burst period, so as to be informed of the number of data groups and the period of the data groups included in a single burst. Herein, the mobile service data and the main service data may co-exist in the burst section, and only the main service data may exist in the non burst section. Therefore, a main data service section transmitting the main service data may exist in both burst and non burst sections. At this point, the main data service section within the burst section and the number of main data service packets included in the non burst section may either be different from one another or be the same.

When the mobile service data are transmitted in a burst structure, in the receiving system receiving only the mobile service data turns the power on only during the burst section, thereby receiving the corresponding data. Alternatively, in the section transmitting only the main service data, the power is turned off so that the main service data are not received in this section. Thus, the power consumption of the receiving system may be reduced.

Detailed Embodiments of the RS Frame Structure and Packet Multiplexing

Hereinafter, detailed embodiments of the pre-processor 230 and the packet multiplexer 240 will now be described. According to an embodiment of the present invention, the N value corresponding to the length of a row, which is included in the RS frame that is configured by the RS frame encoder 302, is set to 538. Accordingly, the RS frame encoder 302 receives 538 transport stream (TS) packets so as to configure a first RS frame having the size of 538*187 bytes. Thereafter, as described above, the first RS frame is processed with a (235,187)-RS encoding process so as to configure a second RS frame having the size of 538*235 bytes. Finally, the second RS frame is processed with generating a 16-bit checksum so as to configure a third RS frame having the sizes of 540*235.

Meanwhile, as shown in FIG. 6A, the sum of the number of bytes of regions A1 to A5 of region A, in which ½-rate encoded mobile service data are to be inserted, among the plurality of regions within the data group is equal to 13024 bytes (=2428+2580+2772+2472+2772 bytes). Herein, the number of byte prior to performing the ½-rate encoding process is equal to 6512 (=13024/2). On the other hand, the sum of the number of bytes of regions B1 and B2 of region B, in which ¼-rate encoded mobile service data are to be inserted, among the plurality of regions within the data group is equal to 2280 bytes (=930+1350 bytes). Herein, the number of byte prior to performing the ¼-rate encoding process is equal to 570 (=2280/4).

In other words, when 7082 bytes of mobile service data are inputted to the block processor 303, 6512 byte are expanded to 13024 bytes by being ½-rate encoded, and 570 bytes are expanded to 2280 bytes by being ¼-rate encoded. Thereafter, the block processor 303 inserts the mobile service data expanded to 13024 bytes in regions A1 to A5 of region A and, also, inserts the mobile service data expanded to 2280 bytes in regions B1 and B2 of region B. Herein, the 7082 bytes of mobile service data being inputted to the block processor 303 may be divided into an output of the RS frame encoder 302 and signaling information. In the present invention, among the 7082 bytes of mobile service data, 7050 bytes correspond to the output of the RS frame encoder 302, and the remaining 32 bytes correspond to the signaling information data. Then, ½-rate encoding or ¼-rate encoding is performed on the corresponding data bytes.

Meanwhile, a RS frame being processed with RS encoding and CRC encoding from the RS frame encoder 302 is configured of 540*235 bytes, in other words, 126900 bytes. The 126900 bytes are divided by 7050-byte units along the time axis, so as to produce 7050-byte units. Thereafter, a 32-byte unit of signaling information data is added to the 7050-byte unit mobile service data being outputted from the RS frame encoder 302. Subsequently, the RS frame encoder 302 performs ½-rate encoding or ¼-rate encoding on the corresponding data bytes, which are then outputted to the group formatter 304. Accordingly, the group formatter 304 inserts the ½-rate encoded data in region A and the ¼-rate encoded data in region B.

The process of deciding an N value that is required for configuring the RS frame from the RS frame encoder 302 will now be described in detail. More specifically, the size of the final RS frame (i.e., the third RS frame), which is RS encoded and CRC encoded from the RS frame encoder 302, which corresponds to (N+2)*235 bytes should be allocated to X number of groups, wherein X is an integer. Herein, in a single data group, 7050 data bytes prior to being encoded are allocated. Therefore, if the (N+2)*235 bytes are set to be the exact multiple of 7050(=30*235), the output data of the RS frame encoder 302 may be efficiently allocated to the data group. According to an embodiment of the present invention, the value of N is decided so that (N+2) becomes a multiple of 30. For example, in the present invention, N is equal to 538, and (N+2)(=540) divided by 30 is equal to 18. This indicates that the mobile service data within one RS frame are processed with either ½-rate encoding or ¼-rate encoding. The encoded mobile service data are then allocated to 18 data groups.

Figure 7:
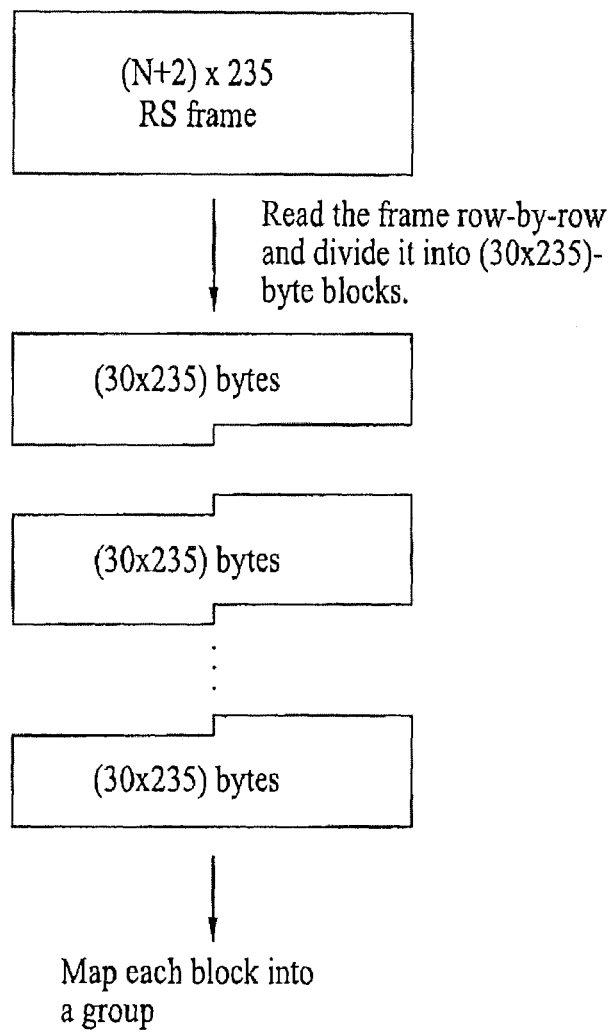
FIG. 7 is a view showing a process of dividing an RS frame.

FIG. 7 illustrates a process of dividing the RS frame according to the present invention. More specifically, the RS frame having the size of (N+2)*235 is divided into 30*235 byte blocks. Then, the divided blocks are mapped to a single group. In other words, the data of a block having the size of 30*235 bytes are processed with one of a ½-rate encoding process and a ¼-rate encoding process and are, then, inserted in a data group. Thereafter, the data group having corresponding data and place holders inserted in each hierarchical region divided by the group formatter 304 passes through the data deinterleaver 305 and the packet formatter 306 so as to be inputted to the packet multiplexer 240.

Figure 8:
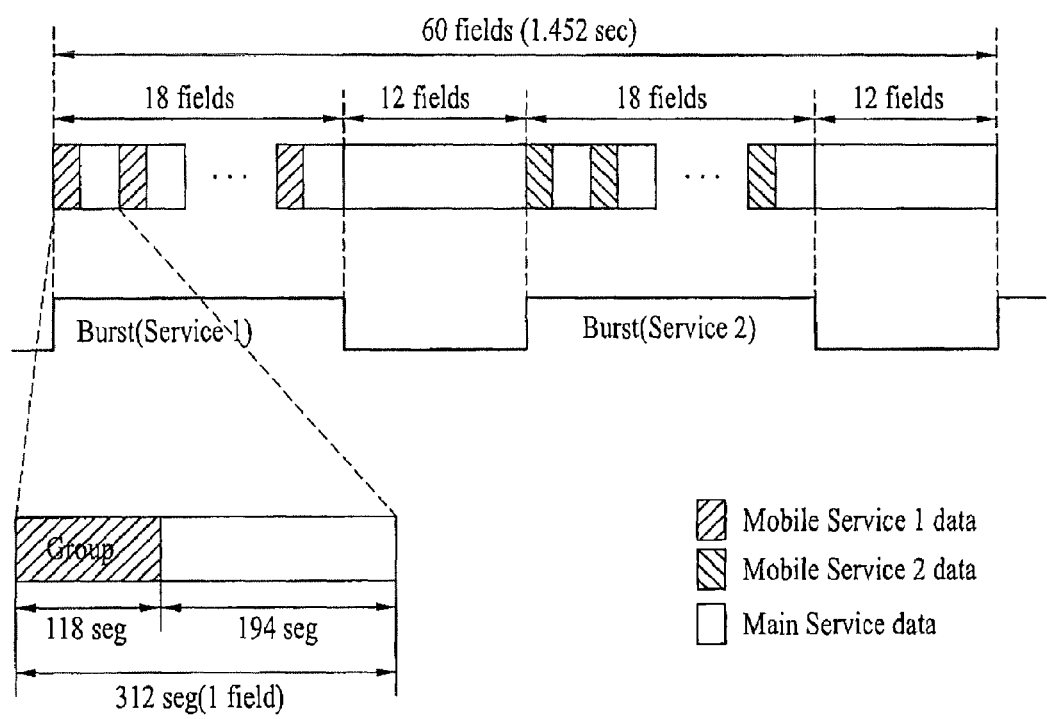
FIG. 8 is a view showing the operation of a packet multiplexer.

FIG. 8 illustrates exemplary operations of a packet multiplexer for transmitting the data group according to the present invention. More specifically, the packet multiplexer 240 multiplexes a field including a data group, in which the mobile service data and main service data are mixed with one another, and a field including only the main service data. Thereafter, the packet multiplexer 240 outputs the multiplexed fields to the data randomizer 251. At this point, in order to transmit the RS frame having the size of 540*235 bytes, 18 data groups should be transmitted. Herein, each data group includes field synchronization data, as shown in FIG. 6A. Therefore, the 18 data groups are transmitted during 18 field sections, and the section during which the 18 data groups are being transmitted corresponds to the burst section.

In each field within the burst section, a data group including field synchronization data is multiplexed with main service data, which are then outputted. For example, in the embodiment of the present invention, in each field within the burst section, a data group having the size of 118 segments is multiplexed with a set of main service data having the size of 194 segments. Referring to FIG. 8, during the burst section (i.e., during the 18 field sections), a field including 18 data groups is transmitted. Then, during the non burst section that follows (i.e., during the 12 field sections), a field consisting only of the main service data is transmitted. Subsequently, during a subsequent burst section, 18 fields including 18 data groups are transmitted. And, during the following non burst section, 12 fields consisting only of the main service data are transmitted.

Furthermore, in the present invention, the same type of data service may be provided in the first burst section including the first 18 data groups and in the second burst section including the next 18 data groups. Alternatively, different types of data service may be provided in each burst section. For example, when it is assumed that different data service types are provided to each of the first burst section and the second burst section, and that the receiving system wishes to receive only one type of data service, the receiving system turns the power on only during the corresponding burst section including the desired data service type so as to receive the corresponding 18 data fields. Then, the receiving system turns the power off during the remaining 42 field sections so as to prevent other data service types from being received. Thus, the amount of power consumption of the receiving system may be reduced. In addition, the receiving system according to the present invention is advantageous in that one RS frame may be configured from the 18 data groups that are received during a single burst section.

According to the present invention, the number of data groups included in a burst section may vary based upon the size of the RS frame, and the size of the RS frame varies in accordance with the value N. More specifically, by adjusting the value N, the number of data groups within the burst section may be adjusted. Herein, in an example of the present invention, the (235,187)–RS encoding process adjusts the value N during a fixed state. Furthermore, the size of the mobile service data that can be inserted in the data group may vary based upon the sizes of the trellis initialization data or known data, the MPEG header, and the RS parity, which are inserted in the corresponding data group.

Meanwhile, since a data group including mobile service data in-between the data bytes of the main service data during the packet multiplexing process, the shifting of the chronological position (or place) of the main service data packet becomes relative. Also, a system object decoder (i.e., MPEG decoder) for processing the main service data of the receiving system, receives and decodes only the main service data and recognizes the mobile service data packet as a null data packet. Therefore, when the system object decoder of the receiving system receives a main service data packet that is multiplexed with the data group, a packet jitter occurs.

At this point, since a multiple-level buffer for the video data exists in the system object decoder and the size of the buffer is relatively large, the packet jitter generated from the packet multiplexer 240 does not cause any serious problem in case of the video data. However, since the size of the buffer for the audio data is relatively small, the packet jitter may cause considerable problem. More specifically, due to the packet jitter, an overflow or underflow may occur in the buffer for the main service data of the receiving system (e.g., the buffer for the audio data). Therefore, the packet jitter mitigator 220 re-adjusts the relative position of the main service data packet so that the overflow or underflow does not occur in the system object decoder.

In the present invention, examples of repositioning places for the audio data packets within the main service data in order to minimize the influence on the operations of the audio buffer will be described in detail. The packet jitter mitigator 220 repositions the audio data packets in the main service data section so that the audio data packets of the main service data can be as equally and uniformly aligned and positioned as possible. The standard for repositioning the audio data packets in the main service data performed by the packet jitter mitigator 220 will now be described. Herein, it is assumed that the packet jitter mitigator 220 knows the same multiplexing information as that of the packet multiplexer 240, which is placed further behind the packet jitter mitigator 220.

Firstly, if one audio data packet exists in the main service data section (e.g., the main service data section positioned between two data groups) within the burst section, the audio data packet is positioned at the very beginning of the main service data section. Alternatively, if two audio data packets exist in the corresponding data section, one audio data packet is positioned at the very beginning and the other audio data packet is positioned at the very end of the main service data section. Further, if more than three audio data packets exist, one audio data packet is positioned at the very beginning of the main service data section, another is positioned at the very end of the main service data section, and the remaining audio data packets are equally positioned between the first and last audio data packets. Secondly, during the main service data section placed immediately before the beginning of a burst section (i.e., during a non burst section), the audio data packet is placed at the very end of the corresponding section.

Thirdly, during a main service data section within the non burst section after the burst section, the audio data packet is positioned at the very end of the main service data section. Finally, the data packets other than audio data packets are positioned in accordance with the inputted order in vacant spaces (i.e., spaces that are not designated for the audio data packets). Meanwhile, when the positions of the main service data packets are relatively re-adjusted, associated program clock reference (PCR) values may also be modified accordingly. The PCR value corresponds to a time reference value for synchronizing the time of the MPEG decoder. Herein, the PCR value is inserted in a specific region of a TS packet and then transmitted.

In the example of the present invention, the packet jitter mitigator 220 also performs the operation of modifying the PCR value. The output of the packet jitter mitigator 220 is inputted to the packet multiplexer 240. As described above, the packet multiplexer 240 multiplexes the main service data packet outputted from the packet jitter mitigator 220 with the mobile service data packet outputted from the pre-processor 230 into a burst structure in accordance with a pre-determined multiplexing rule. Then, the packet multiplexer 240 outputs the multiplexed data packets to the data randomizer 251 of the post-processor 250.

If the inputted data correspond to the main service data packet, the data randomizer 251 performs the same randomizing process as that of the conventional randomizer. More specifically, the synchronization byte within the main service data packet is deleted. Then, the remaining 187 data bytes are randomized by using a pseudo random byte generated from the data randomizer 251. Thereafter, the randomized data are outputted to the RS encoder/non-systematic RS encoder 252.

On the other hand, if the inputted data correspond to the mobile service data packet, the data randomizer 251 may randomize only a portion of the data packet. For example, if it is assumed that a randomizing process has already been performed in advance on the mobile service data packet by the pre-processor 230, the data randomizer 251 deletes the synchronization byte from the 4-byte MPEG header included in the mobile service data packet and, then, performs the randomizing process only on the remaining 3 data bytes of the MPEG header. Thereafter, the randomized data bytes are outputted to the RS encoder/non-systematic RS encoder 252. More specifically, the randomizing process is not performed on the remaining portion of the mobile service data excluding the MPEG header. In other words, the remaining portion of the mobile service data packet is directly outputted to the RS encoder/non-systematic RS encoder 252 without being randomized. Also, the data randomizer 251 may or may not perform a randomizing process on the known data (or known data place holders) and the initialization data place holders included in the mobile service data packet.

The RS encoder/non-systematic RS encoder 252 performs an RS encoding process on the data being randomized by the data randomizer 251 or on the data bypassing the data randomizer 251, so as to add 20 bytes of RS parity data. Thereafter, the processed data are outputted to the data interleaver 253. Herein, if the inputted data correspond to the main service data packet, the RS encoder/non-systematic RS encoder 252 performs the same systematic RS encoding process as that of the conventional broadcasting system, thereby adding the 20-byte RS parity data at the end of the 187-byte data. Alternatively, if the inputted data correspond to the mobile service data packet, the RS encoder/non-systematic RS encoder 252 performs a non-systematic RS encoding process. At this point, the 20-byte RS parity data obtained from the non-systematic RS encoding process are inserted in a pre-decided parity byte place within the mobile service data packet.

The data interleaver 253 corresponds to a byte unit convolutional interleaver. The output of the data interleaver 253 is inputted to the parity replacer 254 and to the non-systematic RS encoder 255. Meanwhile, a process of initializing a memory within the trellis encoding module 256 is primarily required in order to decide the output data of the trellis encoding module 256, which is located after the parity replacer 254, as the known data pre-defined according to an agreement between the receiving system and the transmitting system. More specifically, the memory of the trellis encoding module 256 should first be initialized before the received known data sequence is trellis-encoded. At this point, the beginning portion of the known data sequence that is received corresponds to the initialization data place holder and not to the actual known data. Herein, the initialization data place holder has been included in the data by the group formatter within the pre-processor 230 in an earlier process. Therefore, the process of generating initialization data and replacing the initialization data place holder of the corresponding memory with the generated initialization data are required to be performed immediately before the inputted known data sequence is trellis-encoded.

Additionally, a value of the trellis memory initialization data is decided and generated based upon a memory status of the trellis encoding module 256. Further, due to the newly replaced initialization data, a process of newly calculating the RS parity and replacing the RS parity, which is outputted from the data interleaver 253, with the newly calculated RS parity is required. Therefore, the non-systematic RS encoder 255 receives the mobile service data packet including the initialization data place holders, which are to be replaced with the actual initialization data, from the data interleaver 253 and also receives the initialization data from the trellis encoding module 256.

Among the inputted mobile service data packet, the initialization data place holders are replaced with the initialization data, and the RS parity data that are added to the mobile service data packet are removed and processed with non-systematic RS encoding. Thereafter, the new RS parity obtained by performing the non-systematic RS encoding process is outputted to the parity replacer 255. Accordingly, the parity replacer 255 selects the output of the data interleaver 253 as the data within the mobile service data packet, and the parity replacer 255 selects the output of the non-systematic RS encoder 255 as the RS parity. The selected data are then outputted to the trellis encoding module 256.

Meanwhile, if the main service data packet is inputted or if the mobile service data packet, which does not include any initialization data place holders that are to be replaced, is inputted, the parity replacer 254 selects the data and RS parity that are outputted from the data interleaver 253. Then, the parity replacer 254 directly outputs the selected data to the trellis encoding module 256 without any modification. The trellis encoding module 256 converts the byte-unit data to symbol units and performs a 12-way interleaving process so as to trellis-encode the received data. Thereafter, the processed data are outputted to the synchronization multiplexer 260.

The synchronization multiplexer 260 inserts a field synchronization signal and a segment synchronization signal to the data outputted from the trellis encoding module 256 and, then, outputs the processed data to the pilot inserter 271 of the transmission unit 270. Herein, the data having a pilot inserted therein by the pilot inserter 271 are modulated by the modulator 272 in accordance with a pre-determined modulating method (e.g., a VSB method). Thereafter, the modulated data are transmitted to each receiving system though the radio frequency (RF) up-converter 273.

Block Processor

Figure 9:
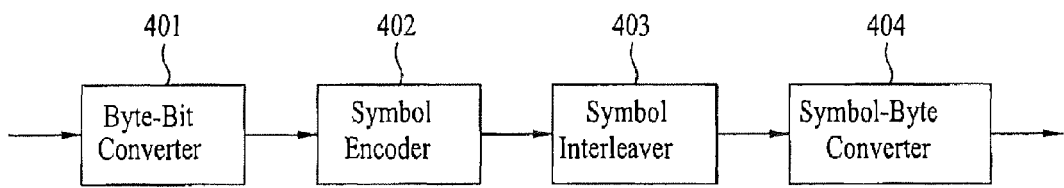
FIG. 9 is a detailed block diagram showing an example of a block processor.

FIG. 9 illustrates a block diagram showing a structure of a block processor according to the present invention. Herein, the block processor includes a byte-bit converter 401, a symbol encoder 402, a symbol interleaver 403, and a symbol-byte converter 404. The byte-bit converter 401 divides the mobile service data bytes that are inputted from the RS frame encoder 112 into bits, which are then outputted to the symbol encoder 402. The byte-bit converter 401 may also receive signaling information including transmission parameters. The signaling information data bytes are also divided into bits so as to be outputted to the symbol encoder 402. Herein, the signaling information including transmission parameters may be processed with the same data processing step as that of the mobile service data. More specifically, the signaling information may be inputted to the block processor 303 by passing through the data randomizer 301 and the RS frame encoder 302. Alternatively, the signaling information may also be directly outputted to the block processor 303 without passing though the data randomizer 301 and the RS frame encoder 302.

The symbol encoder 402 corresponds to a G/H-rate encoder encoding the inputted data from G bits to H bits and outputting the data encoded at the coding rate of G/H. According to the embodiment of the present invention, it is assumed that the symbol encoder 402 performs either a coding rate of ½ (also referred to as a ½-rate encoding process) or an encoding process at a coding rate of ¼ (also referred to as a ¼-rate encoding process). The symbol encoder 402 performs one of ½-rate encoding and ¼-rate encoding on the inputted mobile service data and signaling information. Thereafter, the signaling information is also recognized as the mobile service data and processed accordingly.

In case of performing the ½-rate coding process, the symbol encoder 402 receives 1 bit and encodes the received 1 bit to 2 bits (i.e., 1 symbol). Then, the symbol encoder 402 outputs the processed 2 bits (or 1 symbol). On the other hand, in case of performing the ¼-rate encoding process, the symbol encoder 402 receives 1 bit and encodes the received 1 bit to 4 bits (i.e., 2 symbols). Then, the symbol encoder 402 outputs the processed 4 bits (or 2 symbols).

Figure 10:
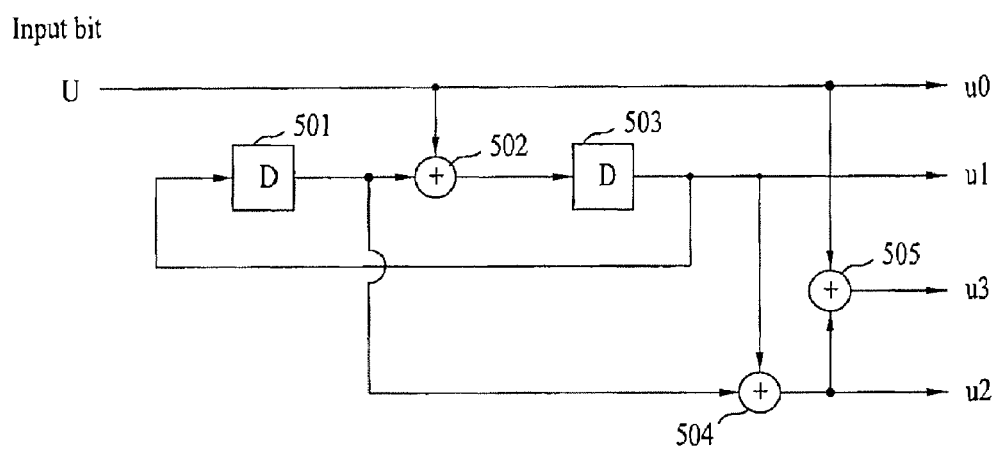
FIG. 10 is a detailed block diagram showing an example of a symbol encoder.

FIG. 10 illustrates a detailed block diagram of the symbol encoder 402 shown in FIG. 9. The symbol encoder 402 includes two delay units 501 and 503 and three adders 502, 504, and 505. Herein, the symbol encoder 402 encodes an input data bit U and outputs the coded bit U to 4 bits (u0 to u4). At this point, the data bit U is directly outputted as uppermost bit u0 and simultaneously encoded as lower bit u1$u$2u3 and then outputted. More specifically, the input data bit U is directly outputted as the uppermost bit u0 and simultaneously outputted to the first and third adders 502 and 505. The first adder 502 adds the input data bit U and the output bit of the first delay unit 501 and, then, outputs the added bit to the second delay unit 503. Then, the data bit delayed by a pre-determined time (e.g., by 1 clock) in the second delay unit 503 is outputted as lower bit u1 and simultaneously fed-back to the first delay unit 501. The first delay unit 501 delays the data bit fed-back from the second delay unit 503 by a pre-determined time (e.g., by 1 clock). Then, the first delay unit 501 outputs the delayed data bit to the first adder 502 and the second adder 504. The second adder 504 adds the data bits outputted from the first and second delay units 501 and 503 as a lower bit u2. The third adder 505 adds the input data bit U and the output of the second delay unit 503 and outputs the added data bit as a lower bit u3.

At this point, if the input data bit U corresponds to data encoded at a ½-coding rate, the symbol encoder 402 configures a symbol with u1$u$0 bits from the 4 output bits u0$u$1$u$2$u$3. Then, the symbol encoder 402 outputs the newly configured symbol. Alternatively, if the input data bit U corresponds to data encoded at a ¼-coding rate, the symbol encoder 402 configures and outputs a symbol with bits u1$u$0 and, then, configures and outputs another symbol with bits u2$u$3. According to another embodiment of the present invention, if the input data bit U corresponds to data encoded at a ¼-coding rate, the symbol encoder 402 may also configure and output a symbol with bits u1$u$0, and then repeat the process once again and output the corresponding bits. According to yet another embodiment of the present invention, the symbol encoder outputs all four output bits U u0$u$1$u$2$u$3. Then, when using the ½-coding rate, the symbol interleaver 403 located behind the symbol encoder 402 selects only the symbol configured of bits u1$u$0 from the four output bits u0$u$1$u$2$u$3. Alternatively, when using the ¼-coding rate, the symbol interleaver 403 may select the symbol configured of bits u1$u$0 and then select another symbol configured of bits u2$u$3. According to another embodiment, when using the ¼-coding rate, the symbol interleaver 403 may repeatedly select the symbol configured of bits u1$u$0.

The output of the symbol encoder 402 is inputted to the symbol interleaver 403. Then, the symbol interleaver 403 performs block interleaving in symbol units on the data outputted from the symbol encoder 402. Any interleaver performing structural rearrangement (or realignment) may be applied as the symbol interleaver 403 of the block processor. However, in the present invention, a variable length symbol interleaver that can be applied even when a plurality of lengths is provided for the symbol, so that its order may be rearranged, may also be used.

Figure 11:
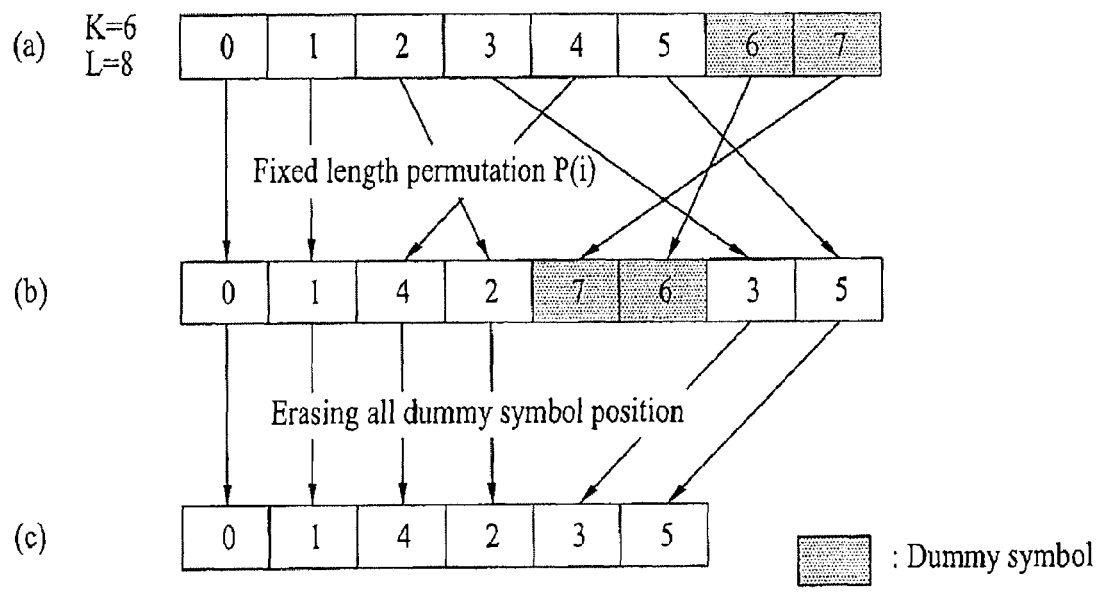
FIG. 11 is a view showing an example of a symbol interleaver.

FIG. 11 illustrates a symbol interleaver according to an embodiment of the present invention. Herein, the symbol interleaver according to the embodiment of the present invention corresponds to a variable length symbol interleaver that may be applied even when a plurality of lengths is provided for the symbol, so that its order may be rearranged. Particularly, FIG. 11 illustrates an example of the symbol interleaver when K=6 and L=8. Herein, K indicates a number of symbols that are outputted for symbol interleaving from the symbol encoder 402. And, L represents a number of symbols that are actually interleaved by the symbol interleaver 403.

In the present invention, the symbol intereleaver 403 should satisfy the conditions of (wherein n is an integer) and of. If there is a difference in value between K and L, (L−K) number of null (or dummy) symbols is added, thereby creating an interleaving pattern. Therefore, K becomes a block size of the actual symbols that are inputted to the symbol interleaver 403 in order to be interleaved. L becomes an interleaving unit when the interleaving process is performed by an interleaving pattern created from the symbol interleaver 403. The example of what is described above is illustrated in FIG. 11.

More specifically, FIG. 11(*a*) to FIG. 11(*c*) illustrate a variable length interleaving process of a symbol interleaver shown in FIG. 9. The number of symbols outputted from the symbol encoder 402 in order to be interleaved is equal to 6 (i.e., K=6). In other words, 6 symbols are outputted from the symbol encoder 402 in order to be interleaved. And, the actual interleaving unit (L) is equal to 8 symbols. Therefore, as shown in FIG. 11(*a*), 2 symbols are added to the null (or dummy) symbol, thereby creating the interleaving pattern. Equation 2 shown below described the process of sequentially receiving K number of symbols, the order of which is to be rearranged, and obtaining an L value satisfying the conditions of (wherein n is an integer) and of, thereby creating the interleaving so as to realign (or rearrange) the symbol order.

In relation to all places, wherein $0 \leq i \leq L-1$, $$P(i) = \{S \times i \times (i+1)/2\} \bmod L \qquad \text{Equation 2}$$

Herein, $L \geq K$, $L = 2^n$, and n and S are integers. Referring to FIG. 11, it is assumed that S is equal to 89, and that L is equal to 8, and FIG. 11 illustrates the created interleaving pattern and an example of the interleaving process. As shown in FIG. 11(*b*), the order of K number of input symbols and (L−K) number of null symbols is rearranged by using the above-mentioned Equation 2. Then, as shown in FIG. 11(*c*), the null byte places are removed, so as to rearrange the order, by using Equation 3 shown below. Thereafter, the symbol that is interleaved by the rearranged order is then outputted to the symbol-byte converter.

if $P(i) > K-1$, then $P(i)$ place is removed and rearranged  Equation 3

Subsequently, the symbol-byte converter 404 converts to bytes the mobile service data symbols, having the rearranging of the symbol order completed and then outputted in accordance with the rearranged order, and thereafter outputs the converted bytes to the group formatter 304.

Figure 12A:
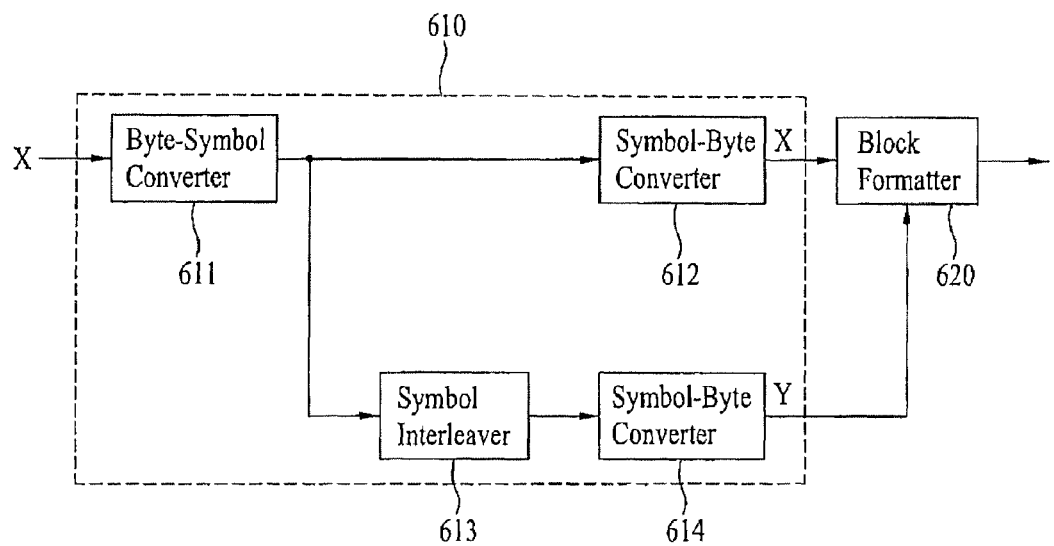
FIG. 12A is a detailed block diagram showing an example of a block processor.

FIG. 12A illustrates a block diagram showing the structure of a block processor according to another embodiment of the present invention. Herein, the block processor includes an interleaving unit 610 and a block formatter 620. The interleaving unit 610 may include a byte-symbol converter 611, a symbol-byte converter 612, a symbol interleaver 613, and a symbol-byte converter 614. Herein, the symbol interleaver 613 may also be referred to as a block interleaver.

The byte-symbol converter 611 of the interleaving unit 610 converts the mobile service data X outputted in byte units from the RS frame encoder 302 to symbol units. Then, the byte-symbol converter 611 outputs the converted mobile service data symbols to the symbol-byte converter 612 and the symbol interleaver 613. More specifically, the byte-symbol converter 611 converts each 2 bits of the inputted mobile service data byte (=8 bits) to 1 symbol and outputs the converted symbols. This is because the input data of the trellis encoding module 256 consist of symbol units configured of 2 bits. The relationship between the block processor 303 and the trellis encoding module 256 will be described in detail in a later process. At this point, the byte-symbol converter 611 may also receive signaling information including transmission parameters. Furthermore, the signaling information bytes may also be divided into symbol units and then outputted to the symbol-byte converter 612 and the symbol interleaver 613.

Figure 12B:
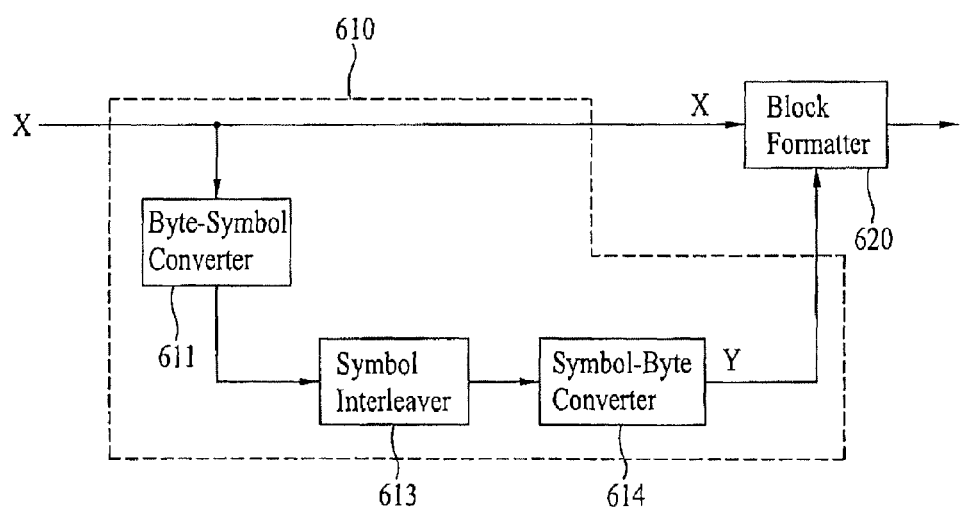
FIG. 12B is a detailed block showing another example of the block processor.

The symbol-byte converter 612 groups 4 symbols outputted from the byte-symbol converter 611 so as to configure a byte. Thereafter, the converted data bytes are outputted to the block formatter 620. Herein, each of the symbol-byte converter 612 and the byte-symbol converter 611 respectively performs an inverse process on one another. Therefore, the yield of these two blocks is offset. Accordingly, as shown in FIG. 12B, the input data X bypass the byte-symbol converter 611 and the symbol-byte converter 612 and are directly inputted to the block formatter 620. More specifically, the interleaving unit 610 of FIG. 12B has a structure equivalent to that of the interleaving unit shown in FIG. 12A. Therefore, the same reference numerals will be used in FIG. 12A and FIG. 12B.

The symbol interleaver 613 performs block interleaving in symbol units on the data that are outputted from the byte-symbol converter 611. Subsequently, the symbol interleaver 613 outputs the interleaved data to the symbol-byte converter 614. Herein, any type of interleaver that can rearrange the structural order may be used as the symbol interleaver 613 of the present invention. In the example given in the present invention, a variable length interleaver that may be applied for symbols having a wide range of lengths, the order of which is to be rearranged. For example, the symbol interleaver of FIG. 11 may also be used in the block processor shown in FIG. 12A and FIG. 12B.

Figure 13:
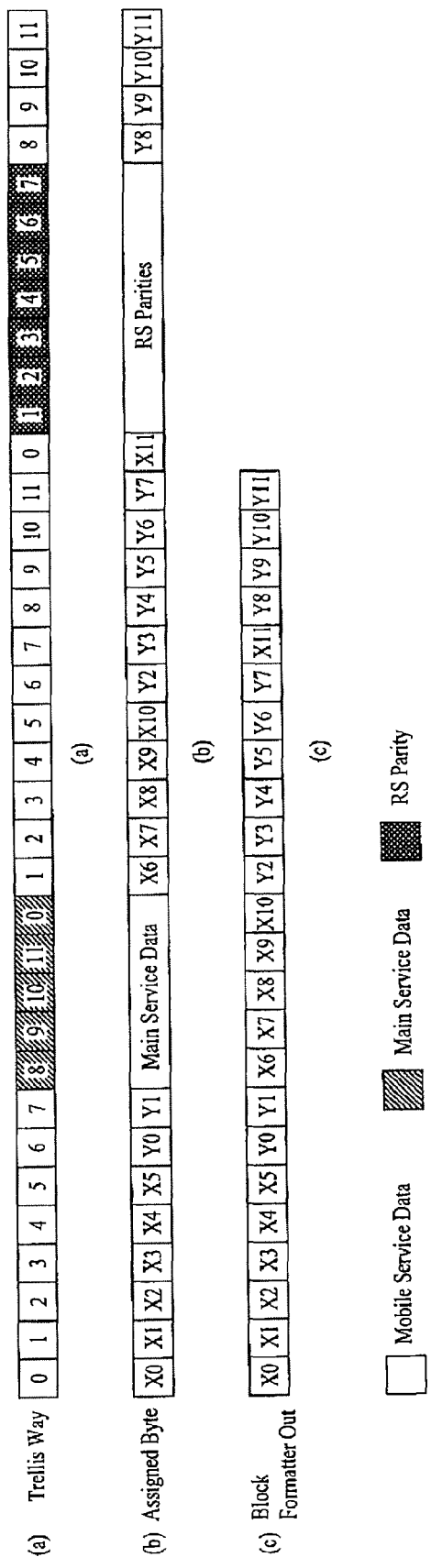
FIG. 13 is a view an example of aligning the output of a symbol-byte converter within a block in accordance with a set standard.

The symbol-byte converter 614 outputs the symbols having the rearranging of the symbol order completed, in accordance with the rearranged order. Thereafter, the symbols are grouped to be configured in byte units, which are then outputted to the block formatter 620. More specifically, the symbol-byte converter 614 groups 4 symbols outputted from the symbol interleaver 613 so as to configure a data byte. As shown in FIG. 13, the block formatter 620 performs the process of aligning the output of each symbol-byte converter 612 and 614 within the block in accordance with a set standard. Herein, the block formatter 620 operates in association with the trellis encoding module 256.

More specifically, the block formatter 620 decides the output order of the mobile service data outputted from each symbol-byte converter 612 and 614 while taking into consideration the place (or order) of the data excluding the mobile service data that are being inputted, wherein the mobile service data include main service data, known data, RS parity data, and MPEG header data.

Figure 14:
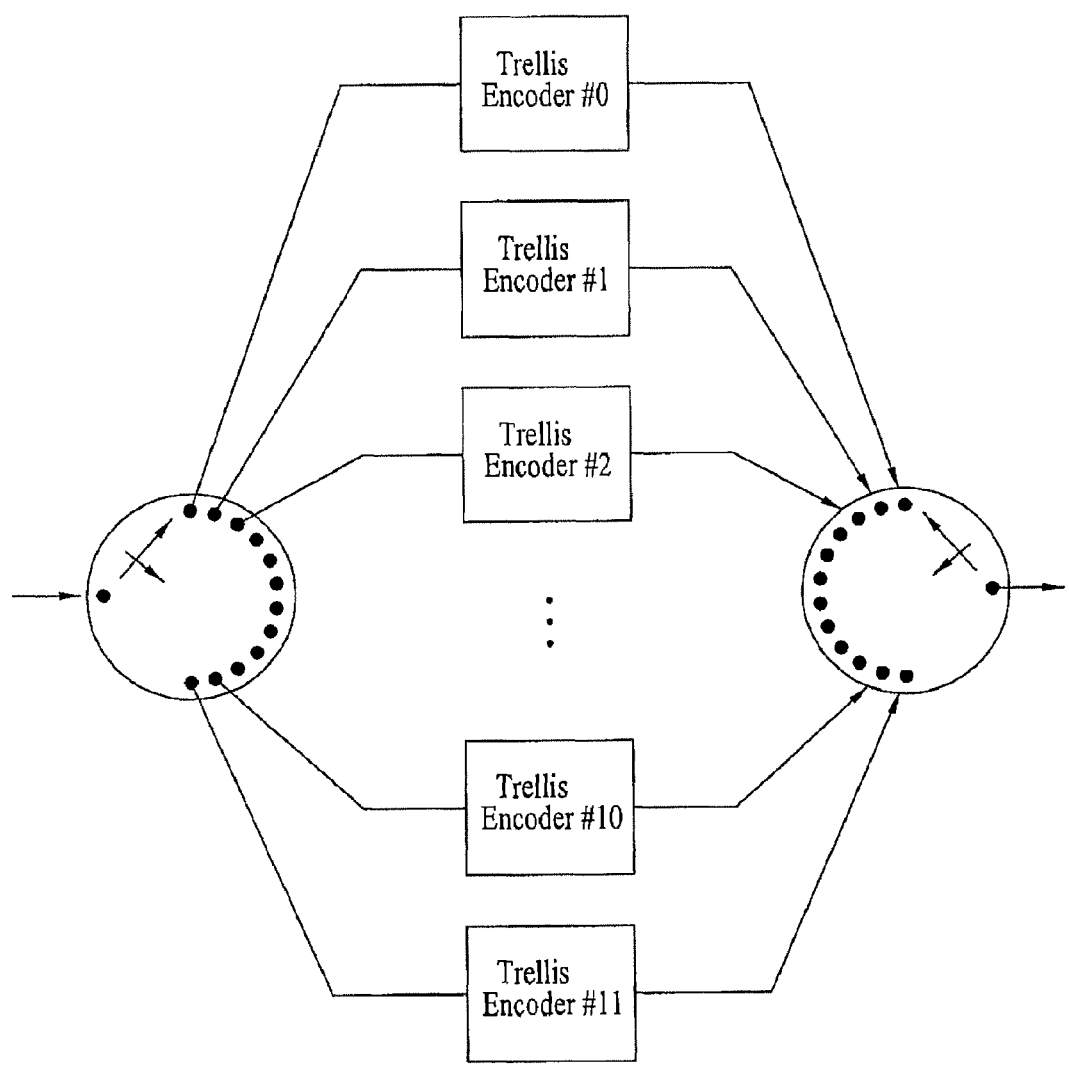
FIG. 14 is a detailed block diagram showing an example of a trellis encoding module.

According to the embodiment of the present invention, the trellis encoding module 256 is provided with 12 trellis encoders. FIG. 14 illustrates a block diagram showing the trellis encoding module 256 according to the present invention. In the example shown in FIG. 14, 12 identical trellis encoders are combined to the interleaver in order to disperse noise. Herein, each trellis encoder may be provided with a pre-coder.

Figure 15A:
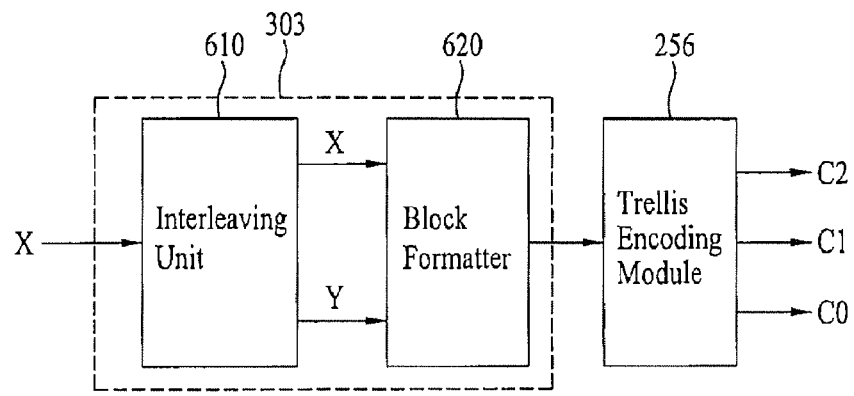
FIG. 15A is a view showing the block processor which is concatenated with the trellis encoding module.
Figure 15B:
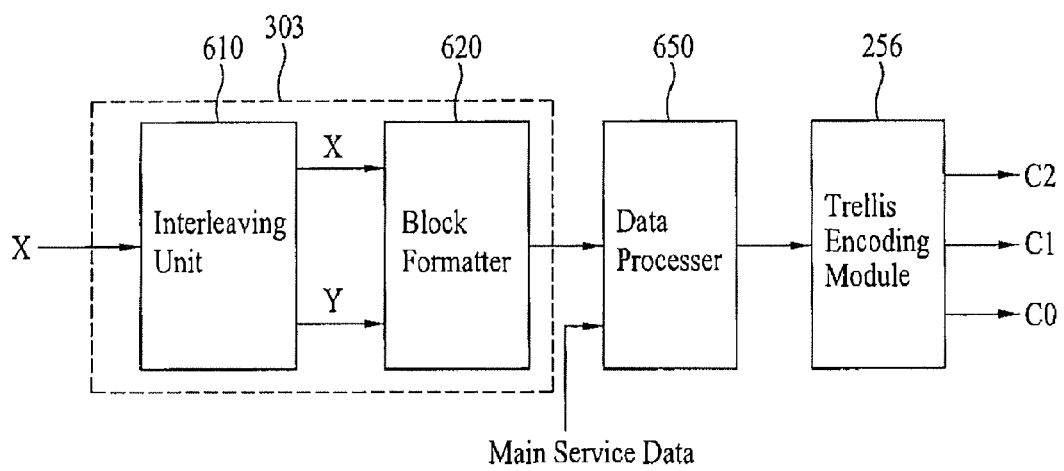
FIG. 15B is a view showing another example of the block processor and the trellis encoding module.

FIG. 15A illustrates the block processor 303 being concatenated with the trellis encoding module 256. In the transmitting system, a plurality of blocks actually exists between the pre-processor 230 including the block processor 303 and the trellis encoding module 256, as shown in FIG. 3. Conversely, the receiving system considers the pre-processor 230 to be concatenated with the trellis encoding module 256, thereby performing the decoding process accordingly. However, the data excluding the mobile service data that are being inputted to the trellis encoding module 256, wherein the mobile service data include main service data, known data, RS parity data, and MPEG header data, correspond to data that are added to the blocks existing between the block processor 303 and the trellis encoding module 256. FIG. 15B illustrates an example of a data processor 650 being positioned between the block processor 303 and the trellis encoding module 256, while taking the above-described instance into consideration.

Herein, when the interleaving unit 610 of the block processor 303 performs a ½-rate encoding process, the interleaving unit 610 may be configured as shown in FIG. 12A (or FIG. 12B). Referring to FIG. 3, for example, the data processor 650 may include a group formatter 304, a data deinterleaver 305, a packet formatter 306, a packet multiplexer 240, and a post-processor 250, wherein the post-processor 250 includes a data randomizer 251, a RS encoder/non-systematic RS encoder 252, a data interleaver 253, a parity replacer 254, and a non-systematic RS encoder 255.

At this point, the trellis encoding module 256 symbolizes the data that are being inputted so as to divide the symbolized data and to send the divided data to each trellis encoder in accordance with a pre-defined method. Herein, one byte is converted into 4 symbols, each being configured of 2 bits. Also, the symbols created from the single data byte are all transmitted to the same trellis encoder. Accordingly, each trellis encoder pre-codes an upper bit of the input symbol, which is then outputted as the uppermost output bit C2. Alternatively, each trellis encoder trellis-encodes a lower bit of the input symbol, which is then outputted as two output bits C1 and C0. The block formatter 620 is controlled so that the data byte outputted from each symbol-byte converter can be transmitted to different trellis encoders.

Hereinafter, the operation of the block formatter 620 will now be described in detail with reference to FIG. 9 to FIG. 12. Referring to FIG. 12A, for example, the data byte outputted from the symbol-byte converter 612 and the data byte outputted from the symbol-byte converter 614 are inputted to different trellis encoders of the trellis encoding module 256 in accordance with the control of the block formatter 620. Hereinafter, the data byte outputted from the symbol-byte converter 612 will be referred to as X, and the data byte outputted from the symbol-byte converter 614 will be referred to as Y, for simplicity. Referring to FIG. 13(a), each number (i.e., 0 to 11) indicates the first to twelfth trellis encoders of the trellis encoding module 256, respectively.

In addition, the output order of both symbol-byte converters are arranged (or aligned) so that the data bytes outputted from the symbol-byte converter 612 are respectively inputted to the 0th to 5th trellis encoders (0 to 5) of the trellis encoding module 256, and that the data bytes outputted from the symbol-byte converter 614 are respectively inputted to the 6th to 11th trellis encoders (6 to 11) of the trellis encoding module 256. Herein, the trellis encoders having the data bytes outputted from the symbol-byte converter 612 allocated therein, and the trellis encoders having the data bytes outputted from the symbol-byte converter 614 allocated therein are merely examples given to simplify the understanding of the present invention. Furthermore, according to an embodiment of the present invention, and assuming that the input data of the block processor 303 correspond to a block configured of 12 bytes, the symbol-byte converter 612 outputs 12 data bytes from X0 to X11, and the symbol-byte converter 614 outputs 12 data bytes from Y0 to Y11.

FIG. 13(*b*) illustrates an example of data being inputted to the trellis encoding module 256. Particularly, FIG. 13(*b*) illustrates an example of not only the mobile service data but also the main service data and RS parity data being inputted to the trellis encoding module 256, so as to be distributed to each trellis encoder. More specifically, the mobile service data outputted from the block processor 303 pass through the group formatter 304, from which the mobile service data are mixed with the main service data and RS parity data and then outputted, as shown in FIG. 13(*a*). Accordingly, each data byte is respectively inputted to the 12 trellis encoders in accordance with the positions (or places) within the data group after being data-interleaved.

Herein, when the output data bytes X and Y of the symbol-byte converters 612 and 614 are allocated to each respective trellis encoder, the input of each trellis encoder may be configured as shown in FIG. 13(*b*). More specifically, referring to FIG. 13(*b*), the six mobile service data bytes (X0 to X5) outputted from the symbol-byte converter 612 are sequentially allocated (or distributed) to the first to sixth trellis encoders (0 to 5) of the trellis encoding module 256. Also, the 2 mobile service data bytes Y0 and Y1 outputted from the symbol-byte converter 614 are sequentially allocated to the 7th and 8th trellis encoders (6 and 7) of the trellis encoding module 256. Thereafter, among the 5 main service data bytes, 4 data bytes are sequentially allocated to the 9th and 12th trellis encoders (8 to 11) of the trellis encoding module 256. Finally, the remaining 1 byte of the main service data byte is allocated once again to the first trellis encoder (0).

It is assumed that the mobile service data, the main service data, and the RS parity data are allocated to each trellis encoder, as shown in FIG. 13(*b*). It is also assumed that, as described above, the input of the block processor 303 is configured of 12 bytes, and that 12 bytes from X0 to X11 are outputted from the symbol-byte converter 612, and that 12 bytes from Y0 to Y11 are outputted from the symbol-byte converter 614. In this case, as shown in FIG. 13(*c*), the block formatter 620 arranges the data bytes that are to be outputted from the symbol-byte converters 612 and 614 by the order of X0 to X5, Y0, Y1, X6 to X10, Y2 to Y7, X11, and Y8 to Y11. More specifically, the trellis encoder that is to perform the encoding process is decided based upon the position (or place) within the transmission frame in which each data byte is inserted. At this point, not only the mobile service data but also the main service data, the MPEG header data, and the RS parity data are also inputted to the trellis encoding module 256. Herein, it is assumed that, in order to perform the above-described operation, the block formatter 620 is informed of (or knows) the information on the data group format after the data-interleaving process.

Figure 16:
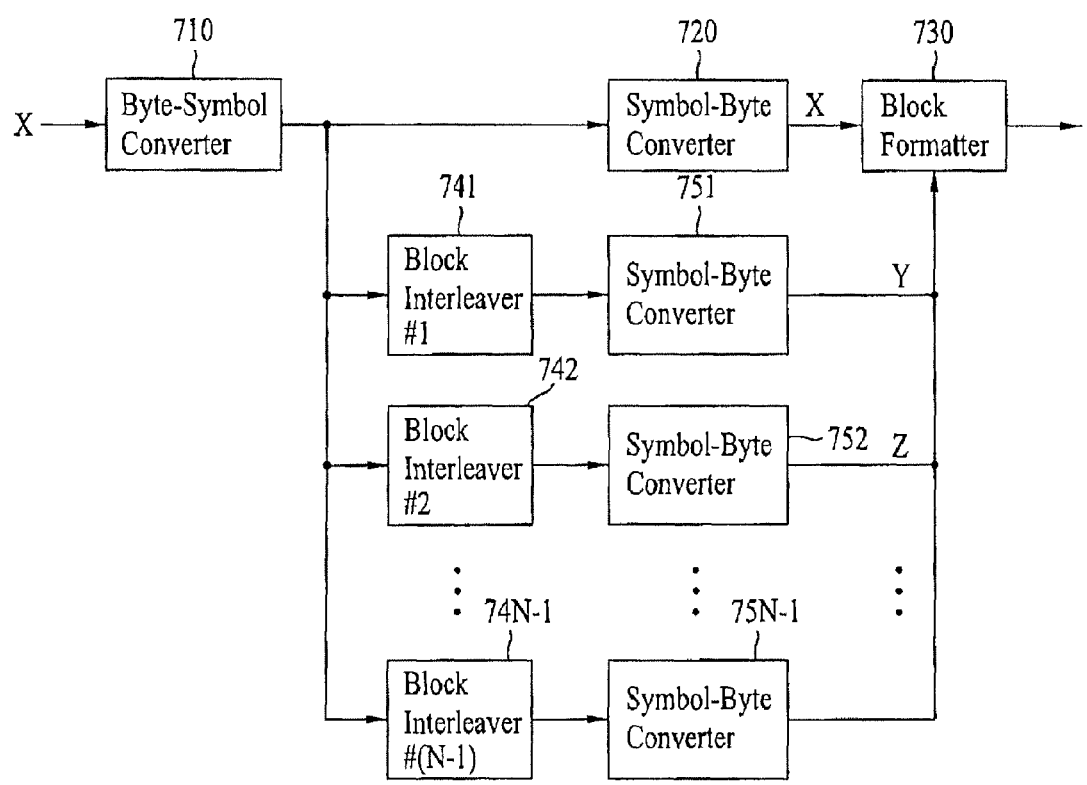
FIG. 16 is a block diagram showing an example of a block processor which performs an encoding process at a coding rate of 1/N.

FIG. 16 illustrates a block diagram of the block processor performing an encoding process at a coding rate of 1/N according to an embodiment of the present invention. Herein, the block processor includes (N−1) number of symbol interleavers 741 to 74N−1, which are configured in a parallel structure. More specifically, the block processor having the coding rate of 1/N consists of a total of N number of branches (or paths) including a branch (or path), which is directly transmitted to the block formatter 730. In addition, the symbol interleaver 741 to 74N−1 of each branch may each be configured of a different symbol interleaver. Furthermore, (N−1) number of symbol-byte converter 751 to 75N−1 each corresponding to each (N−1) number of symbol interleavers 741 to 74N−1 may be included at the end of each symbol interleaver, respectively. Herein, the output data of the (N−1) number of symbol-byte converter 751 to 75N−1 are also inputted to the block formatter 730.

In the example of the present invention, N is equal to or smaller than 12. If N is equal to 12, the block formatter 730 may align the output data so that the output byte of the 12th symbol-byte converter 75N−1 is inputted to the 12th trellis encoder. Alternatively, if N is equal to 3, the block formatter 730 may arranged the output order, so that the data bytes outputted from the symbol-byte converter 720 are inputted to the 1st to 4th trellis encoders of the trellis encoding module 256, and that the data bytes outputted from the symbol-byte converter 751 are inputted to the 5th to 8th trellis encoders, and that the data bytes outputted from the symbol-byte converter 752 are inputted to the 9th to 12th trellis encoders. At this point, the order of the data bytes outputted from each symbol-byte converter may vary in accordance with the position within the data group of the data other than the mobile service data, which are mixed with the mobile service data that are outputted from each symbol-byte converter.

Figure 17:
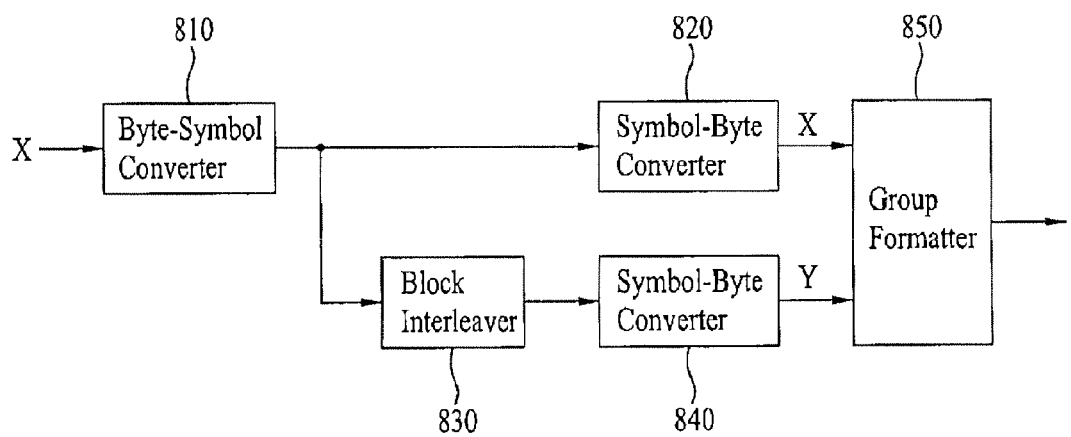
FIG. 17 is a detailed block diagram showing a block processor according to another embodiment of the present invention.

FIG. 17 illustrates a detailed block diagram showing the structure of a block processor according to another embodiment of the present invention. Herein, the block formatter is removed from the block processor so that the operation of the block formatter may be performed by a group formatter. More specifically, the block processor of FIG. 17 may include a byte-symbol converter 810, symbol-byte converters 820 and 840, and a symbol interleaver 830. In this case, the output of each symbol-byte converter 820 and 840 is inputted to the group formatter 850.

Also, the block processor may obtain a desired coding rate by adding symbol interleavers and symbol-byte converters. If the system designer wishes a coding rate of 1/N, the block processor needs to be provided with a total of N number of branches (or paths) including a branch (or path), which is directly transmitted to the block formatter 850, and (N−1) number of symbol interleavers and symbol-byte converters configured in a parallel structure with (N−1) number of branches. At this point, the group formatter 850 inserts place holders ensuring the positions (or places) for the MPEG header, the non-systematic RS parity, and the main service data. And, at the same time, the group formatter 850 positions the data bytes outputted from each branch of the block processor.

The number of trellis encoders, the number of symbol-byte converters, and the number of symbol interleavers proposed in the present invention are merely exemplary. And, therefore, the corresponding numbers do not limit the spirit or scope of the present invention. It is apparent to those skilled in the art that the type and position of each data byte being allocated to each trellis encoder of the trellis encoding module 256 may vary in accordance with the data group format. Therefore, the present invention should not be understood merely by the examples given in the description set forth herein. The mobile service data that are encoded at a coding rate of 1/N and outputted from the block processor 303 are inputted to the group formatter 304. Herein, in the example of the present invention, the order of the output data outputted from the block formatter of the block processor 303 are aligned and outputted in accordance with the position of the data bytes within the data group.

Signaling Information Processing

The transmitter 200 according to the present invention may insert transmission parameters by using a plurality of methods and in a plurality of positions (or places), which are then transmitted to the receiving system. For simplicity, the definition of a transmission parameter that is to be transmitted from the transmitter to the receiving system will now be described. The transmission parameter includes data group information, region information within a data group, the number of RS frames configuring a super frame (i.e., a super frame size (SFS)), the number of RS parity data bytes (P) for each column within the RS frame, whether or not a checksum, which is added to determine the presence of an error in a row direction within the RS frame, has been used, the type and size of the checksum if the checksum is used (presently, 2 bytes are added to the CRC), the number of data groups configuring one RS frame—since the RS frame is transmitted to one burst section, the number of data groups configuring the one RS frame is identical to the number of data groups within one burst (i.e., burst size (BS)), a turbo code mode, and a RS code mode.

Also, the transmission parameter required for receiving a burst includes a burst period—herein, one burst period corresponds to a value obtained by counting the number of fields starting from the beginning of a current burst until the beginning of a next burst, a positioning order of the RS frames that are currently being transmitted within a super frame (i.e., a permuted frame index (PFI)) or a positioning order of groups that are currently being transmitted within a RS frame (burst) (i.e., a group index (GI)), and a burst size. Depending upon the method of managing a burst, the transmission parameter also includes the number of fields remaining until the beginning of the next burst (i.e., time to next burst (TNB)). And, by transmitting such information as the transmission parameter, each data group being transmitted to the receiving system may indicate a relative distance (or number of fields) between a current position and the beginning of a next burst.

The information included in the transmission parameter corresponds to examples given to facilitate the understanding of the present invention. Therefore, the proposed examples do not limit the scope or spirit of the present invention and may be easily varied or modified by anyone skilled in the art. According to the first embodiment of the present invention, the transmission parameter may be inserted by allocating a predetermined region of the mobile service data packet or the data group. In this case, the receiving system performs synchronization and equalization on a received signal, which is then decoded by symbol units. Thereafter, the packet deformatter may separate the mobile service data and the transmission parameter so as to detect the transmission parameter. According to the first embodiment, the transmission parameter may be inserted from the group formatter 304 and then transmitted.

According to the second embodiment of the present invention, the transmission parameter may be multiplexed with another type of data. For example, when known data are multiplexed with the mobile service data, a transmission parameter may be inserted, instead of the known data, in a place (or position) where a known data byte is to be inserted. Alternatively, the transmission parameter may be mixed with the known data and then inserted in the place where the known data byte is to be inserted. According to the second embodiment, the transmission parameter may be inserted from the group formatter 304 or from the packet formatter 306 and then transmitted.

According to a third embodiment of the present invention, the transmission parameter may be inserted by allocating a portion of a reserved region within a field synchronization segment of a transmission frame. In this case, since the receiving system may perform decoding on a receiving signal by symbol units before detecting the transmission parameter, the transmission parameter having information on the processing methods of the block processor 303 and the group formatter 304 may be inserted in a reserved field of a field synchronization signal. More specifically, the receiving system obtains field synchronization by using a field synchronization segment so as to detect the transmission parameter from a pre-decided position. According to the third embodiment, the transmission parameter may be inserted from the synchronization multiplexer 240 and then transmitted.

According to the fourth embodiment of the present invention, the transmission parameter may be inserted in a layer (or hierarchical region) higher than a transport stream (TS) packet. In this case, the receiving system should be able to receive a signal and process the received signal to a layer higher than the TS packet in advance. At this point, the transmission parameter may be used to certify the transmission parameter of a currently received signal and to provide the transmission parameter of a signal that is to be received in a later process.

In the present invention, the variety of transmission parameters associated with the transmission signal may be inserted and transmitted by using the above-described methods according to the first to fourth embodiment of the present invention. At this point, the transmission parameter may be inserted and transmitted by using only one of the four embodiments described above, or by using a selection of the above-described embodiments, or by using all of the above-described embodiments. Furthermore, the information included in the transmission parameter may be duplicated and inserted in each embodiment. Alternatively, only the required information may be inserted in the corresponding position of the corresponding embodiment and then transmitted. Furthermore, in order to ensure robustness of the transmission parameter, a block encoding process of a short cycle (or period) may be performed on the transmission parameter and, then, inserted in a corresponding region. The method for performing a short-period block encoding process on the transmission parameter may include, for example, Kerdock encoding, BCH encoding, RS encoding, and repetition encoding of the transmission parameter. Also, a combination of a plurality of block encoding methods may also be performed on the transmission parameter.

The transmission parameters may be grouped to create a block code of a small size, so as to be inserted in a byte place allocated within the data group for signaling and then transmitted. However, in this case, the block code passes through the block decoded from the receiving end so as to obtain a transmission parameter value. Therefore, the transmission parameters of the turbo code mode and the RS code mode, which are required for block decoding, should first be obtained. Accordingly, the transmission parameters associated with a particular mode may be inserted in a specific section of a known data region. And, in this case, a correlation of with a symbol may be used for a faster decoding process. The receiving system refers to the correlation between each sequence and the currently received sequences, thereby determining the encoding mode and the combination mode.

Meanwhile, when the transmission parameter is inserted in the field synchronization segment region or the known data region and then transmitted, and when the transmission parameter has passed through the transmission channel, the reliability of the transmission parameter is deteriorated. Therefore, one of a plurality of pre-defined patterns may also be inserted in accordance with the corresponding transmission parameter. Herein, the receiving system performs a correlation calculation between the received signal and the pre-defined patterns so as to recognize the transmission parameter. For example, it is assumed that a burst including 5 data groups is pre-decided as pattern A based upon an agreement between the transmitting system and the receiving system. In this case, the transmitting system inserts and transmits pattern A, when the number of groups within the burst is equal to 5. Thereafter, the receiving system calculates a correlation between the received data and a plurality of reference patterns including pattern A, which was created in advance. At this point, if the correlation value between the received data and pattern A is the greatest, the received data indicates the corresponding parameter, and most particularly, the number of groups within the burst. At this point, the number of groups may be acknowledged as 5. Hereinafter, the process of inserting and transmitting the transmission parameter will now be described according to first, second, and third embodiments of the present invention.

First Embodiment

Figure 18:
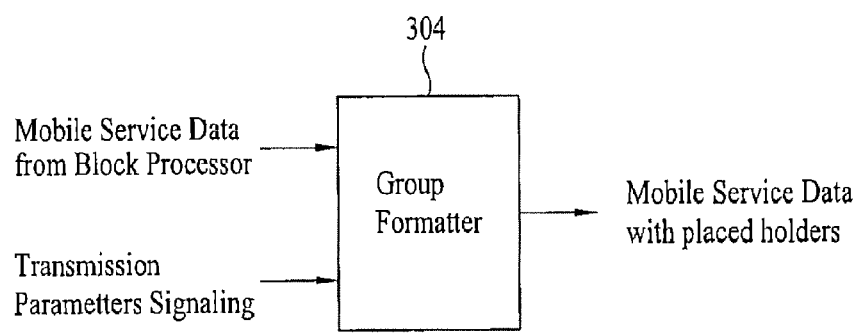
FIG. 18 is a schematic diagram of a group formatter which receives a transmission parameter and inserts the received transmission parameter in a body region of a data group.

FIG. 18 illustrates a schematic diagram of the group formatter 304 receiving the transmission parameter and inserting the received transmission parameter in region A of the data group according to the present invention. Herein, the group formatter 304 receives mobile service data from the block processor 303. Conversely, the transmission parameter is processed with at least one of a data randomizing process, a RS frame encoding process, and a block processing process, and may then be inputted to the group formatter 304. Alternatively, the transmission parameter may be directly inputted to the group formatter 304 without being processed with any of the above-mentioned processes. In addition, the transmission parameter may be provided from the service multiplexer 100. Alternatively, the transmission parameter may also be generated and provided from within the transmitter 200. The transmission parameter may also include information required by the receiving system in order to receive and process the data included in the data group. For example, the transmission parameter may include data group information, and multiplexing information.

The group formatter 304 inserts the mobile service data and transmission parameter which are to be inputted to corresponding regions within the data group in accordance with a rule for configuring a data group. For example, the transmission parameter passes through a block encoding process of a short period and is, then, inserted in region A of the data group. Particularly, the transmission parameter may be inserted in a pre-arranged and arbitrary position (or place) within region A. If it is assumed that the transmission parameter has been block encoded by the block processor 303, the block processor 303 performs the same data processing operation as the mobile service data, more specifically, either a ½-rate encoding or ¼-rate encoding process on the signaling information including the transmission parameter. Thereafter, the block processor 303 outputs the processed transmission parameter to the group formatter 304. Thereafter, the signaling information is also recognized as the mobile service data and processed accordingly.

Figure 19:
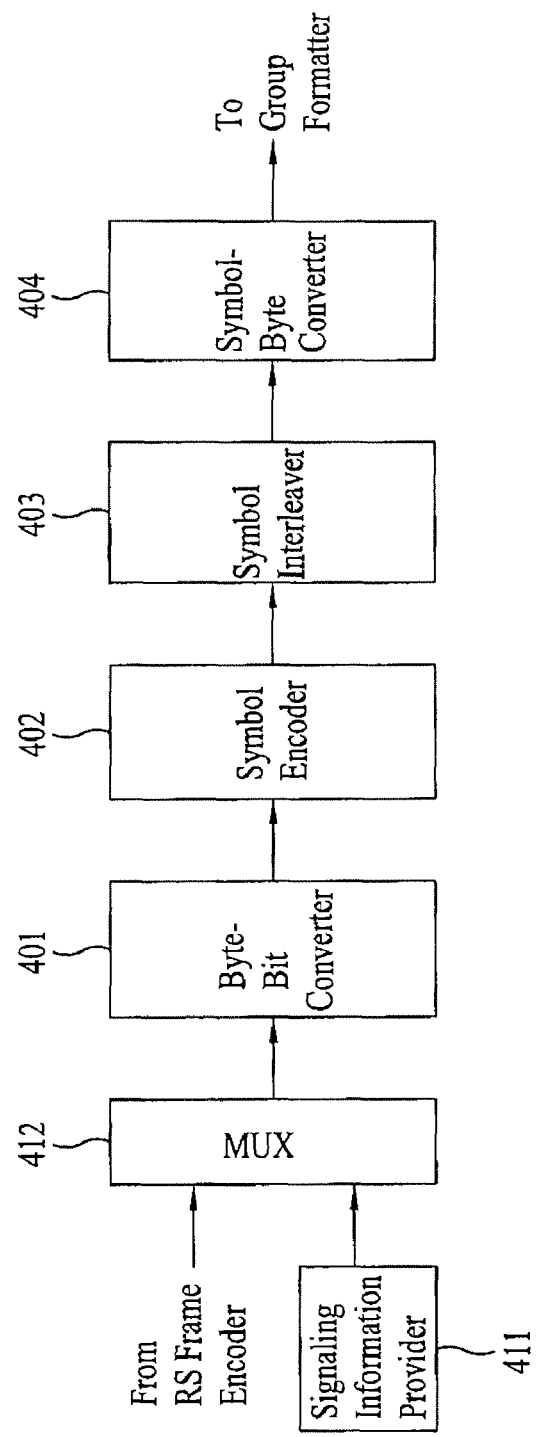
FIG. 19 is a block diagram showing an example of the block processor which receives the transmission parameter and processes the received transmission parameter by the same process as the mobile service data.

FIG. 19 illustrates a block diagram showing an example of the block processor receiving the transmission parameter and processing the received transmission parameter with the same process as the mobile service data. Particularly, FIG. 19 illustrates an example showing the structure of FIG. 9 further including a signaling information provider 411 and multiplexer 412. More specifically, the signaling information provider 411 outputs the signaling information including the transmission parameter to the multiplexer 412. The multiplexer 412 multiplexes the signaling information and the output of the RS frame encoder 302. Then, the multiplexer 412 outputs the multiplexed data to the byte-bit converter 401.

The byte-bit converter 401 divides the mobile service data bytes or signaling information byte outputted from the multiplexer 412 into bits, which are then outputted to the symbol encoder 402. The subsequent operations are identical to those described in FIG. 9. Therefore, a detailed description of the same will be omitted for simplicity. If any of the detailed structures of the block processor 303 shown in FIG. 12, FIG. 15, FIG. 16, and FIG. 17, the signaling information provider 411 and the multiplexer 412 may be provided behind the byte-symbol converter.

Second Embodiment

Meanwhile, when known data generated from the group formatter in accordance with a pre-decided rule are inserted in a corresponding region within the data group, a transmission parameter may be inserted in at least a portion of a region, where known data may be inserted, instead of the known data. For example, when a long known data sequence is inserted at the beginning of region A within the data group, a transmission parameter may be inserted in at least a portion of the beginning of region A instead of the known data. A portion of the known data sequence that is inserted in the remaining portion of region A, excluding the portion in which the transmission parameter is inserted, may be used to detect a starting point of the data group by the receiving system. Alternatively, another portion of region A may be used for channel equalization by the receiving system.

In addition, when the transmission parameter is inserted in the known data region instead of the actual known data. The transmission parameter may be block encoded in short periods and then inserted. Also, as described above, the transmission parameter may also be inserted based upon a pre-defined pattern in accordance with the transmission parameter. If the group formatter 304 inserts known data place holders in a region within the data group, wherein known data may be inserted, instead of the actual known data, the transmission parameter may be inserted by the packet formatter 306. More specifically, when the group formatter 304 inserts the known data place holders, the packet formatter 306 may insert the known data instead of the known data place holders. Alternatively, when the group formatter 304 inserts the known data, the known data may be directly outputted without modification.

Figure 20:
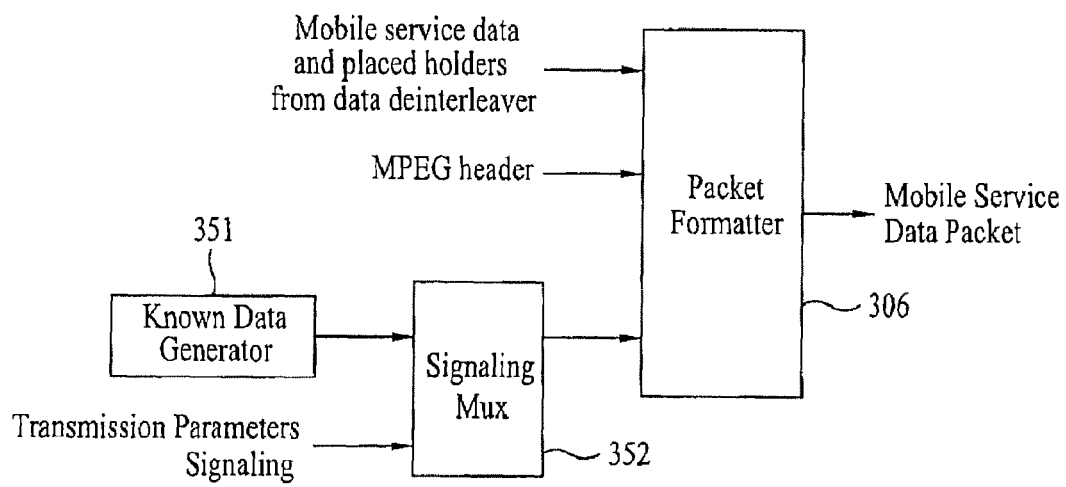
FIG. 20 is a block diagram showing the structure of a packet formatter which is expanded so that the packet formatter can insert the transmission parameter.

FIG. 20 illustrates a block diagram showing the structure of a packet formatter 306 being expanded so that the packet formatter 306 can insert the transmission parameter according to an embodiment of the present invention. More specifically, the structure of the packet formatter 306 further includes a known data generator 351 and a signaling multiplexer 352. Herein, the transmission parameter that is inputted to the signaling multiplexer 352 may include information on the length of a current burst, information indicating a starting point of a next burst, positions in which the groups within the burst exist and the lengths of the groups, information on the time from the current group and the next group within the burst, and information on known data.

The signaling multiplexer 352 selects one of the transmission parameter and the known data generated from the known data generator 351 and, then, outputs the selected data to the packet formatter 306. The packet formatter 306 inserts the known data or transmission parameter outputted from the signaling multiplexer 352 into the known data place holders outputted from the data interleaver 305. Then, the packet formatter 306 outputs the processed data. More specifically, the packet formatter 306 inserts a transmission parameter in at least a portion of the known data region instead of the known data, which is then outputted. For example, when a known data place holder is inserted at a beginning portion of region A within the data group, a transmission parameter may be inserted in a portion of the known data place holder instead of the actual known data.

Also, when the transmission parameter is inserted in the known data place holder instead of the known data, the transmission parameter may be block encoded in short periods and inserted. Alternatively, a pre-defined pattern may be inserted in accordance with the transmission parameter. More specifically, the signaling multiplexer 352 multiplexes the known data and the transmission parameter (or the pattern defined by the transmission parameter) so as to configure a new known data sequence. Then, the signaling multiplexer 352 outputs the newly configured known data sequence to the packet formatter 306. The packet formatter 306 deletes the main service data place holder and RS parity place holder from the output of the data interleaver 305, and creates a mobile service data packet of 188 bytes by using the mobile service data, MPEG header, and the output of the signaling multiplexer. Then, the packet formatter 306 outputs the newly created mobile service data packet to the packet multiplexer 240.

In this case, the region A of each data group has a different known data pattern. Therefore, the receiving system separates only the symbol in a pre-arranged section of the known data sequence and recognizes the separated symbol as the transmission parameter. Herein, depending upon the design of the transmitting system, the known data may be inserted in different blocks, such as the packet formatter 306, the group formatter 304, or the block processor 303. Therefore, a transmission parameter may be inserted instead of the known data in the block wherein the known data are to be inserted.

According to the second embodiment of the present invention, a transmission parameter including information on the processing method of the block processor 303 may be inserted in a portion of the known data region and then transmitted. In this case, a symbol processing method and position of the symbol for the actual transmission parameter symbol are already decided. Also, the position of the transmission parameter symbol should be positioned so as to be transmitted or received earlier than any other data symbols that are to be decoded. Accordingly, the receiving system may detect the transmission symbol before the data symbol decoding process, so as to use the detected transmission symbol for the decoding process.

Third Embodiment

Figure 21:
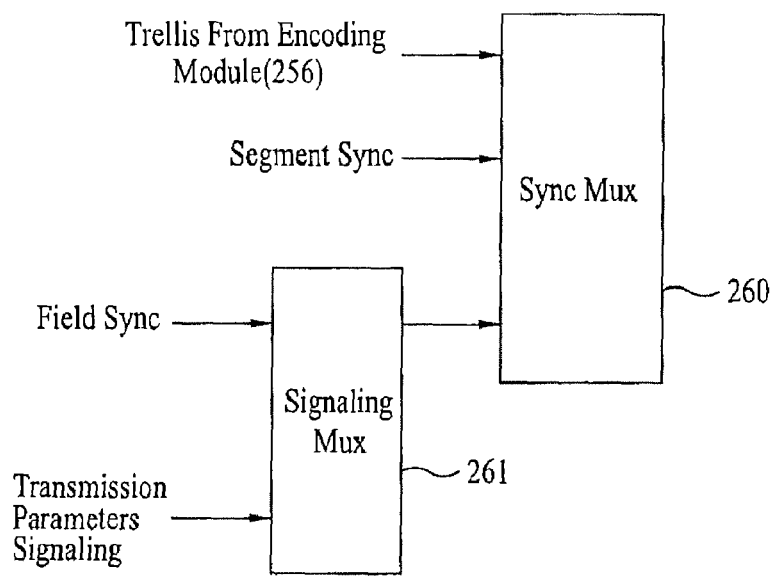
FIG. 21 is a block diagram showing a synchronization multiplexer which is expanded in order to allow a transmission parameter to be inserted in a field synchronization segment region.

Meanwhile, the transmission parameter may also be inserted in the field synchronization segment region and then transmitted. FIG. 21 illustrates a block diagram showing the synchronization multiplexer being expanded in order to allow the transmission parameter to be inserted in the field synchronization segment region. Herein, a signaling multiplexer 261 is further included in the synchronization multiplexer 260. The transmission parameter of the general VSB method is configured of 2 fields. More specifically, each field is configured of one field synchronization segment and 312 data segments. Herein, the first symbols of a data segment correspond to the segment synchronization portion, and the first data segment of each field corresponds to the field synchronization portion.

One field synchronization signal is configured to have the length of one data segment. The data segment synchronization pattern exists in the first 4 symbols, which are then followed by pseudo random sequences PN 511, PN 63, PN 63, and PN 63. The next symbols include information associated with the VSB mode. Additionally, the 24 symbols that include information associated with the VSB mode are followed by the remaining 104 symbols, which are reserved symbols. Herein, the last 12 symbols of a previous segment are copied and positioned as the last 12 symbols in the reserved region. In other words, only the 92 symbols in the field synchronization segment are the symbols that correspond to the actual reserved region.

Therefore, the signaling multiplexer 261 multiplexes the transmission parameter with an already-existing field synchronization segment symbol, so that the transmission parameter can be inserted in the reserved region of the field synchronization segment. Then, the signaling multiplexer 261 outputs the multiplexed transmission parameter to the synchronization multiplexer 260. The synchronization multiplexer 260 multiplexes the segment synchronization symbol, the data symbols, and the new field synchronization segment outputted from the signaling multiplexer 261, thereby configuring a new transmission frame. The transmission frame including the field synchronization segment, wherein the transmission parameter is inserted, is outputted to the transmission unit 270. At this point, the reserved region within the field synchronization segment for inserting the transmission parameter may correspond to a portion of or the entire 92 symbols of the reserved region. Herein, the transmission parameter being inserted in the reserved region may, for example, include information identifying the transmission parameter as the main service data, the mobile service data, or a different type of mobile service data.

If the information on the processing method of the block processor 303 is transmitted as a portion of the transmission parameter, and when the receiving system wishes to perform a decoding process corresponding to the block processor 303, the receiving system should be informed of such information on the block processing method in order to perform the decoding process. Therefore, the information on the processing method of the block processor 303 should already be known prior to the block decoding process. Accordingly, as described in the third embodiment of the present invention, when the transmission parameter having the information on the processing method of the block processor 303 (and/or the group formatter 304) is inserted in the reserved region of the field synchronization signal and then transmitted, the receiving system is capable of detecting the transmission parameter prior to performing the block decoding process on the received signal.

Receiving System

Figure 22:
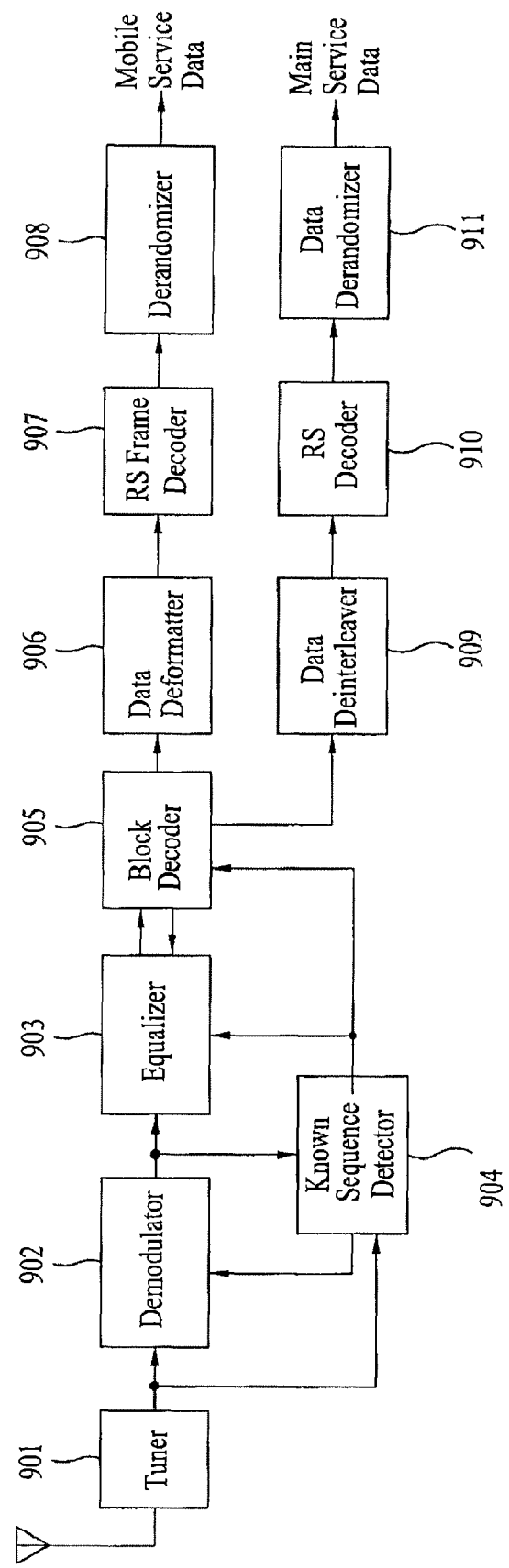
FIG. 22 is a block diagram showing a structure of a digital broadcast receiving system according to an embodiment of the present invention.

FIG. 22 illustrates a block diagram showing a structure of a digital broadcast receiving system according to the present invention. The digital broadcast receiving system of FIG. 22 uses known data information, which is inserted in the mobile service data section and, then, transmitted by the transmitting system, so as to perform carrier synchronization recovery, frame synchronization recovery, and channel equalization, thereby enhancing the receiving performance. Referring to FIG. 22, the digital broadcast receiving system includes a tuner 901, a demodulator 902, an equalizer 903, a known data detector 904, a block decoder 905, a data deformatter 906, a RS frame decoder 907, a derandomizer 908, a data deinterleaver 909, a RS decoder 910, and a data derandomizer 911. Herein, for simplicity of the description of the present invention, the data deformatter 906, the RS frame decoder 907, and the derandomizer 908 will be collectively referred to as a mobile service data processing unit. And, the data deinterleaver 909, the RS decoder 910, and the data derandomizer 911 will be collectively referred to as a main service data processing unit.

More specifically, the tuner 901 tunes a frequency of a particular channel and down-converts the tuned frequency to an intermediate frequency (IF) signal. Then, the tuner 901 outputs the down-converted IF signal to the demodulator 902 and the known data detector 904. The demodulator 902 performs self gain control, carrier recovery, and timing recovery processes on the inputted IF signal, thereby modifying the IF signal to a baseband signal. Then, the demodulator 902 outputs the newly created baseband signal to the equalizer 903 and the known data detector 904. The equalizer 903 compensates the distortion of the channel included in the demodulated signal and then outputs the error-compensated signal to the block decoder 905.

At this point, the known data detector 904 detects the known sequence place inserted by the transmitting end from the input/output data of the demodulator 902 (i.e., the data prior to the demodulation process or the data after the demodulation process). Thereafter, the place information along with the symbol sequence of the known data, which are generated from the detected place, is outputted to the demodulator 902 and the equalizer 903. Also, the known data detector 904 outputs a set of information to the block decoder 905. This set of information is used to allow the block decoder 905 of the receiving system to identify the mobile service data that are processed with additional encoding from the transmitting system and the main service data that are not processed with additional encoding. In addition, although the connection status is not shown in FIG. 22, the information detected from the known data detector 904 may be used throughout the entire receiving system and may also be used in the data deformatter 906 and the RS frame decoder 907. The demodulator 902 uses the known data symbol sequence during the timing and/or carrier recovery, thereby enhancing the demodulating performance. Similarly, the equalizer 903 uses the known data so as to enhance the equalizing performance. Moreover, the decoding result of the block decoder 905 may be fed-back to the equalizer 903, thereby enhancing the equalizing performance.

The equalizer 903 may perform channel equalization by using a plurality of methods. An example of estimating a channel impulse response (CIR) so as to perform channel equalization will be given in the description of the present invention. Most particularly, an example of estimating the CIR in accordance with each region within the data group, which is hierarchically divided and transmitted from the transmitting system, and applying each CIR differently will also be described herein. Furthermore, by using the known data, the place and contents of which is known in accordance with an agreement between the transmitting system and the receiving system, and the field synchronization data, so as to estimate the CIR, the present invention may be able to perform channel equalization with more stability.

Herein, the data group that is inputted for the equalization process is divided into regions A to C, as shown in FIG. 6A. More specifically, in the example of the present invention, each region A, B, and C are further divided into regions A1 to A5, regions B1 and B2, and regions C1 to C3, respectively. Referring to FIG. 6A, the CIR that is estimated from the field synchronization data in the data structure is referred to as CIR_FS. Alternatively, the CIRs that are estimated from each of the 5 known data sequences existing in region A are sequentially referred to as CIR_N0, CIR_N1, CIR_N2, CIR_N3, and CIR_N4.

As described above, the present invention uses the CIR estimated from the field synchronization data and the known data sequences in order to perform channel equalization on data within the data group. At this point, each of the estimated CIRs may be directly used in accordance with the characteristics of each region within the data group. Alternatively, a plurality of the estimated CIRs may also be either interpolated or extrapolated so as to create a new CIR, which is then used for the channel equalization process.

Herein, when a value F(A) of a function F(x) at a particular point A and a value F(B) of the function F(x) at another particular point B are known, interpolation refers to estimating a function value of a point within the section between points A and B. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value F(A) of a function F(x) at a particular point A and a value F(B) of the function F(x) at another particular point B are known, extrapolation refers to estimating a function value of a point outside of the section between points A and B. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

More specifically, in case of region C1, any one of the CIR_N4 estimated from a previous data group, the CIR_FS estimated from the current data group that is to be processed with channel equalization, and a new CIR generated by extrapolating the CIR_FS of the current data group and the CIR_N0 may be used to perform channel equalization. Alternatively, in case of region B1, a variety of methods may be applied as described in the case for region C1. For example, a new CIR created by linearly extrapolating the CIR_FS estimated from the current data group and the CIR_N0 may be used to perform channel equalization. Also, the CIR_FS estimated from the current data group may also be used to perform channel equalization. Finally, in case of region A1, a new CIR may be created by interpolating the CIR_FS estimated from the current data group and CIR_N0, which is then used to perform channel equalization. Furthermore, any one of the CIR_FS estimated from the current data group and CIR_N0 may be used to perform channel equalization.

In case of regions A2 to A5, CIR_N(i−1) estimated from the current data group and CIR_N(i) may be interpolated to create a new CIR and use the newly created CIR to perform channel equalization. Also, any one of the CIR_N(i−1) estimated from the current data group and the CIR_N(i) may be used to perform channel equalization. Alternatively, in case of regions B2, C2, and C3, CIR_N3 and CIR_N4 both estimated from the current data group may be extrapolated to create a new CIR, which is then used to perform the channel equalization process. Furthermore, the CIR_N4 estimated from the current data group may be used to perform the channel equalization process. Accordingly, an optimum performance may be obtained when performing channel equalization on the data inserted in the data group. The methods of obtaining the CIRs required for performing the channel equalization process in each region within the data group, as described above, are merely examples given to facilitate the understanding of the present invention. A wider range of methods may also be used herein. And, therefore, the present invention will not only be limited to the examples given in the description set forth herein.

Meanwhile, if the data being inputted to the block decoder 905 after being channel equalized from the equalizer 903 correspond to the mobile service data having additional encoding and trellis encoding performed thereon by the transmitting system, trellis decoding and additional decoding processes are performed on the inputted data as inverse processes of the transmitting system. Alternatively, if the data being inputted to the block decoder 905 correspond to the main service data having only trellis encoding performed thereon, and not the additional encoding, only the trellis decoding process is performed on the inputted data as the inverse process of the transmitting system.

The data group decoded by the block decoder 905 is inputted to the data deformatter 906, and the main service data are inputted to the data deinterleaver 909. According to another embodiment, the main data may also bypass the block decoder 905 so as to be directly inputted to the data deinterleaver 909. In this case, a trellis decoder for the main service data should be provided before the data deinterleaver 909. When the block decoder 905 outputs the data group to the data deformatter 906, the known data, trellis initialization data, and MPEG header, which are inserted in the data group, and the RS parity, which is added by the RS encoder/non-systematic RS encoder or non-systematic RS encoder of the transmitting system, are removed. Then, the processed data are outputted to the data deformatter 906. Herein, the removal of the data may be performed before the block decoding process, or may be performed during or after the block decoding process. If the transmitting system includes signaling information in the data group upon transmission, the signaling information is outputted to the data deformatter 906.

More specifically, if the inputted data correspond to the main service data, the block decoder 905 performs Viterbi decoding on the inputted data so as to output a hard decision value or to perform a hard-decision on a soft decision value, thereby outputting the result. Meanwhile, if the inputted data correspond to the mobile service data, the block decoder 905 outputs a hard decision value or a soft decision value with respect to the inputted mobile service data. In other words, if the inputted data correspond to the mobile service data, the block decoder 905 performs a decoding process on the data encoded by the block processor and trellis encoding module of the transmitting system.

At this point, the RS frame encoder of the pre-processor included in the transmitting system may be viewed as an external code. And, the block processor and the trellis encoder may be viewed as an internal code. In order to maximize the performance of the external code when decoding such concatenated codes, the decoder of the internal code should output a soft decision value. Therefore, the block decoder 905 may output a hard decision value on the mobile service data. However, when required, it may be more preferable for the block decoder 905 to output a soft decision value.

Meanwhile, the data deinterleaver 909, the RS decoder 910, and the derandomizer 911 are blocks required for receiving the main service data. Therefore, the above-mentioned blocks may not be required in the structure of a digital broadcast receiving system that only receives the mobile service data. The data deinterleaver 909 performs an inverse process of the data interleaver included in the transmitting system. In other words, the data deinterleaver 909 deinterleaves the main service data outputted from the block decoder 905 and outputs the deinterleaved main service data to the RS decoder 910. The RS decoder 910 performs a systematic RS decoding process on the deinterleaved data and outputs the processed data to the derandomizer 911. The derandomizer 911 receives the output of the RS decoder 910 and generates a pseudo random data byte identical to that of the randomizer included in the digital broadcast transmitting system. Thereafter, the derandomizer 911 performs a bitwise exclusive OR (XOR) operation on the generated pseudo random data byte, thereby inserting the MPEG synchronization bytes to the beginning of each packet so as to output the data in 188-byte main service data packet units.

Meanwhile, the data being outputted from the block decoder 905 to the data deformatter 906 are inputted in the form of a data group. At this point, the data deformatter 906 already knows the structure of the data that are to be inputted and is, therefore, capable of identifying the signaling information, which includes the system information, and the mobile service data from the data group. Thereafter, the data deformatter 906 outputs the identified signaling information to a block for processing signaling information (not shown) and outputs the identified mobile service data to the RS frame decoder 907. More specifically, the RS frame decoder 907 receives only the RS encoded and CRC encoded mobile service data that are transmitted from the data deformatter 906.

The RS frame encoder 907 performs an inverse process of the RS frame encoder included in the transmitting system so as to correct the error within the RS frame. Then, the RS frame decoder 907 adds the 1-byte MPEG synchronization service data packet, which had been removed during the RS frame encoding process, to the error-corrected mobile service data packet. Thereafter, the processed data packet is outputted to the derandomizer 908. The operation of the RS frame decoder 907 will be described in detail in a later process. The derandomizer 908 performs a derandomizing process, which corresponds to the inverse process of the randomizer included in the transmitting system, on the received mobile service data. Thereafter, the derandomized data are outputted, thereby obtaining the mobile service data transmitted from the transmitting system. Hereinafter, detailed operations of the RS frame decoder 907 will now be described.

Figure 23:
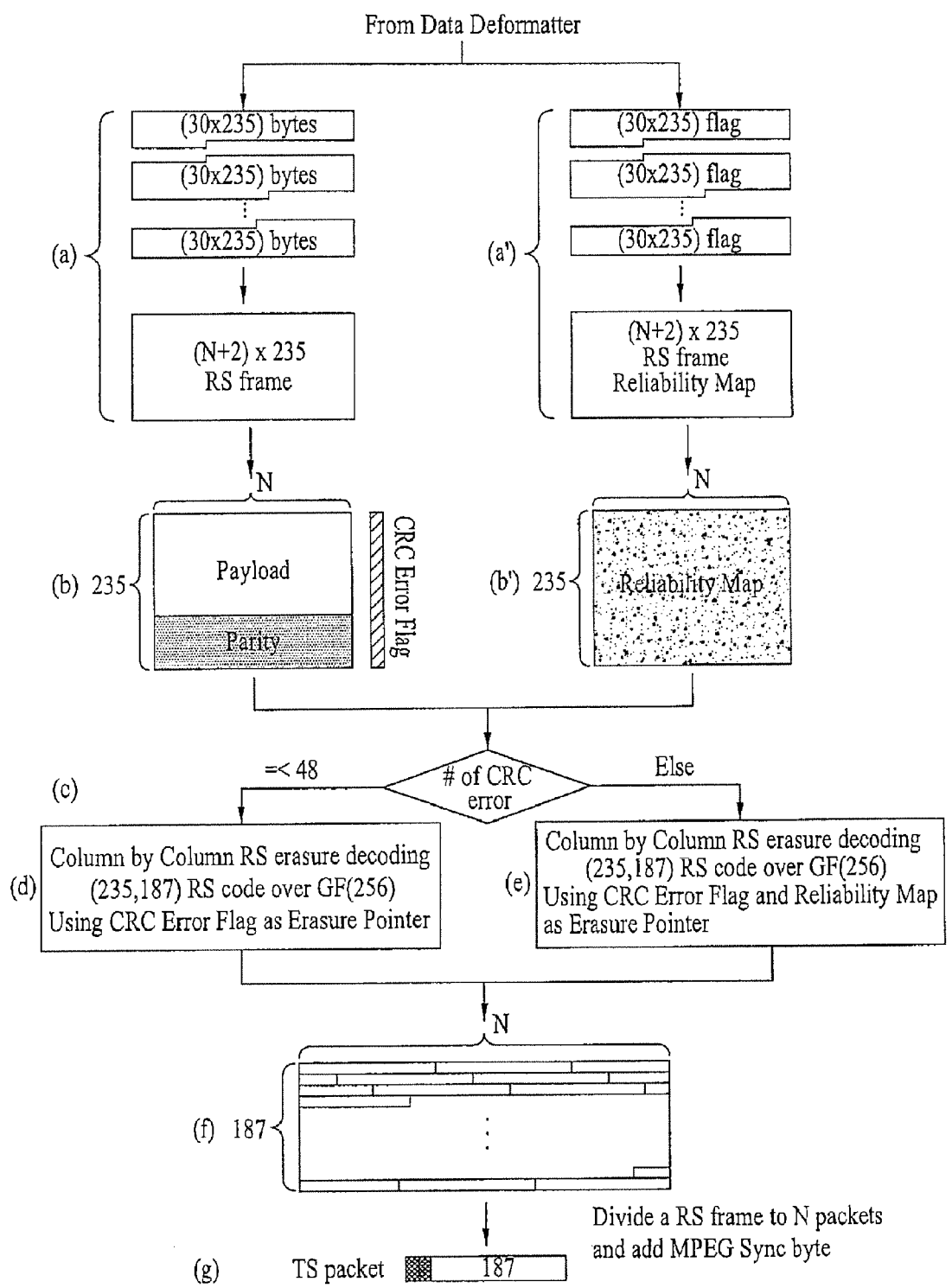
FIG. 23 is a view showing an error correction decoding process of an RS frame decoder.

FIG. 23 illustrates a series of exemplary step of an error correction decoding process of the RS frame decoder 907 according to the present invention. More specifically, the RS frame decoder 907 groups mobile service data bytes received from the data deformatter 906 so as to configure an RS frame. The mobile service data correspond to data RS encoded and CRC encoded from the transmitting system. FIG. 23($a$) illustrates an example of configuring the RS frame. More specifically, the transmitting system divided the RS frame having the size of (N+2)*235 to 30*235 byte blocks. When it is assumed that each of the divided mobile service data byte blocks is inserted in each data group and then transmitted, the receiving system also groups the 30*235 mobile service data byte blocks respectively inserted in each data group, thereby configuring an RS frame having the size of (N+2)*235. For example, when it is assumed that an RS frame is divided into 18 30*235 byte blocks and transmitted from a burst section, the receiving system also groups the mobile service data bytes of 18 data groups within the corresponding burst section, so as to configure the RS frame. Furthermore, when it is assumed that N is equal to 538 (i.e., N=538), the RS frame decoder 907 may group the mobile service data bytes within the 18 data groups included in a burst so as to configure a RS frame having the size of 540*235 bytes.

Herein, when it is assumed that the block decoder 905 outputs a soft decision value for the decoding result, the RS frame decoder 907 may decide the '0' and '1' of the corresponding bit by using the codes of the soft decision value. 8 bits that are each decided as described above are grouped to create 1 data byte. If the above-described process is performed on all soft decision values of the 18 data groups included in a single burst, the RS frame having the size of 540*235 bytes may be configured. Additionally, the present invention uses the soft decision value not only to configure the RS frame but also to configure a reliability map. Herein, the reliability map indicates the reliability of the corresponding data byte, which is configured by grouping 8 bits, the 8 bits being decided by the codes of the soft decision value.

For example, when the absolute value of the soft decision value exceeds a pre-determined threshold value, the value of the corresponding bit, which is decided by the code of the corresponding soft decision value, is determined to be reliable. Conversely, when the absolute value of the soft decision value does not exceed the pre-determined threshold value, the value of the corresponding bit is determined to be unreliable. Thereafter, if even a single bit among the 8 bits, which are decided by the codes of the soft decision value and group to configure 1 data byte, is determined to be unreliable, the corresponding data byte is marked on the reliability map as an unreliable data byte.

Herein, determining the reliability of 1 data byte is only exemplary. More specifically, when a plurality of data bytes (e.g., at least 4 data bytes) are determined to be unreliable, the corresponding data bytes may also be marked as unreliable data bytes within the reliability map. Conversely, when all of the data bits within the 1 data byte are determined to be reliable (i.e., when the absolute value of the soft decision values of all bits included in the 1 data byte exceed the predetermined threshold value), the corresponding data byte is marked to be a reliable data byte on the reliability map. Similarly, when a plurality of data bytes (e.g., at least 4 data bytes) are determined to be reliable, the corresponding data bytes may also be marked as reliable data bytes within the reliability map. The numbers proposed in the above-described example are merely exemplary and, therefore, do not limit the scope or spirit of the present invention.

The process of configuring the RS frame and the process of configuring the reliability map both using the soft decision value may be performed at the same time. Herein, the reliability information within the reliability map is in a one-to-one correspondence with each byte within the RS frame. For example, if a RS frame has the size of 540*235 bytes, the reliability map is also configured to have the size of 540*235 bytes. FIG. 23(*a*') illustrates the process steps of configuring the reliability map according to the present invention. Meanwhile, if a RS frame is configured to have the size of (N+2)*235 bytes, the RS frame decoder 907 performs a CRC syndrome checking process on the corresponding RS frame, thereby verifying whether any error has occurred in each row. Subsequently, as shown in FIG. 23(*b*), a 2-byte checksum is removed to configure an RS frame having the size of N*235 bytes. Herein, the presence (or existence) of an error is indicated on an error flag corresponding to each row. Similarly, since the portion of the reliability map corresponding to the CRC checksum has hardly any applicability, this portion is removed so that only N*235 number of the reliability information bytes remain, as shown in FIG. 23(*b*').

After performing the CRC syndrome checking process, the RS frame decoder 907 performs RS decoding in a column direction. Herein, a RS erasure correction process may be performed in accordance with the number of CRC error flags. More specifically, as shown in FIG. 23(*c*), the CRC error flag corresponding to each row within the RS frame is verified. Thereafter, the RS frame decoder 907 determines whether the number of rows having a CRC error occurring therein is equal to or smaller than the maximum number of errors on which the RS erasure correction may be performed, when performing the RS decoding process in a column direction. The maximum number of errors corresponds to a number of parity bytes inserted when performing the RS encoding process. In the embodiment of the present invention, it is assumed that 48 parity bytes have been added to each column.

If the number of rows having the CRC errors occurring therein is smaller than or equal to the maximum number of errors (i.e., 48 errors according to this embodiment) that can be corrected by the RS erasure decoding process, a (235,187)-RS erasure decoding process is performed in a column direction on the RS frame having 235 N-byte rows, as shown in FIG. 23(*d*). Thereafter, as shown in FIG. 23(*f*), the 48-byte parity data that have been added at the end of each column are removed. Conversely, however, if the number of rows having the CRC errors occurring therein is greater than the maximum number of errors (i.e., 48 errors) that can be corrected by the RS erasure decoding process, the RS erasure decoding process cannot be performed. In this case, the error may be corrected by performing a general RS decoding process. In addition, the reliability map, which has been created based upon the soft decision value along with the RS frame, may be used to further enhance the error correction ability (or performance) of the present invention.

More specifically, the RS frame decoder 907 compares the absolute value of the soft decision value of the block decoder 905 with the pre-determined threshold value, so as to determine the reliability of the bit value decided by the code of the corresponding soft decision value. Also, 8 bits, each being determined by the code of the soft decision value, are grouped to form 1 data byte. Accordingly, the reliability information on this 1 data byte is indicated on the reliability map. Therefore, as shown in FIG. 23(*e*), even though a particular row is determined to have an error occurring therein based upon a CRC syndrome checking process on the particular row, the present invention does not assume that all bytes included in the row have errors occurring therein. The present invention refers to the reliability information of the reliability map and sets only the bytes that have been determined to be unreliable as erroneous bytes. In other words, with disregard to whether or not a CRC error exists within the corresponding row, only the bytes that are determined to be unreliable based upon the reliability map are set as erasure points.

According to another method, when it is determined that CRC errors are included in the corresponding row, based upon the result of the CRC syndrome checking result, only the bytes that are determined by the reliability map to be unreliable are set as errors. More specifically, only the bytes corresponding to the row that is determined to have errors included therein and being determined to be unreliable based upon the reliability information, are set as the erasure points. Thereafter, if the number of error points for each column is smaller than or equal to the maximum number of errors (i.e., 48 errors) that can be corrected by the RS erasure decoding process, an RS erasure decoding process is performed on the corresponding column. Conversely, if the number of error points for each column is greater than the maximum number of errors (i.e., 48 errors) that can be corrected by the RS erasure decoding process, a general decoding process is performed on the corresponding column.

More specifically, if the number of rows having CRC errors included therein is greater than the maximum number of errors (i.e., 48 errors) that can be corrected by the RS erasure decoding process, either an RS erasure decoding process or a general RS decoding process is performed on a column that is decided based upon the reliability information of the reliability map, in accordance with the number of erasure points within the corresponding column. For example, it is assumed that the number of rows having CRC errors included therein within the RS frame is greater than 48. And, it is also assumed that the number of erasure points decided based upon the reliability information of the reliability map is indicated as 40 erasure points in the first column and as 50 erasure points in the second column. In this case, a (235,187)-RS erasure decoding process is performed on the first column. Alternatively, a (235,187)-RS decoding process is performed on the second column. When error correction decoding is performed on all column directions within the RS frame by using the above-described process, the 48-byte parity data which were added at the end of each column are removed, as shown in FIG. 23(f).

As described above, even though the total number of CRC errors corresponding to each row within the RS frame is greater than the maximum number of errors that can be corrected by the RS erasure decoding process, when the number of bytes determined to have a low reliability level, based upon the reliability information on the reliability map within a particular column, while performing error correction decoding on the particular column. Herein, the difference between the general RS decoding process and the RS erasure decoding process is the number of errors that can be corrected. More specifically, when performing the general RS decoding process, the number of errors corresponding to half of the number of parity bytes (i.e., (number of parity bytes)/2) that are inserted during the RS encoding process may be error corrected (e.g., 24 errors may be corrected). Alternatively, when performing the RS erasure decoding process, the number of errors corresponding to the number of parity bytes that are inserted during the RS encoding process may be error corrected (e.g., 48 errors may be corrected).

After performing the error correction decoding process, as described above, a RS frame configured of 187 N-byte rows (or packets) may be obtained, as shown in FIG. 23(f). Furthermore, the RS frame having the size of N*187 bytes is sequentially outputted in N number of 187-byte units. Herein, as shown in FIG. 23(g), the 1-byte MPEG synchronization byte that was removed by the transmitting system is added at the end of each 187-byte packet, thereby outputting 188-byte mobile service data packets.

As described above, the digital broadcasting system and the data processing method according to the present invention have the following advantages. More specifically, the digital broadcasting receiving system and method according to the present invention is highly protected against (or resistant to) any error that may occur when transmitting mobile service data through a channel. And, the present invention is also highly compatible to the conventional receiving system. Moreover, the present invention may also receive the mobile service data without any error even in channels having severe ghost effect and noise.

Additionally, by inserting known data in a particular position (or place) within a data region and transmitting the processed data, the receiving performance of the receiving system may be enhanced even in a channel environment that is liable to frequent changes. Also, by multiplexing mobile service data with main service data into a burst structure, the power consumption of the receiving system may be reduced. Furthermore, the present invention is even more effective when applied to mobile and portable receivers, which are also liable to a frequent change in channel and which require protection (or resistance) against intense noise.

Hereinafter, an example of transmitting/receiving multiplexing information for the main service data and the mobile service data in the case where the main service data and the mobile service data are multiplexed and the multiplexed data is transmitted in the broadcast transmitting/receiving system will be described. The multiplexing information may be provided to the receiver in the form of a table including at least one section and, hereinafter, will be referred to as program table information. For example, program specific information (PSI)/program and system information protocol (PSIP) may become the program table information. Hereinafter, a fixed reception channel indicates a channel which can allow the broadcasting system to transmit/receive the main service data and a mobile reception channel indicates a channel which can allow the broadcasting system to transmit/receive the mobile service data.

In the case where the main service data and the mobile service data are multiplexed and the multiplexed data is transmitted, program table information of the main service data and program table information of the mobile service data may be respectively multiplexed with the main service data and the mobile service data by the same packet identifier and the multiplexed data may be transmitted. That is, the program table information including multiplexing information for the main service data and the mobile service data is multiplexed with the main service data and the mobile service data and the multiplexed data is transmitted. In other words, the PSI/PSIP information within the main service data and the PSI/PSIP information within the mobile service data become the same program table information and have the same packet identifier, and the program table information includes information which can parse both the main service data and the mobile service data.

For example, if the program table information is a virtual channel table (VCT), the VCT may include information about a virtual channel formed by the main service data and information about a virtual channel formed by the mobile service data. The VCT may be included in the mobile service data section and the main service data section and may be multiplexed. Accordingly, although the broadcasting signal receiving device parses the VCT from at least one of the mobile service data section and the main service data section, it is possible to obtain the information about the virtual channel included in the mobile service data section and the main service data section through the VCT.

Figure 24:
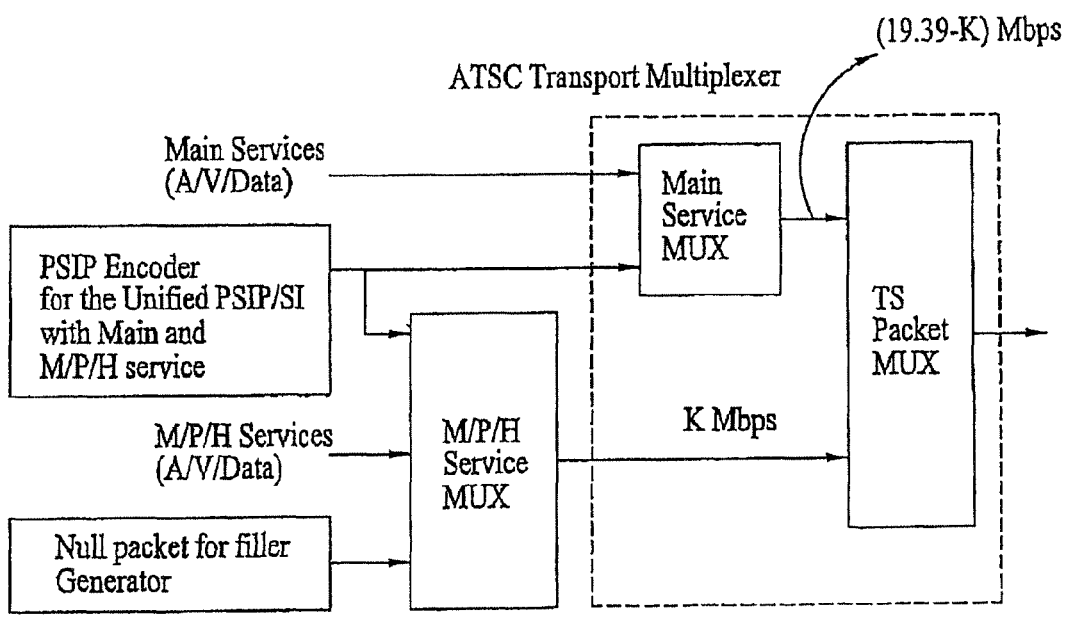
FIG. 24 is a view showing an example of transmitting program table information for main service data and mobile service data

FIG. 24 is a view showing an example of transmitting program table information including multiplexing information for the main service data and the mobile service data. FIG. 24 is similar to FIG. 2, but configuration information for both the main service data and the mobile service data are included in the same program table information and the program table information are respectively transmitted by multiplexing the main service data and the mobile service data. The program table information (PSI/PSIP for main and mobile service) includes the multiplexing information for the main service data and the mobile service data.

For example, the VCT included in the fixed reception channel and the VCT included in the mobile reception channel include multiplexing and configurative information for the mobile service data and the main service data, and may be respectively transmitted with the mobile service data and the main service data.

Although FIG. 2 shows the case where the service multiplexer transmits the broadcasting signal to the transmitter, the program table information including the multiplexing information for the main service data and the mobile service data is encoded by the PSIP encoder for the united PSI/PSIP with main and mobile service as shown in FIG. 24 even when the transmitter transmits the broadcasting signal to the broadcast receiving system. The encoded program table information may be included in the main service data and the mobile service data and may be transmitted. Hereinafter, the embodiment of the multiplexed program table information will be described with reference to the accompanying drawings.

Figure 25:
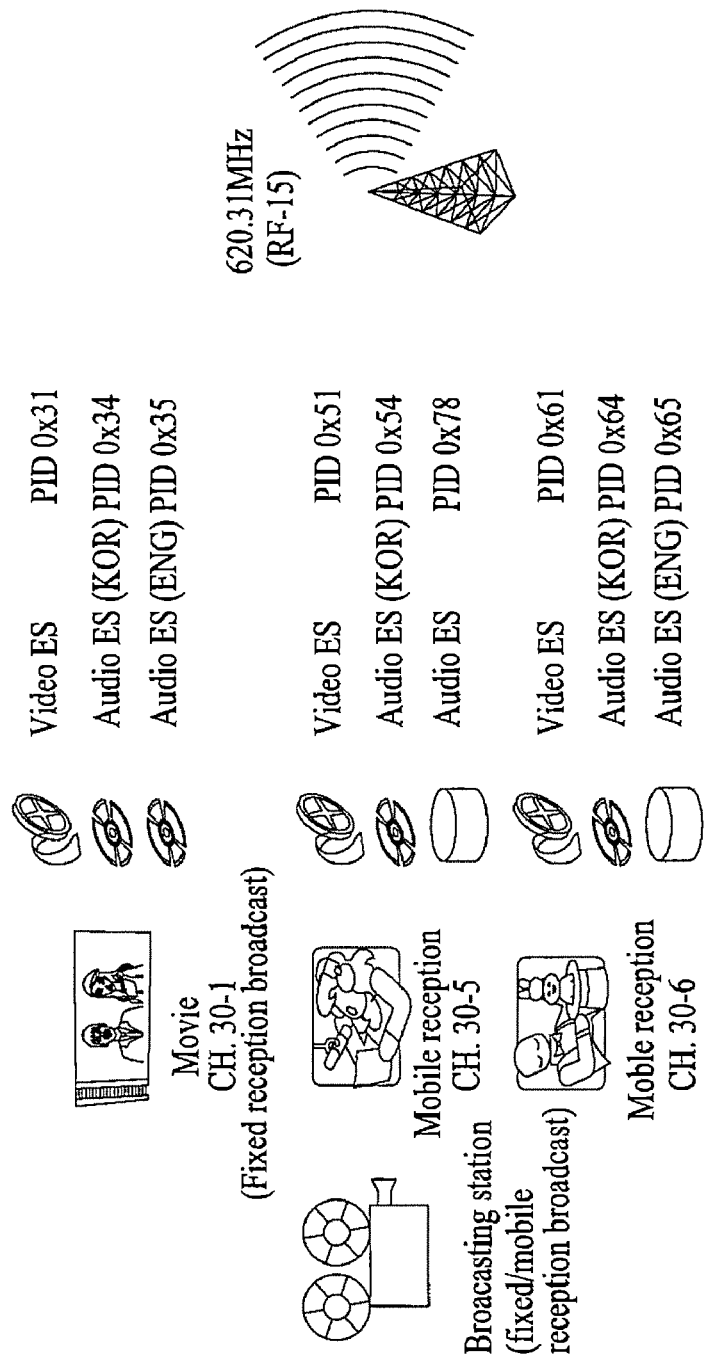
FIG. 25 is a view showing an example of a channel operation according to a program.

FIG. 25 is a view showing an example of a channel operation of a transmission program. FIG. 25 is a conceptual view of a case where a broadcasting station transmits broadcast service data to a physical channel. In the example of FIG. 25, it is assumed that the broadcasting station transmits a fixed reception channel 30-1 and mobile reception channels 30-5 and 30-6 to a physical channel 15 within a broadcast transmission channel (it is assumed that the RF band of the channel 15 is 620.31 MHz in FIG. 24). The main service data is transmitted through the fixed reception channel and the mobile service data is transmitted through the mobile service data.

In the example of FIG. 25, one video service and two audio services are delivered through the fixed reception channel 30-1 (major channel-minor channel). Here, it is assumed that the packet identifier (PID) of the video elementary stream (ES) for the video service of the channel 30-1 is 0x31, the PID of the audio ES for the Korean audio service thereof is 0x34, and the PID of the audio ES for the English audio service thereof is 0x35. It is assumed that the video service of the channel 30-1 provides a video service with high-definition (HD) image quality.

In the example of FIG. 25, one SD video service, one audio service and one data service are delivered through the mobile reception channel 30-5. The PID of the video ES of the channel 30-5 is 0x51, the PID of the audio ES thereof is 0x54, and the PID of the data ES thereof is 0x78.

In the example of FIG. 25, one SD video service and two audio services are delivered through the mobile reception channel 30-6. It is assumed that the PID of the video ES of the channel 30-6 is 0x61, the PID of the ES of the Korean audio service thereof is 0x64, and the PID of the ES of the English audio service thereof is 0x65. The structure of the virtual channel shown in FIG. 25 is also used in the following examples. In the case where information about a plurality of fixed reception channels and information about a plurality of mobile reception channels are transmitted to one physical channel like the example of FIG. 25, the information about the channels may be included in the same program table information and may be transmitted. The same type of program table information, for example, the VCT, may have the same PID in the fixed reception channel and the mobile reception channel. The program table information according to the PSI information such as PMT and the PSIP information such as VCT, MGT, EIT, ETT, SST and RRT may be transmitted through the mobile reception channel and the fixed reception channel.

Figure 26:
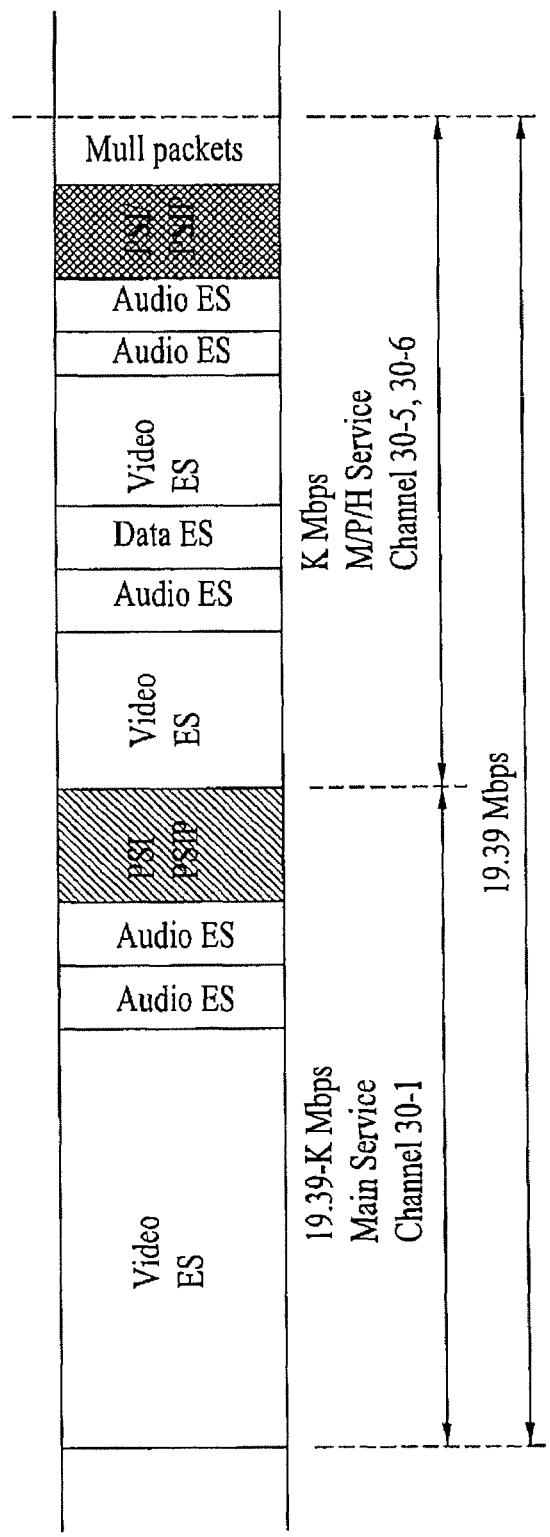
FIG. 26 is a conceptual view of programs provided as services in a physical channel band.

FIG. 26 is a conceptual view of programs provided as services in a physical channel band in the case where broadcasting service data shown in FIG. 25 is included in the physical channel and is transmitted. If it is assumed that the bandwidth of the entire channel is 19.39 Mbps, the main service data is transmitted in a portion of the entire bandwidth (19.39-K Mbps in FIG. 26) and the mobile service data is transmitted in another portion thereof (K Mbps in FIG. 26). In the transmission bandwidth of the main service data, one video ES and the program table information (PSI/PSIP) shown in FIG. 25 are included. In contrast, in the transmission bandwidth of the mobile service data, the video ES, the audio ES and the data ES for the broadcasting service of the channel 30-5, and the video ES, the audio ES and the audio ES for the broadcasting service of the channel 30-6 are included, and the program table information (PSI/PSIP) is included.

Here, the PSI/PSIP for the main service data and the mobile service data includes the same information. That is, the program table information such as the PSI/PSIP may describe the main service data, describe the mobile service data, and have the identifier for identifying the main service data and the mobile service data.

Meanwhile, as described with reference to FIG. 24, null packets may be transmitted to the mobile service data region such that the mobile service data is maintained at K Mbps. FIG. 26 shows the case where the null packets are transmitted to the mobile service data region so as to be matched to a transmission rate of the broadcasting service data.

FIGS. 27 to 33 show the case where the program table information multiplexed in the main service data and the mobile service data section has the same contents and the same PID.

FIG. 27 is a view showing an example of the PMT multiplexed in the service data. The PMT of FIG. 27 may describe the program according to the mobile service data. Although the program according to the mobile service data is described, the PMT may be multiplexed with the main service data and the multiplexed data may be transmitted like the example of FIG. 24 (in FIG. 24, the same PMT is multiplexed in the mobile service data and is transmitted).

The header of the PMT of FIG. 27 includes table_id, section_syntax_indicator, '0', reserved, section_length, program_number, reserved, version_number, current_next_indicator, section_number, last_section_number, reserved, and PCR_PID. The table_id is the table identifier of the PMT and, for example, the table_id of the PMT may be 0x02. The section_syntax_indicator has a value according to the syntax of MPEG long-form. A field in which "0" is set according to the definition of the PMT and the reserved field follow. The section_length indicates the length of the PMT section and the program_number is information equal to the PAT and becomes the program number. Then, two-bit reserved field and the version_number, in which the version information for checking whether the table is updated is set, follow. The current_next_indicator is an indicator indicating whether the current table section can be applied. The section_number indicates the serial number of the segment when the PMT is segmented into sections, and the last_section_number indicates the section number of the last segment. The PID delivering the program clock reference (PCR) of the current program is set after 3-bit reserved region having a value of 1.

The PMT includes a program descriptor describing respective programs and a stream descriptor describing streams in each of the programs. The program descriptor (a) may include a descriptor indicating whether the program included in the broadcasting signal is transmitted through the mobile service data. Accordingly, the PMT shown in FIG. 27 may be multiplexed in the mobile service data and the main service data and the PMT may include the identifier for identifying the main/mobile service data. The detailed example thereof is shown in FIG. 28.

FIG. 28 is a view showing a descriptor which is included in the program table information and can parse information for identifying the mobile/main service data. Although the identifier shown in FIG. 28 may be included in the PMT and may be transmitted as shown in FIG. 27 or may be transmitted through other program table information. The descriptor of FIG. 28 (hereinafter, referred to as mobile_service_descriptor) includes descriptor_tag which is the descriptor identifier and descriptor_length which is the descriptor length. In addition, the descriptor may include at least one of modulation_mode and service_type which may be the identifiers for identifying the mobile/main service data. The modulation_mode is an identifier for identifying whether the modulation mode is the modulation mode for the main service data or the modulation mode for the mobile service data. The modulation_mode is shown in FIG. 31 in detail. The service_type indicates the service type of the program and may indicate whether the service type is the service type according to the main service type or the service type according to the mobile service data. The service_type is shown in FIG. 32 in detail. That is, as shown in FIG. 27, the PMT may be multiplexed in the mobile service data section and the main service data section and include the descriptor information for identifying the mobile service data. In FIG. 28, burst_id indicates the identifier of the burst described in FIG. 8. The broadcast receiving system identifies the burst section, in which a desired broadcasting program is multiplexed, using the identifier of the burst and receives the broadcasting signal only in the burst section, thereby reducing power consumption. The mobile_service_descriptor included in the program table information may include the information for identifying the mobile service data and the main service data and may include the identifier of the burst including the mobile service data.

Figure 29:
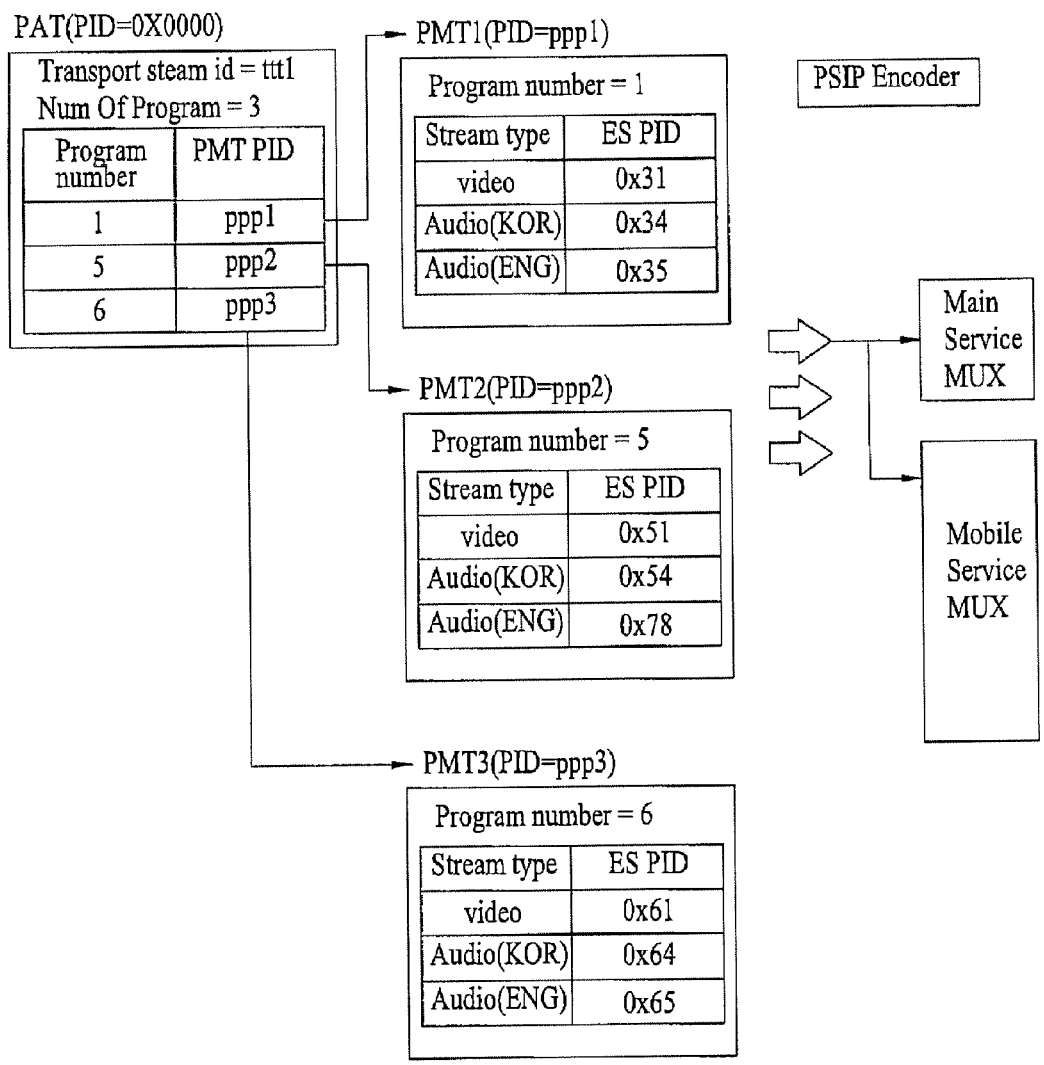
FIG. 29 is a view showing an example of multiplexing the program table information for the main service data and the mobile service data with broadcasting data and transmitting the multiplexed data.

FIG. 29 is a view showing an example of multiplexing the program table information for the main service data and the mobile service data with broadcasting data and transmitting the multiplexed data. The example of transmitting the multiplexing information for the main service data and the mobile service data will be described with reference to FIG. 29.

In the example of FIG. 29, the PID of the PAT including the program information for the main service data and the mobile service data is 0x0000. It is assumed that the transport stream ID for the transport stream of the main service data and the mobile service data is any value (ttt1) in FIG. 29. According to the example of FIG. 25, since the number of programs for the main service data is 1 and the number of programs for the mobile service data is 2, the "Num of Program" of FIG. 29 is 3 which is the sum of the number of programs for the main service and the number of programs for the mobile service.

The PAT includes the PIDs of the PMTs for the programs. The programs may be transmitted as the main service data or the mobile service data. In the example of FIG. 29, the PID of the PMT for the main service data is ppp1 (channel 30-1) and the PIDs of the PMT for the mobile service data are ppp2 (channel 30-5) and ppp3 (channel 30-6). The PMT (PMT1 of FIG. 29) for the main service program of the channel 30-1 includes 1 as the value of the program number and includes the ES packet identifier (ES PID=0x31) for the elementary stream of which the stream type is video. The PMT1 includes the ES PID (0x34) for the Korean audio stream type and the ES PID (0x35) for the English audio stream type.

The PMT (PMT2 of FIG. 29) for the program according to the mobile service of the channel 30-5 includes 5 as the value of the program number and the stream information parsed by the PMT (PMT2 of FIG. 29) is the ES PID (0x51) for the elementary stream of which the stream type is video. The PMT2 includes the ES PID (0x54) for the Korean audio stream type and the ES PID (0x78) for the data stream type.

In the example of FIG. 29, the PMTS for the program according to the mobile service transmitted through the channel 30-6 includes 6 as the value of the program number and includes the ES PID (0x61) for the video stream type, the ES PID (0x64) for the Korean audio stream, and the ES PID (0x65) for the English audio stream. Although not shown in FIG. 29, PMT2 and PMT3 for the mobile service data may include the descriptor shown in FIG. 28. Accordingly, the program table information shown in FIG. 29 is included in the main service data and the mobile service data, the program table information may describe the main service data and the mobile service data and may include the respective identifiers for the main service data and the mobile service data. The program table information shown in FIG. 29, such as the PAT and PMT, is encoded by the program table information (PSIP) encoder. The encoded program table information may be respectively multiplexed with the main service data and the mobile service data by a main service multiplexer and a mobile service multiplexer and the multiplexed data is transmitted. Accordingly, the same program table information may be transmitted in the mobile service data section and the main service data section.

FIG. 30 is a view showing the VCT in the program table information. Similar to FIG. 29, the VCTs which are respectively multiplexed in the mobile service data and the main service data may be transmitted. The VCTs which are respectively multiplexed in the main/mobile service data will be described with reference to FIG. 30. The VCT includes the header according to the transport format of the MPEG-2 system.

The header of the VCT may include table_id, section_syntax_indicator, private_indicator, reserved, section_length, transport_stream_id, reserved, version_number, current_next_indicator, section_number, last_section_number, and protocol_version. The table_id is the table identifier of the VCT and the table_id of the terrestrial virtual channel table (TVCT) is, for example, 0xC8. The section_syntax_indicator has a value according to the syntax of the MPEG long-form. The VCT includes the private_indicator, which is set to 1 according to the definition of the PSIP, and the 2-bit reserved region which follows thereafter. The section_length indicates the length of the VCT section and the transport_stream_id indicates the TSID value of the PAT. The VCT includes the 2-bit reserved region which follows after the transport_stream_id and the version_number has the version information for checking whether the table is updated. The current_next_indicator is an indicator indicating whether the current table section can be applied. The section_number indicates the serial number of the segment when the VCT is segmented into sections, and the last_section_number indicates the section number of the last segment. The protocol_version indicates the protocol version of the table section.

In the case where the mobile service data and the main service data are transmitted through the same physical channel, the num_channel_in_section indicates the number of virtual channels included in one physical channel. Accordingly, if the fixed reception channel and the mobile reception channel are included in one physical channel, the num_channel_in_section of the VCT for the fixed reception channel becomes the sum of the number of programs for the main service and the number of programs for the mobile service.

The VCT includes information about major_channel_number and minor_channel_number related to the virtual channel. In addition, the VCT may include the modulation mode which is the modulation mode information of the carrier of the virtual channel according to the num_channel_in_section (that is, according to the virtual channel). For example, the modulation mode may indicate the information according to the modulation mode such as 8-VSB, 16-VSB, 64 QAM and 256 QAM. The modulation mode may have different values with respect to the mobile reception channel and the fixed reception channel according to the num_channel_in_section. For example, in the virtual channel for the main service data, the modulation mode may have a value indicating 8-VSB or 16-VSB. In contrast, in the virtual channel for the mobile service data, the modulation mode may have a value indicating the modulation mode of the mobile service data. With respect to the virtual channel for the main service data and the virtual channel for the mobile service data, respective modulation mode information values may be set. That is, the broadcast receiving system may use the modulation mode for the VCT as the identifiers for identifying the virtual channel for the mobile service data and the virtual channel for the main service data. The detailed example set in the modulation mode in the VCT is shown in FIG. 31.

As another example, the service_type is the information indicating the service type transmitted through the virtual channel. The service type information of the virtual channel for the mobile service data and the service type information of the virtual channel for the main service data may be included in the VCT according to the num_channels_in_section of the VCT. Accordingly, the service_type of the VCT may be the identifiers for identifying the mobile service and the main service with respect to the virtual channel. The detailed example thereof is shown in FIG. 32.

As another example, the service_location_descriptor which is the descriptor of the VCT may include information for identifying the virtual channel for the mobile service data and the virtual channel for the main service data (that is, the virtual channel according to the num_channels_in_section). With respect to the mobile reception channel, the service_location descriptor may include the audio ES, the video ES and the data ES of the mobile reception channel. In contrast, with respect to the fixed reception channel, the service_location_descriptor of the VCT may include the stream ES PID information of the virtual channel through which the main service data is transmitted. Accordingly, although the same VCT is included in the main service data and the mobile service data, the broadcast receiving system can identify the virtual channels for the main service and the mobile service by the service_location_descriptor.

The VCT including the information for identifying the main service data and the mobile service data is multiplexed with the main service data and the mobile service data and the multiplexed data is transmitted.

FIG. 31 is a view showing the modulation mode of the broadcasting signal. Referring to FIG. 30, the modulation mode will be described. In the modulation mode delivered by the VCT, 0x00 indicates "reserved", 0x01 indicates "analog", 0x02 indicates "SCTE_mode_1", 0x03 indicates "SCTE_mode_2", 0x04 indicates "ATSC (8 VSB), and 0x05 indicates "ATSC (16 VSB). For example, the modulation mode of the signal (mobile service data) transmitted through the mobile reception channel may be set to 0x06 in the virtual channel loop (num_channels_in_section) of the VCT. In the example of FIG. 31, the value of the modulation mode of the mobile reception virtual channel is set to 0x06 (indicated by mobile-VSB in FIG. 30). In the example of FIG. 31, 0x07 to 0x7F indicate the reserved regions for future and 0x80 to 0xFF indicate the user private regions. In the example of FIG. 31, the VCT may include information about the modulation_mode for identifying the virtual channel for the mobile service data and the virtual channel for the main service data may include the respective modulation modes. In addition, the VCT including the information about the virtual channel for the mobile service data and the virtual channel for main service data is multiplexed in the mobile service data and the main service data and is transmitted. The mobile service data and the main service data may be identified according to the modulation mode shown in FIG. 31.

FIG. 32 is a view showing the service_type of the broadcasting signal. In the example of FIG. 32, 0x00 to 0x07 indicate reserved (0x00), analog television (0x01), ATSC_digital_television (0x02), ATSC_audio (0x03), ATSC_data_only_service (0x04), software download data service (0x05), unassociated/small screen service (0x06), and parameterized service (0x07), respectively. In the example of FIG. 32, 0x08 to 0x0F indicate the reserved regions. In the example of FIG. 32, 0x10 indicates the digital television service type for the mobile service, 0x11 indicates the audio service type provided as the mobile service, and 0x12 indicates the data service type provided as the mobile service. 0x14 to 0x7F indicate the reserved regions and 0x80 to 0xFF indicate the user private regions. In the example of FIG. 32, the VCT may include information about service_type for identifying the mobile reception channel and the fixed reception channel. The VCT including the information about the service_type for identifying the mobile reception channel and the fixed reception channel may be included in the main service data section and the mobile service data section and may be transmitted.

Figure 33:
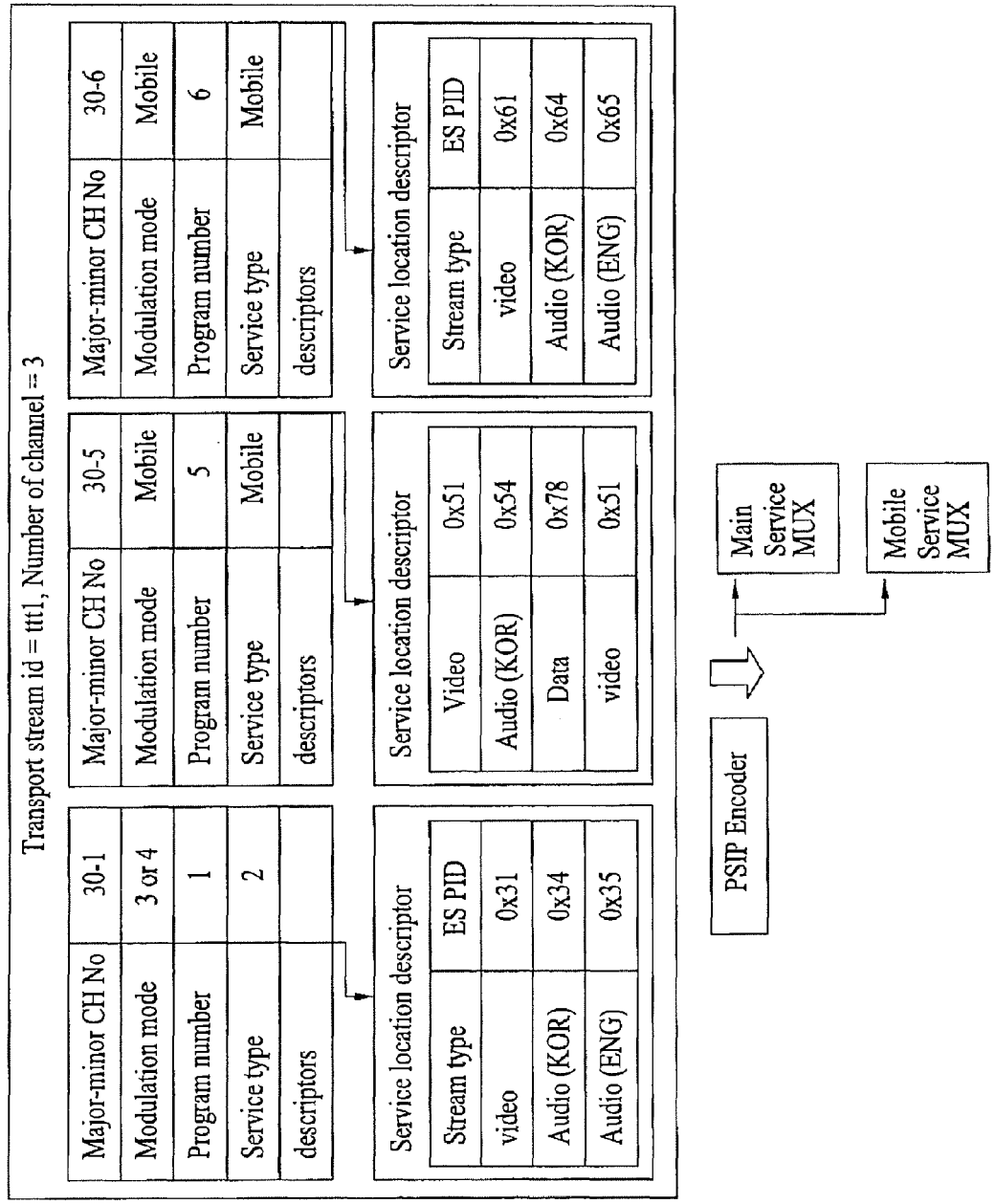
FIG. 33 is a view showing an example of generating the respective VCTs including the main service data and the mobile service data and transmitting/receiving the VCTs.

FIG. 33 is a view showing an example of generating the VCT including the virtual channel information for the main service data and the mobile service data and transmitting the VCT. For convenience of description, it is assumed that the example of the service transmitted through the virtual channel is equal to that shown in FIG. 25.

In FIG. 33, the VCT for the main service data and the VCT for the mobile service data may have the same PID (0x0FFB). As shown in FIG. 33, the VCT including the channel information of the main service data and the mobile service data includes the channel information of the main service data and the mobile service data. The VCT may be transmitted through one physical channel through which the mobile reception channel signal and the fixed reception channel signal are transmitted (in one physical channel, transport_stream_id is equal. In FIG. 33, transport_stream_id=ttt1 (any number)). In example of FIG. 33, since the number of fixed reception virtual channels is 1 (num of channel=1) and the number of channels included in the mobile reception virtual channel is 2 (num of channel=2), "num of channel" is 3 (=1+2).

With respect to the fixed reception virtual channel, the VCT includes information about a major channel (No. 30) and a minor channel (No. 1) and includes the modulation mode information (which may be 0x04 or 0x05 in the example of FIG. 31) of the signal transmitted through the fixed reception virtual channel. The program number of the fixed reception channel of FIG. 33 is 1 and the service type thereof is 2 (0x02; ATSC_digital_television) and has the information about the service type provided to the digital television.

With respect to the fixed reception channel, the service_location_descriptor of the VCT includes the video ES PID information (0x31), the ES PID (0x34) of the Korean audio stream and the ES PID (0x35) of the English audio stream.

With respect to the mobile reception channel, the VCT includes major channel information and minor channel information of the mobile reception virtual channel (30-5 and 30-6 in the example of FIG. 33). With respect to the mobile reception channels 30-5 and 30-6, the VCT may be transmitted such that the modulation mode for the channel for transmitting the mobile service data is included. Although the modulation mode is indicated by the mobile in FIG. 33, the example of the detailed value is shown in FIG. 31.

In the example of FIG. 33, the VCT may include 5 as the program number of the channel 30-5, which is the mobile reception virtual channel, and includes 6 as the program number of the channel 30-6. The VCT may have the values shown in FIG. 32 as the value of the service type of the mobile service data transmitted through the virtual channel (indicated by the mobile in FIG. 33).

The service_location_descriptor of the VCT may include the ES PID (0x51) of the video stream, the ES PID (0x54) of the Korean audio stream and the ES PID (0x78) of the data stream as the channel information of the channel 30-5 which is the mobile reception channel. With respect to the channel 30-6 of the mobile reception virtual channels, the service_location_descriptor of the VCT delivers the ES PID of the stream included in the virtual channel 30-6. In the example of FIG. 33, the service_location_descriptor may include the ES PID (0x61) of the video stream, the ES PID (0x64) of the Korean audio stream and the ES PID (0x65) of the English audio stream, with respect to the channel 30-6. The VCT including the information about the above-described fixed reception channel and mobile reception channel may be encoded by the PSIP encoder for the united PSI/PSIP with main and mobile service and may be multiplexed with the mobile service data and the main service data, and the multiplexed data may be transmitted.

The program table information including the information about the mobile service data and the main service data may be included in the process of processing the mobile service data and the main service data in the transmitter as shown in FIG. 3.

The program table information having the main/mobile service data information multiplexed with the mobile service data is subjected to a pre-processing process by the pre-processor. Meanwhile, the program table information having the main/mobile service data information multiplexed with the main service data is subjected to the process of removing a packet jitter. In addition, the VSB transmission signal frame may be formed by the post-processing process and may be transmitted.

Meanwhile, FIG. 8 shows the example where the mobile service data is included in the burst section in the unit of a group including 118 segments. However, FIG. 8 is only exemplary and the mobile service data may be distributed in the entire burst section. In this case, the broadcast receiving system receives the mobile service data only in the burst section and receives the main service data in the non burst section. As another example, the mobile service data group and the main service data group may be arranged at a ratio different from the ratio shown in FIG. 8 in one burst section and may be transmitted/received. In this case, if the broadcast receiving system wants to obtain only the mobile service data (for example, if the broadcast receiving system for the mobile reception channel or the broadcast receiving system for the mobile/fixed reception channel wants to obtain the mobile service data), the mobile service data group may be processed within the burst section. The fixed broadcast receiving system may process the main service data group of the burst section and the main service data of the non burst section.

Figure 34:
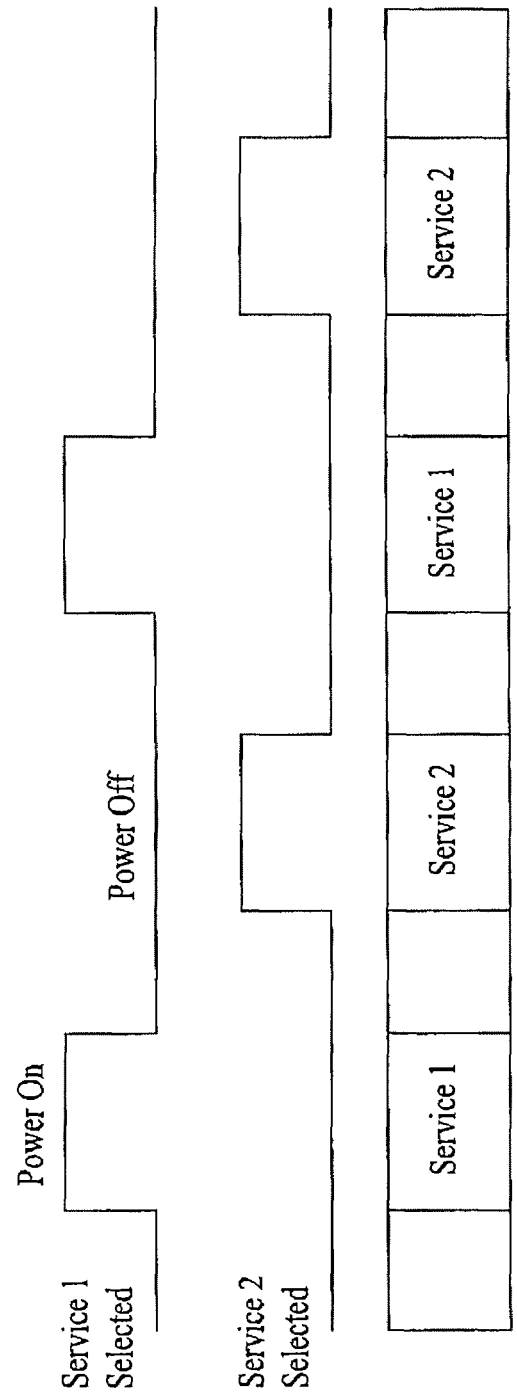
FIG. 34 is a conceptual view of the reception of the mobile service data included in a burst section while reducing power consumption.

FIG. 34 is a conceptual view of the reception of the mobile service data included in the burst section while reducing power consumption. The broadcast receiving system can receive only the broadcasting signal in the burst section because the broadcast receiving system is powered on only in the burst section including the mobile service data of the virtual channel which is desired to be viewed by the user (In the example of FIG. 8, the main service data may be included in the burst section. However, since the main service data may be processed independent of the mobile service data or may be discarded, only the mobile service data in the burst section may be processed). In this case, the united program table information which can describe the main service data and the mobile service data is received and processed in the mobile service data section of the burst section. For example, if the first virtual channel (service 1 of FIG. 32) is desired to be viewed, the broadcast receiving system is powered on only in the burst section including the mobile service data for the program of the first virtual channel and is powered off in the remaining signal section. If the user wants to view the program of the second virtual channel, the broadcast receiving system is powered on only in the burst section including the program of the second virtual channel and receives the mobile service data for the second virtual channel. Accordingly, if the user switches the channel from the first virtual channel to the second virtual channel, the section in which the broadcast receiving system is powered on/off may be changed. If the broadcast receiving system is powered on in the burst section, the multiplexed program table information in the burst section can be obtained. The multiplexed program table information includes the multiplexing information for the main service data and the mobile service data, the channel information, and the broadcasting program information. That is, the program table information may include the information describing the main service data and the mobile service data. The program table information may further include the identifiers for identifying the mobile service data and the main service data.

Figure 35:
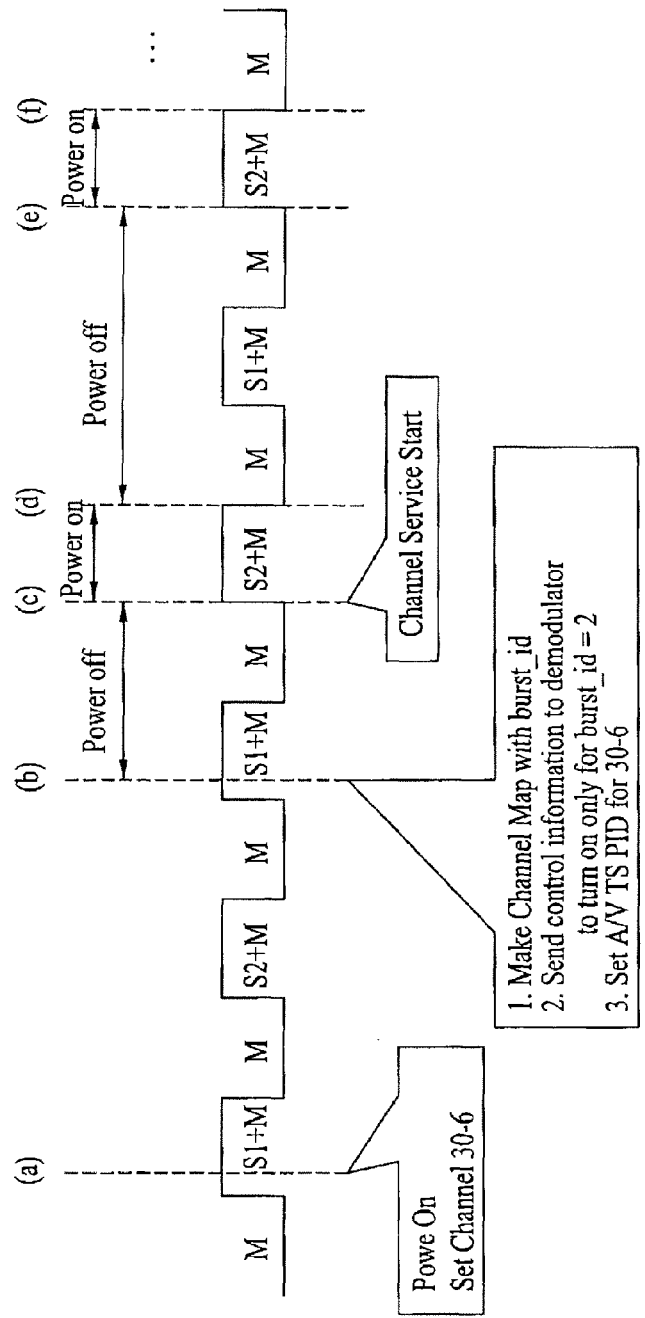
FIG. 35 is a detailed view of FIG. 34.

FIG. 35 is a detailed view showing the case where the broadcast receiving system can receive the mobile service data included in the burst section as the broadcasting signal while reducing power consumption. According to the example of FIG. 35, the virtual channels 30-1, 30-5 and 30-6 may be included in one physical channel. The description of the burst identifier (burst_id) is shown in FIG. 28.

As shown in FIG. 34, the broadcasting service according to the virtual channel is multiplexed in a different burst section and thus the burst section may have the identifier according to the virtual channel included in the burst section. The burst section or the burst identifier for identifying the service data included in the burst section may be received from the signaling information of the broadcasting signal or the descriptor (shown in FIG. 28) of the program table information such as the VCT.

In the example of FIG. 35, the burst identifier of the mobile service data (service 1; S1) of the channel 30-5 is 1 (the main service data M may be included in the burst section) and the burst identifier of the mobile service data (service 2; S2) of the channel 30-6 is 2 (the main service data M may be included in the burst section). In FIG. 35, since the main service data is not located in the burst section, the burst identifier may not be set. In FIG. 35, it is assumed that the signal of the channel 30-6 is output when the broadcast receiving system is powered on (a).

The broadcast receiving system can receive the program table information from the broadcasting signal from a power-on time point a during a predetermined time period (b) regardless of the burst, in order to obtain the program table information including the channel information in the broadcasting signal. For example, even when the signal of the mobile reception channel is received, the broadcasting signal may be continuously received until every channel information is obtained, regardless of the burst section or the non burst section. The broadcast receiving system can obtain the same program table information from the main service data and the mobile service data. Accordingly, the broadcast receiving system can receive more rapidly receive the multiplexing information such as the channel information included in the program table information. That is, since the broadcast receiving system can obtain the united program table information with respect to the main/mobile service from the main and mobile service data, it is possible to more rapidly obtain the entire channel information. The broadcast receiving system can obtain the channel information of the mobile/fixed reception channel and the PID information of the broadcasting stream delivered through the channel from the united program table information.

At a time point (c) where the channel map is generated using the channel information, the PID of the broadcasting stream of the channel desired by the user or the channel which should be originally output is selected, the broadcasting stream is decoded, and the decoded contents are output. If the channel desired by the user is the mobile reception channel, the broadcast receiving system obtains the burst identifier including the mobile service data of that channel, is powered on (c, d) in the burst section and is powered off in the remaining signal section (d, e). The broadcast receiving system can output the broadcasting signal and provide the broadcasting service from the power-on section according to the burst section. Accordingly, the broadcasting service may be output from a time point when the burst section of the channel desired by the user starts.

If the broadcast receiving system receives the fixed reception channel, the broadcasting service of the channel desired by the user can be output immediately after the channel map is generated, regardless of the burst. The broadcast receiving system first may output the broadcasting service using the channel map, which is previously stored, even before the channel map is generated and cope with the channel change of the user after the channel map is generated.

Figure 36:
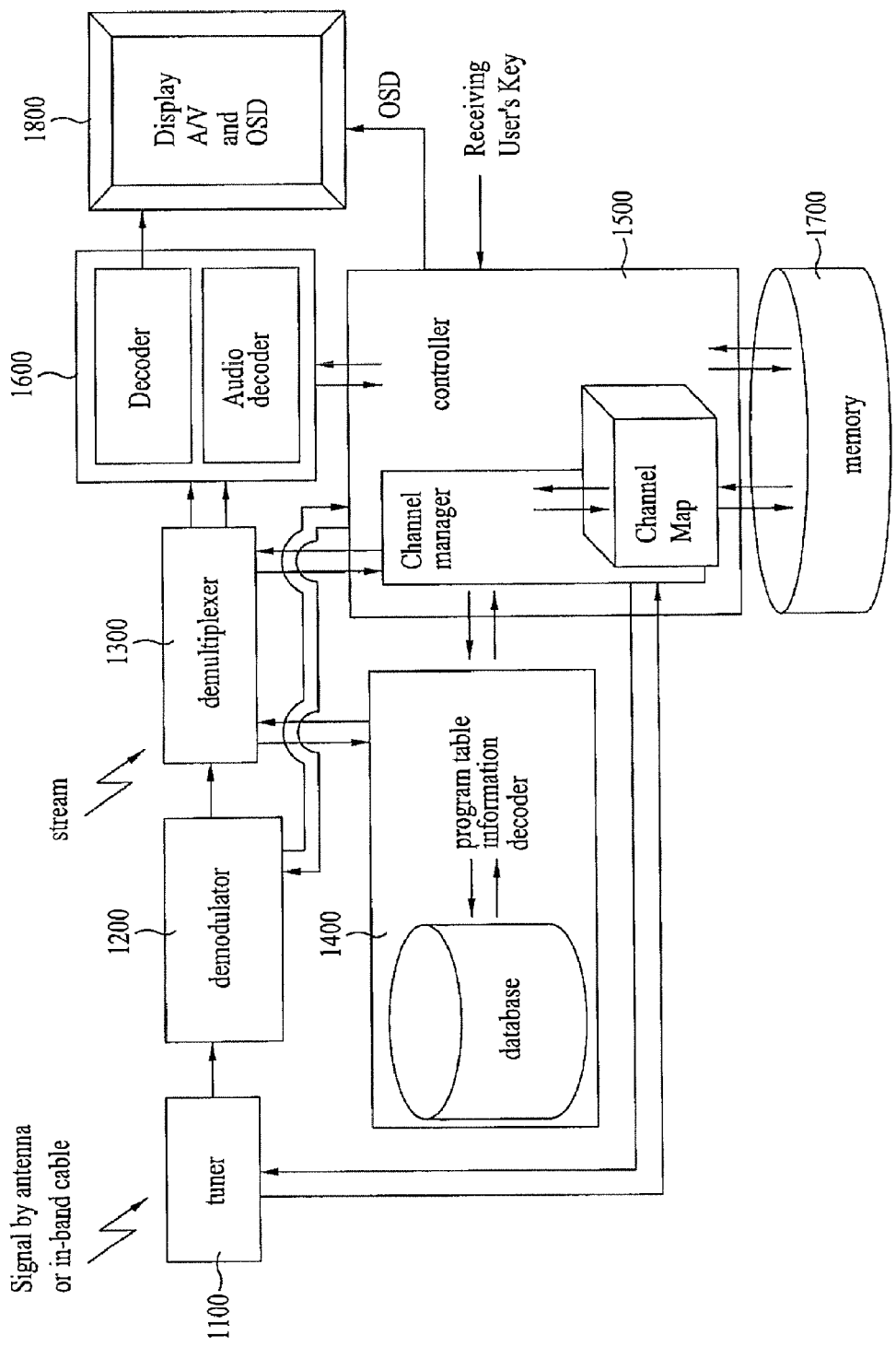
FIG. 36 is a view showing an example of a broadcast receiving system.

FIG. 36 is a view showing an example of the broadcast receiving system. Referring to FIG. 36, the example of the broadcast receiving system will be described. The example of the broadcast receiving system includes a tuner 1100, a demodulator 1200, a demultiplexer 1300, a program table information decoder 1400, a controller 1500, a decoder 1600, a memory 1700 and an output unit 1800.

The tuner 1100 can receive the broadcasting signal transmitted through at least one of the fixed reception channel or the mobile reception channel. That is, the broadcasting signal received by the tuner 1100 may include the main service data and the mobile service data therein. The tuner 1100 tunes the channel selected by the user and outputs the broadcasting signal of the channel. The broadcasting signal received from the fixed reception channel may include a terrestrial/cable broadcasting signal.

The demodulator 1200 demodulates the signal output from the tuner 1100 and outputs the demodulated signal. The demodulator 1200 may demodulate at least one of the broadcasting signal of the fixed reception channel or the broadcasting signal of the mobile reception channel. For example, the demodulator 1200 may demodulate the 64 VSB/256 VSB modulation signal or demodulate 64 QAM/256 QAM modulation signal. The demodulator 1200 may demodulate the broadcasting signal of the fixed reception channel and the broadcasting signal of the mobile reception channel. The example of demodulating the mobile service data and the main service data is shown in FIG. 22 (refer to the operation and the description of FIG. 22 excluding the tuner) in detail. The demodulator 1200 may not demodulate the broadcasting signal according to the null packets, which are transmitted so as to be matched to the transmission rate, in the received signal. In the example of FIG. 36, if only the mobile service data can be received, the demodulator 1200 may demodulate only the mobile service data of the burst section and may discard the remaining main service data. In contrast, in the example of FIG. 36, if both the main service data and the mobile service data are received, the both received signals are demodulated and output. If the demodulator 1200 demodulates at least one of the main service data and the mobile service data in FIG. 22, the demodulated data may include the program table information describing both the main service data and the mobile service data. The program table information multiplexed with the demodulated main service data and the program table information multiplexed with the mobile service data may be input to the program table information decoder 1400 through the demultiplexer 1300.

The demultiplexer 1300 may demultiplex the signal output from the demodulator 1200 and output the demultiplxed signal. The demultiplexer 1300 may directly receive the mobile service data stream or the main service data stream from an external device. For example, when the broadcast receiving system can receive the broadcasting stream from the digital VCR, the demultiplexer 1300 may directly receive and demultiplex the broadcasting stream through a predetermined interface, for example, an interface having the IEEE 1394 format. The demultiplexer 1300 may demultiplex the video stream, the audio stream and the program table information in the received broadcasting stream. For example, if the program table information according to the examples of FIGS. 27 to 33 is included in the received signal, the demultiplxer 1300 outputs the program table information to the program table information decoder 1400 and outputs the video and audio signals in the broadcasting signal to the decoder 1600. That is, the demultiplexer 1300 may demultiplex the program table information including the multiplexing information of the main service data and the mobile service data and the broadcasting signal and output the demultiplexed data. The demultiplexing unit 1300 may demultiplex the program table information including the multiplexing information of the mobile service data and the main service data and output the demultiplexed information.

When a channel selection command is received from the controller 1500, the demultiplexer 1300 may output the video/audio stream according to the video/audio PID of the channel selected by the user to the decoder 1400.

The program table information decoder 1400 may decode the demultiplexed program table information and output the decoded information to the controller 1500. The program table information decoder 1400 may decode the program table information including the multiplexing information of the mobile service data/main service data. In this case, the program table information may include the identifiers for identifying the mobile service data and the main service data. In the example of FIG. 36, the program table information decoder may decode the program table information of the main service data and the program table information of the mobile service data. If the program table information multiplexed with the main and mobile service data is received, it is possible to rapidly obtain the channel information.

The controller 1500 may control the components shown in FIG. 36 and store the information about the channel using the received program table information. For example, the controller 1500 may store the information about the video/audio/data stream of the channel in the channel map form using the parsed program table information. For example, the controller 1500 may store the channel map of the mobile service data and the channel map of the main service data so as to be divided according to the channel map form or may store the channel map of the mobile service data and the channel map of the main service data together. Here, the program table information may include both the main and mobile service data and include the identifiers for identifying the main service data and the mobile service data.

The controller 1500 may receive a user control signal through a user interface. When the user transmits the control signal such as the channel change, the controller 1500 may output the signal of the channel desired by the user by referring to the channel map information. Although the channel information of the mobile service data and the channel information of the main service data are stored in one channel map form, the controller 1500 may control the broadcasting signal transmitted through each channel to be output. That is, the controller 1500 may control the tuner 1100, the demodulator 1200 and the demultiplexer 1300 such that the broadcasting signal of the channel is output, if the channel change between the virtual channels for providing the main service and the mobile service or the channel change between the virtual channel for providing the mobile service is made. For example, if a channel change command is received, the controller 1500 may select the channel changed through the tuner 1100 by referring to the channel map. The controller 1500 may control the demodulator 1200 such that the signal of the channel selected by the user is demodulated. For example, if the user selects the mobile reception channel, the controller 1500 may control the demodulator 1200 such that only the mobile service data in the burst section in which the mobile service data of the mobile reception channel is multiplexed is demodulated (the demodulation operation of the demodulator may refer to the description of the blocks shown in FIG. 22 excluding the tuner). If the user selects the fixed reception channel, the controller 1500 may control the demodulator 1200 such that only the main service data is demodulated. The controller 1500 may control the demultiplexer 1300 such that the packet of the broadcasting signal of the channel selected by the user is demultiplexed according to the stored channel map.

The controller 1500 may control the power of the blocks shown in FIG. 36. For example, if the broadcast receiving system shown in FIG. 36 receives the mobile service data, the power of the broadcast receiving system may be controlled such that the signal is received only in the burst section including the mobile service data of the reception channel. Accordingly, although the broadcast receiving system receives the signal of the mobile reception channel, it is possible to reduce power consumption. The controller 1500 may obtain the identifier of the burst section from the descriptor of the program table information or the signaling information. Accordingly, the controller 1500 may control the demodulator 1200 to demodulate only the burst section through the burst information indicating in which burst section the broadcasting signal of the channel desired by the user is transmitted. The controller may control the demultiplexer 1300 such that the broadcasting signal according to the PID of the broadcasting stream of the channel desired by the user is demultiplexed.

Meanwhile, the controller 1500 may control the application or the user interface of the broadcast receiving system of FIG. 36. The controller 1500 may update and manage the channel map through the program table information, control the tuner 1100 and the program table information decoder 1400, and operate a channel manager according to the channel request of the viewer. The channel manager may update the channel map using the program table information which is newly received and control the demultiplexer 1300 to select the PID of the video/audio stream of the channel desired by the user.

The decoder 1600 decodes the video and/or audio stream output from the demultiplexer 1300 and outputs the decoded stream. For example, the decoder 1600 may decode the audio stream encoded according to an AC-3 or the video stream encoded by an MPEG-2.

The output unit 1800 may output the video/audio signal output from the decoder 1600. In the example of FIG. 36, the output unit 1800 includes a display unit for outputting the video signal and a speaker for outputting the audio signal. The output unit 1800 may display a graphic signal generated by the controller 1500 and the video signal displayed on the screen by an on-screen display (OSD). The signal output from output unit 1800 by the graphic signal includes a channel number, broadcasting program information, broadcasting station information, a broadcasting title, a broadcasting time, a caption, a broadcasting class, and a detailed plot.

The memory 1700 may store data, such as channel information according to the channel map, and application. For example, the memory 1700 may be a nonvolatile random access memory (NVRAM) or a flash memory.

The signal demodulated by the demodulator 1200 may IP datagram. For example, referring to FIGS. 22 to 23, the packet output from the RS frame decoder of the demodulator 1200 may be the packet including the IP datagram. Alternatively, in the example of FIG. 35, the digital broadcasting system may receive the IP stream including the mobile service data through a network interface (not shown). In this case, the controller 1500 operates an IP manager such that the IP stream can be transmitted/received according to the IP and the IP stream can be transmitted/received according to the source and the destination of the IP stream. The controller 1500 operates a service manager such that a service provided by the IP stream received through the IP manager can be output in real time, and the service manager may implement the video/audio received by the IP stream. For example, the service manager may control the service received by the IP protocol in real time. For example, if the service manger controls the real-time streaming data, the service data can be controlled using the real-time transport protocol/RTP control protocol (RTP/RTCP). The IP stream may include the program table information describing the mobile service data and the main service data in addition to the video/audio. If the IP stream is decoded, the process of the program table information is performed as described above. Meanwhile, the controller 1500 may decode the data in the received IP datagram and store the decoded data in the memory 1700. The controller 1500 may execute the application such that the data stored in the memory 1700 can be output or provided to the user.

Figure 37:
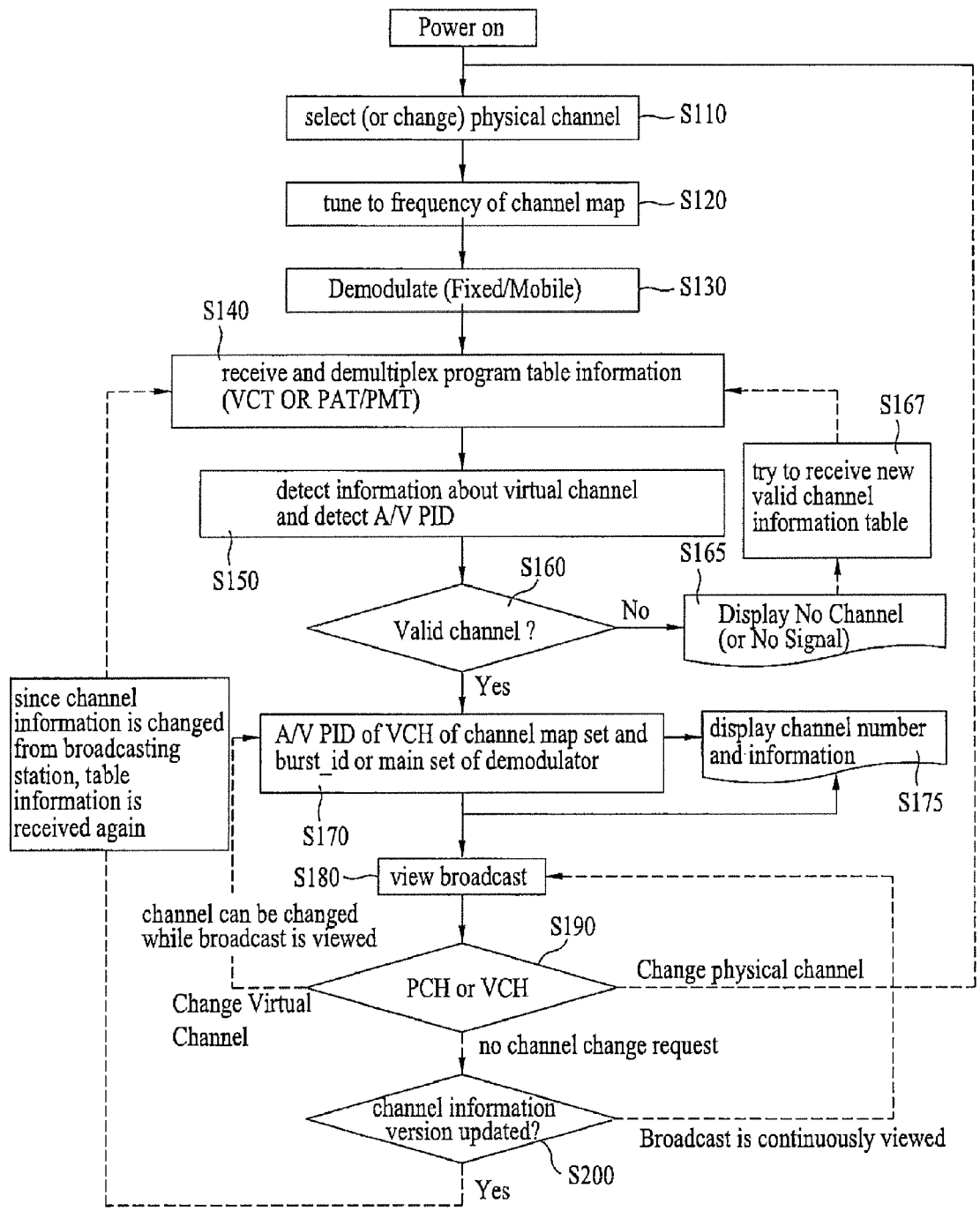
FIG. 37 is a flowchart showing an example of receiving a broadcasting signal.

FIG. 37 is a flowchart showing an example of receiving the broadcasting signal. The example of receiving the broadcasting signal will be described with reference to FIG. 37.

The user powers on the broadcast receiving system (S105).

The user selects a physical channel or changes a physical channel tuned previously (S110). The channel map is formed or, if the channel map of the channel included in the received signal is previously formed, the frequency of the channel selected according to the channel map is tuned (S120). The tuner may output the best tuned result to the controller for storing the channel map.

The tuned broadcasting signal is demodulated (S130). If the broadcasting signal is demodulated, the broadcast receiving system which can receive only the main service data may not demodulate the mobile service data, that is, may discard the mobile service data as the null packets. In contrast, the broadcast receiving system which receives the mobile service data demodulates the signal according to the method for modulating the mobile service data. The detailed demodulating process may refer to the example of FIG. 22. The broadcast receiving system which can process both the main and mobile service data receives and processes the broadcasting data included in the burst section and the non burst section.

The program table information is multiplexed and parsed from the demodulated signal (S140). For example, after the PAT is received and parsed, the PMT information of the program may be parsed. Since the program table information is transmitted after being multiplexed with the main and mobile service data, it is possible to obtain the same program table information even when only the mobile service data can be processed, even when only the main service data can be processed or even when both the main service data and the mobile service data can be processed. That is, the program table information includes the channel information of the main service data and the mobile service data and includes the identifiers for identifying the main service data and the mobile service data.

The information about the channel is obtained from the parsed program table information and the PID information of the audio/video/data ES of the channel is detected (S150). For example, the VCT is received and parsed such that the information about the mobile reception channel and the fixed reception channel can be obtained. If both the mobile service data and the main service data can be processed, the program table information is obtained from data sections multiplexed respectively with the mobile service data and the main service data. Accordingly, it is possible to more rapidly collect the channel information compared with the case where the program table information is obtained from one data section.

The channel information detected in the step S150 is stored as the channel map or the stored channel map is updated. The mobile reception channel is distinguished from the fixed reception channel using the modulation_mode and the service_type of the VCT or the mobile_service_descriptor of the PMT.

It is determined whether the service such as the audio/video/data ES of the channel information received according to the channel selected by the user is valid in the receiving system (S160). If the channel is not valid (no in the step S160), for example, "no channel" or "no signal" may be displayed to the user according to the predetermined channel operation (S165). In order to obtain the channel information of the valid channel, the process may return to the step S140 such that new program table information is received (S167).

If only the main service data can be processed, the mobile reception channel can be processed as the invalid channel (that is, the processing process of "no" of the step 160 is performed). In contrast, if only the mobile service data can be processed, the fixed reception channel can be processed as the invalid channel.

If the channel selected by the user from the output channel information is the valid channel (yes in the step S160), the PID of the audio/video/data stream of the virtual channel is selected according to the channel map (S170). The demodulating process of the step S130 is controlled depending on whether the channel selected by the viewer is the fixed reception channel or the mobile reception channel according to the channel map. The process for demodulating the broadcasting signal received through the fixed reception channel and the mobile service channel may refer to FIG. 22.

The audio/video/data stream according to the demultiplexed PID is decoded such that the broadcasting signal is output. If the main service for the fixed reception channel is provided, the broadcasting signal of the channel is successively subjected to the channel tuning, demodulating and demultiplexing processes such that the main service data is output. In contrast, if the mobile service according to the mobile reception channel is provided, the broadcasting signal may be processed such that only the signal of the burst section including the broadcasting signal of the mobile reception channel selected by the user is subjected to the channel tuning, demodulating and demultiplexing processes. When the broadcasting signal is output, the channel number or the channel information selected by the OSD may be selectively displayed on the screen (S175).

The broadcast of the channel selected by the user is output (S180). The video/audio/data stream of the broadcasting signal transmitted through the selected virtual channel is decoded and output. The user can view a normal broadcast and control the broadcast reception through the OSD.

While the broadcast is viewed, the physical channel or the virtual channel may be changed (S190). If the physical channel is changed, the step S110 is performed and, if the virtual channel is changed, the step S170 is performed. If the channel is changed between the mobile reception channels or the channel is changed from the fixed reception channel to the mobile reception channel in the case where both the main service data and the mobile service data can be received, the step S170 is performed such that the burst including the broadcasting signal of the changed channel is searched for and the broadcasting signal is demodulated only in the burst section. In contrast, if the channel is changed between the fixed reception channels or the channel is changed from the mobile reception channel to the fixed reception channel, the data of the section including the main service data is demodulated (if the main service data is included in the burst section, the data of the main service data section including the burst section can be demodulated).

However, if only the main service data can be processed, the mobile service data is considered as the signal according to the null packet and thus the mobile reception channel cannot be selected or can be processed as the invalid channel although selected. If only the mobile service data can be processed, the fixed reception channel is processed as the invalid channel.

If the channel is not changed, it may be determined whether the version of the channel information is updated (S200). If the channel information is updated, the information about the channel map is updated and the step S140 is performed in order to receive the new program table information. If the channel information is not updated, the step S180 may be performed.

Hereinafter, FIG. 38 is a view showing a descriptor including the identifier of the burst section, and FIG. 39 is a view showing an example of delivering cell information for mobile reception to the program table information such as the PMT.

FIG. 38 shows the example of the descriptor including the identifier of the burst section for the virtual channel information in the broadcasting signal transmitted/received by the method for transmitting/receiving the broadcasting signal according to the present invention. In FIG. 38, for convenience sake, the above-described descriptor is called time_slice_information_descriptor. This descriptor may be transmitted as the descriptor included in the PMT or the VCT. The time_slice_information_descriptor includes a descriptor tag, a descriptor length, Burst_TS_id which is the identifier of the burst section and offset information between the burst sections. The burst sections in the broadcasting signal may include the identifier according to the broadcast included in the burst section. The offset information may be offset information between the successive burst sections or offset information between the burst sections in which the broadcast of the same channel is transmitted. In FIG. 38, the identifier in the burst section including the broadcasting signal may be delivered and received and the broadcasting signal may be received according to the identifier. For example, the identifier of the burst section includes the identifiers of the sections "S+M1" "S+M2" as shown in FIG. 34 and the offset information between the burst sections may include the sections between the (c) and (e) or the sections (d) and (e).

FIG. 39 shows the program table information including the physical channel information for each cell in the program table information transmitted according to the embodiment of the present invention. The physical channel information transmitted from each cell (here, the cell indicates the region which can receive the broadcasting signal from any one transmitter) may be transmitted by a network information table (NIT) of the PSI. Since the NIT includes the physical channel information for the current cell and other cells, when any broadcasting station transmits the broadcasting signal according to the modulation method of the mobile service data, the NIT may also include the physical channel information of the broadcasting stations other than the broadcasting station. In the example of FIG. 39, the PID of the packet transmitted by the NIT is 0x010 and the table identifier (table_id) is 0x40. FIG. 39 shows the case where only the channel information of two cells is delivered for convenience of description. In the example of FIG. 39, the identifier of each cell and the channel information of each cell are included in the cell frequency_link_descriptor of the network descriptor( ) The identifier of the first cell (cell_id) is 0x0001 and the frequency of the first cell is 0x03aefe40 (fc=618 MHz), the identifier of the second cell is 0x0002, and the frequency of the second cell is 0x4a32240 (fc=778 MHz).

In the example of FIG. 39, the physical channel information of at least one cell identified by the identifier of the cell may be provided through a transport stream loop (TS loop) of the NIT. In the TS loop, the service_list_descriptor for providing the list information of the services according to the identifiers of the transport streams may be included. In the example of FIG. 39, since both the transport stream identifiers (transport_stream_identifier) transmitted to the first cell and the second cell are 0x901, the first cell and the second cell transmit the same transport stream. The NIT delivers the cell information including the physical channel information of the cell to the broadcasting delivery system descriptor of each cell (terrestrial_delivery_system_descriptor( ).

In the example of FIG. 39, the information about the first cell for delivering the transport stream may include the central frequency of the transmitted signal (618 MHz; 0x03aefe40), the bandwidth (6 MHz; 010), an identifier (time_slicing_indicator) indicating whether the signal can be received by a time slicing scheme according to the transmission of the burst signal, a modulation mode such as mobile VSB, a value indicating a first error correction encoding rate (sccc_rate-HP_stream) for a high priority channel, a value indicating a first error correction encoding rate (sccc_rate-LP_stream) for a low priority channel, a value indicating a second error correction encoding rate (rs_code_rate-HP_stream) for the high priority channel, a value indicating a second error correction encoding rate (rs_code_rate-LP_stream) for the low priority channel, and an identifier (other_frequency_flag) indicating whether the transport stream is broadcasted to the cell.

In the example of FIG. 39, the information about the second cell for delivering the same transport stream as the first cell may include the cell information including the physical channel information including the central frequency (778 MHz; 0x04a32240) of the transmission signal, the bandwidth (6 MHz; 010) and so on.

In the example of FIG. 39, the NIT transmitted from each cell includes the information indicating through which physical channel all the transport streams are transmitted from that cell to other cells. The NIT transmitted from any cell may transmit the cell information including the physical channel information for that cell and another cell, that is, a cell adjacent to that cell. Accordingly, in the case where the broadcasting signal receiving device is handed over from the first cell to the second cell, the same broadcasting signal can be received from the second cell and can be output although the broadcasting signal received from the first cell is received through another channel of the second channel. Upon handover, the user can continuously view the broadcast of the same channel without additional channel searching. Meanwhile, in the example of FIG. 39, the descriptors transmitted through the NIT may be transmitted through the descriptor in the PMT.

The effects of the digital broadcasting system and the data processing method are as follows. According to the present invention, it is possible to provide a digital broadcasting system and a data processing method, which are robust against channel change or noise. In addition, it is possible to improve reception capability of a reception system by performing additional encoding processes with respect to mobile service data and transmitting the encoded mobile service data to the reception system. In addition, it is possible to improve reception capability of a reception system by inserting known data into a predetermined region of a data region and transmitting the data by an appointment of a transmitter and a receiver. Furthermore, it is possible to transmit program table information for mobile service data and main service data.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:
1. A method of transmitting a broadcast signal in a transmitter, the method comprising:
pre-processing first service data including audio data or video data for a mobile service via a preprocessor, wherein pre-processing the first service data comprises:
block processing the first service data via a block processor, wherein block processing the first service data comprises:
first converting data bytes of the first service data to data bits via a first converter;
encoding the first converted data bits to output symbols via a first encoder;
symbol interleaving the output symbols via a symbol interleaver;
second converting the symbol interleaved symbols into data bytes of the first service data via a second converter;
forming data groups via a group formatter, each data group including signaling information, known data sequences that have pre-determined values, and the first service data, wherein the signaling information includes information indicating a number of the data groups to be transmitted during a transmission frame, and forming first service data packets including data in the data groups via a packet formatter;

multiplexing, via a multiplexer, the first service data packets and second service data packets, the second service data packets including second service data including audio data or video data for a main service;

performing, via a second encoder, systematic Reed-Solomon (RS) encoding on the second service data in the multiplexed data packets and non-systematic RS encoding on the first service data in the multiplexed data packets; and transmitting a broadcast signal including the RS encoded first service data and the RS encoded second service data via a transmission unit, wherein a collection of the formed data groups is transmitted during slots in the broadcast signal, wherein the slots are basic time periods for multiplexing of the first service data and the second service data, and wherein the signaling information includes an identifier of the collection of the formed data groups.

2. The method of claim 1, wherein:

a code rate of the encoding of the first converted data bits is G/H; and

G and H are integers.

3. The method of claim 2, wherein the signaling information further includes information indicating the code rate.

4. The method of claim 1, wherein the pre-processing further comprises first randomizing the first service data via a first randomizer, the method further comprising:

second randomizing the second service data in the second service data packets and only a portion of the first service data packets via a second randomizer.

5. An apparatus for transmitting a broadcast signal, the apparatus comprising:

a pre-processor configured to pre-process first service data including audio data or video data for a mobile service, wherein the pre-processor comprises:
  a block processor configured to block process the first service data, wherein the block processor comprises:
    a first converter configured to first convert data bytes of the first service data to data bits;
    a first encoder configured to encode the first converted data bits to output symbols;
    a symbol interleaver configured to symbol interleave the output symbols;
    a second converter configured to second convert the symbol interleaved symbols into data bytes of the first service data;
  a group formatter configured to form data groups, each data group including signaling information, known data sequences that have pre-determined values, and the first service data, wherein the signaling information includes information indicating a number of the data groups to be transmitted during a transmission frame, and
  a packet formatter configured to form first service data packets including data in the data groups;

a multiplexer configured to multiplex the first service data packets and second service data packets, the second service data packets including second service data including audio data or video data for a main service;

a second encoder configured to perform systematic Reed-Solomon (RS) encoding on the second service data in the multiplexed data packets and non-systematic RS encoding on the first service data in the multiplexed data packets; and a transmission unit configured to transmit a broadcast signal including the RS encoded first service data and the RS encoded second service data, wherein a collection of the formed data groups is transmitted during slots in the broadcast signal, wherein the slots are basic time periods for multiplexing of the first service data and the second service data, and wherein the signaling information includes an identifier of the collection of the formed data groups.

6. The apparatus of claim 5, wherein:

a code rate of the first encoder is G/H; and

G and H are integers.

7. The apparatus of claim 6, wherein the signaling information further includes information indicating the code rate.

8. The apparatus of claim 5, wherein the pre-processor further comprises a first randomizer configured to first randomize the first service data, the apparatus further comprising:

a second randomizer configured to second randomize the second service data in the second service data packets and only a portion of the first service data packets.

* * * * *